US012672453B2

(12) United States Patent
Yamazaki et al.

(10) Patent No.: US 12,672,453 B2
(45) Date of Patent: Jun. 30, 2026

(54) DISPLAY DEVICE, DISPLAY MODULE, AND ELECTRONIC DEVICE

(71) Applicant: Semiconductor Energy Laboratory Co., Ltd., Kanagawa-ken (JP)

(72) Inventors: Shunpei Yamazaki, Tokyo (JP); Satoshi Seo, Kanagawa (JP); Harue Osaka, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 1217 days.

(21) Appl. No.: 17/603,692

(22) PCT Filed: Apr. 7, 2020

(86) PCT No.: PCT/IB2020/053289
§ 371 (c)(1),
(2) Date: Oct. 14, 2021

(87) PCT Pub. No.: WO2020/212799
PCT Pub. Date: Oct. 22, 2020

(65) Prior Publication Data
US 2022/0231248 A1 Jul. 21, 2022

(30) Foreign Application Priority Data
Apr. 19, 2019 (JP) ................................ 2019-080046

(51) Int. Cl.
*H01L 51/50* (2006.01)
*H10K 50/11* (2023.01)
(Continued)

(52) U.S. Cl.
CPC ............ *H10K 59/35* (2023.02); *H10K 50/11* (2023.02); *H10K 50/156* (2023.02); *H10K 50/16* (2023.02);
(Continued)

(58) Field of Classification Search
None
See application file for complete search history.

(56) References Cited

U.S. PATENT DOCUMENTS 7,560,729 B2 7/2009 Kitamura et al.
8,736,157 B2 5/2014 Seo et al.
(Continued)

FOREIGN PATENT DOCUMENTS

CN 104094434 A 10/2014
CN 104272488 A 1/2015
(Continued)

OTHER PUBLICATIONS

Tse, S. et al., "The Role of Charge-Transfer Integral in Determining and Engineering the Carrier Mobilities of 9,10-di(2-naphthyl)anthracene Compounds," Chemical Physics Letters, Feb. 28, 2006, vol. 422, No. 4-6, pp. 354-357.
(Continued)

*Primary Examiner* — Tae H Yoon
(74) *Attorney, Agent, or Firm* — Husch Blackwell LLP

(57) ABSTRACT

A display device having a long lifetime is provided. The display device includes a first light-emitting device and a second light-emitting device. The first light-emitting device includes a first electrode and a common electrode. The second light-emitting device includes a second electrode and a common electrode. The first light-emitting device includes a first light-emitting layer and an electron-transport layer in this order from a side of one of the first electrode and the common electrode which functions as an anode. The second light-emitting device includes a second light-emitting layer between the second electrode and the common electrode. The first light-emitting layer contains a first organic compound emitting light of a first color. The second light-emitting layer contains a second organic compound emitting light of a second color. The electron-transport layer contains
(Continued)

10A a third organic compound and a first substance. The third organic compound is an electron-transport material. The first substance is a metal, a metallic salt, a metal oxide, or an organometallic salt. The electron-transport layer includes a first region and a second region which differ in a concentration of the first substance.

17 Claims, 35 Drawing Sheets

(51) Int. Cl.
*H10K 50/15* (2023.01)
*H10K 50/16* (2023.01)
*H10K 50/17* (2023.01)
*H10K 59/35* (2023.01)
*H10K 59/12* (2023.01)
*H10K 101/30* (2023.01)
*H10K 101/40* (2023.01)

(52) U.S. Cl.
CPC ............ *H10K 50/17* (2023.02); *H10K 59/12* (2023.02); *H10K 2101/30* (2023.02); *H10K 2101/40* (2023.02)

(56) References Cited

U.S. PATENT DOCUMENTS

| | | | |
|---|---|---|---|
| 9,088,006 | B2 | 7/2015 | Yamazaki et al. |
| 9,123,907 | B2 | 9/2015 | Seo et al. |
| 9,175,213 | B2 | 11/2015 | Seo et al. |
| 9,604,928 | B2 | 3/2017 | Shitagaki et al. |
| 9,627,625 | B2 | 4/2017 | Nagao et al. |
| 9,627,648 | B2 | 4/2017 | Yamazaki et al. |
| 9,634,279 | B2 | 4/2017 | Seo et al. |
| 9,831,457 | B2 | 11/2017 | Kang et al. |
| 10,003,047 | B2 | 6/2018 | Yamazaki et al. |
| 10,096,658 | B2 | 10/2018 | Watabe et al. |
| 10,263,194 | B2 | 4/2019 | Seo et al. |
| 10,332,859 | B2 | 6/2019 | Nakamura et al. |
| 10,367,160 | B2 | 7/2019 | Seo et al. |
| 10,381,599 | B2 | 8/2019 | Yamazaki et al. |
| 10,411,193 | B2 | 9/2019 | Kawakami et al. |
| 10,573,829 | B2 | 2/2020 | Shitagaki et al. |
| 10,586,934 | B2 | 3/2020 | Shitagaki et al. |
| 10,593,895 | B2 | 3/2020 | Shitagaki et al. |
| 10,622,334 | B2 | 4/2020 | Nakamura et al. |
| 10,847,498 | B2 | 11/2020 | Nakamura et al. |
| 10,862,061 | B2 | 12/2020 | Qiao et al. |
| 10,903,453 | B2 | 1/2021 | Yamazaki et al. |
| 10,978,661 | B2 | 4/2021 | Seo et al. |
| 11,088,335 | B2 | 8/2021 | Seo et al. |
| 11,101,432 | B2 | 8/2021 | Kawakami et al. |
| 11,177,325 | B2 | 11/2021 | Watabe et al. |
| 11,587,904 | B2 | 2/2023 | Nakamura et al. |
| 11,605,780 | B2 | 3/2023 | Tokuda et al. |
| 11,871,592 | B2 | 1/2024 | Seo et al. |
| 11,889,759 | B2 | 1/2024 | Seo et al. |
| 12,581,794 | B2 | 3/2026 | Seo et al. |
| 2006/0105202 | A1 | 5/2006 | Kitamura |
| 2012/0077987 | A1* | 3/2012 | Osaka .................. H10K 85/626 570/183 |
| 2012/0181922 | A1 | 7/2012 | Kawamura et al. |
| 2015/0069357 | A1 | 3/2015 | Park |
| 2015/0084020 | A1 | 3/2015 | Nagao et al. |
| 2015/0144897 | A1 | 5/2015 | Kang et al. |
| 2015/0303387 | A1 | 10/2015 | Kitamura |
| 2017/0222156 | A1 | 8/2017 | Kawakami et al. |
| 2017/0279064 | A1 | 9/2017 | Wallikewitz et al. |
| 2018/0151630 | A1* | 5/2018 | Yamaoka ............. H10K 59/876 |
| 2020/0194692 | A1 | 6/2020 | Shitagaki et al. |
| 2020/0395576 | A1 | 12/2020 | Yamazaki et al. |
| 2021/0384440 | A1 | 12/2021 | Kawakami et al. |
| 2022/0140273 | A1 | 5/2022 | Yamazaki et al. |
| 2024/0164209 | A1 | 5/2024 | Seo et al. |

FOREIGN PATENT DOCUMENTS

| | | | |
|---|---|---|---|
| CN | 104761535 | A | 7/2015 |
| CN | 105679807 | A * | 6/2016 |
| CN | 108539034 | A | 9/2018 |
| CN | 108604641 | A | 9/2018 |
| EP | 2560220 | A | 2/2013 |
| EP | 2 752 907 | A1 | 7/2014 |
| EP | 2816626 | A | 12/2014 |
| EP | 2 999 019 | A1 | 3/2016 |
| JP | 2006-173588 | A | 6/2006 |
| JP | 2006-310815 | A | 11/2006 |
| JP | 2011-009498 | A | 1/2011 |
| JP | 2011-222831 | A | 11/2011 |
| JP | 2012-186461 | A | 9/2012 |
| JP | 2012-212879 | A | 11/2012 |
| JP | 2012-227524 | A | 11/2012 |
| JP | 2013-183047 | A | 9/2013 |
| JP | 5397568 | | 1/2014 |
| JP | 2014-197522 | A | 10/2014 |
| JP | 2015-518287 | | 6/2015 |
| JP | 2015-138787 | A | 7/2015 |
| JP | 2017-139457 | A | 8/2017 |
| JP | 2017-168796 | A | 9/2017 |
| JP | 2017-199903 | A | 11/2017 |
| JP | 2018104359 | A * | 7/2018 |
| JP | 2018-190702 | A | 11/2018 |
| KR | 2011-0056715 | A | 5/2011 |
| KR | 2013-0135161 | A | 12/2013 |
| KR | 2014-0133505 | A | 11/2014 |
| KR | 2015-0028554 | A | 3/2015 |
| KR | 2017-0057306 | A | 5/2017 |
| KR | 2018-0107159 | A | 10/2018 |
| TW | 201332972 | | 8/2013 |
| TW | 201421760 | | 6/2014 |
| TW | 201736357 | | 10/2017 |
| WO | WO-2012/127990 | | 9/2012 |
| WO | WO-2012/137693 | | 10/2012 |
| WO | WO-2013/122082 | | 8/2013 |
| WO | WO 2013/180503 | A1 | 12/2013 |
| WO | WO 2016/042098 | A1 | 3/2016 |
| WO | WO-2017/130079 | | 8/2017 |
| WO | WO-2018/100458 | | 6/2018 |
| WO | WO-2019/044542 | | 3/2019 |

OTHER PUBLICATIONS

International Search Report (Application No. PCT/IB2020/053289), dated Jun. 30, 2020.

Written Opinion (Application No. PCT/IB2020/053289), dated Jun. 30, 2020.

Okachi, T. et al., “Determination of Charge-Carrier Mobility in Organic Light-Emitting Diodes by Impedance Spectroscopy in Presence of Localized States,” Japanese Journal of Applied Physics, Dec. 19, 2008, vol. 47, No. 12, pp. 8965-8972.

Fukagawa.H et al., “Molecular design of hole-transporting material for efficient and stable green phosphorescent organic light-emitting diodes”, Appl. Phys. Lett. (Applied Physics Letters) , Oct. 4, 2013, vol. 103, No. 14, pp. 143306-1-143306-4.

* cited by examiner

FIG. 8A
100A
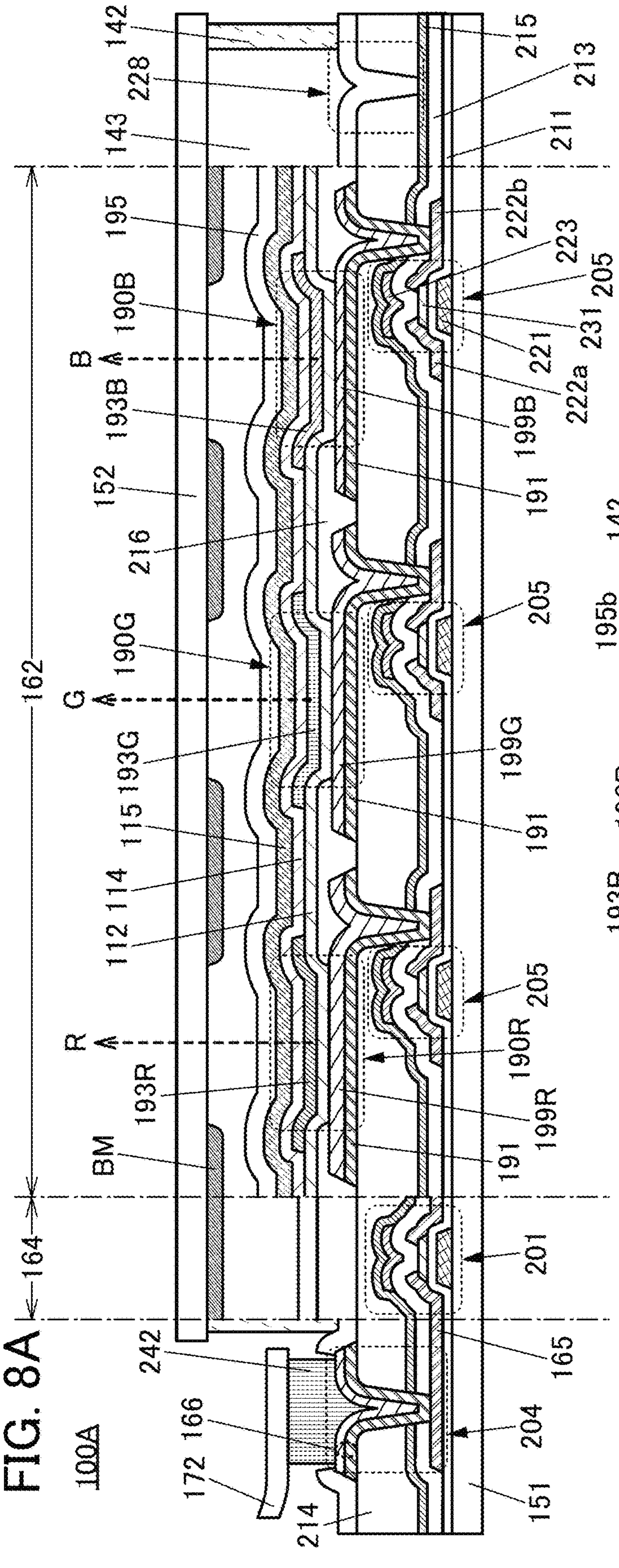
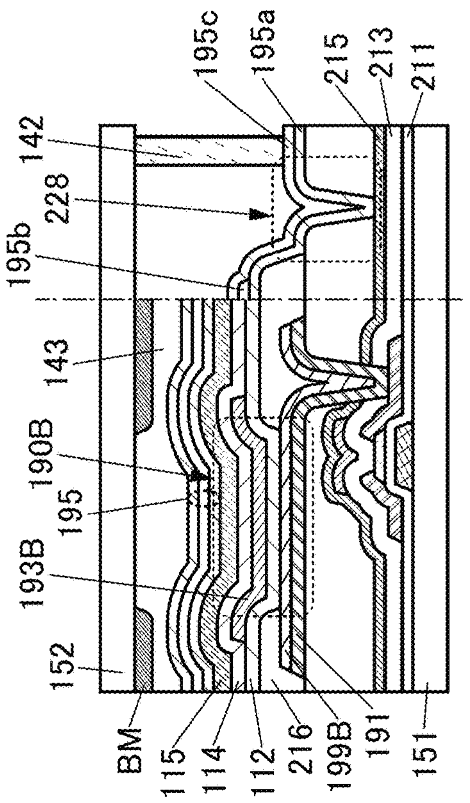
FIG. 8B

FIG. 11A
Intermediate state
New crystalline phase
| Amorphous | Crystalline | Crystal |
|---|---|---|
| ・completely amorphous | ・CAAC<br>・nc<br>・CAC<br>excluding single crystal and poly crystal | ・single crystal<br>・poly crystal |
FIG. 11B
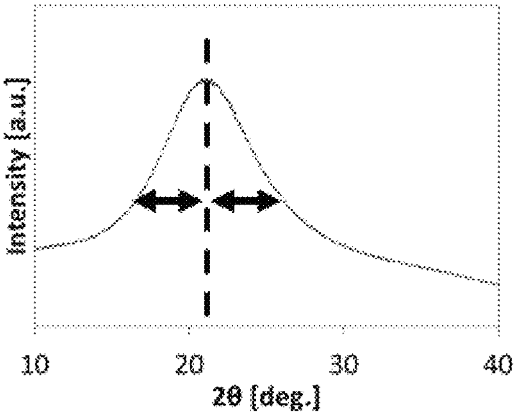
FIG. 11C
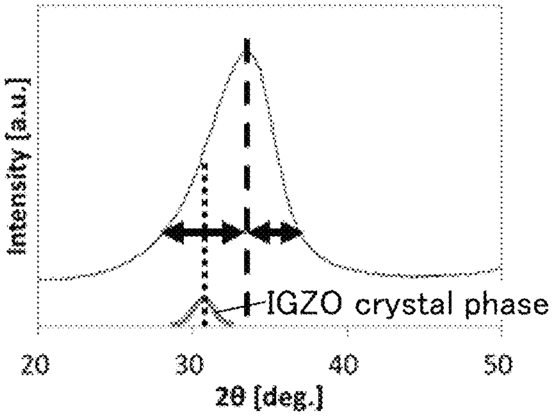
FIG. 11D
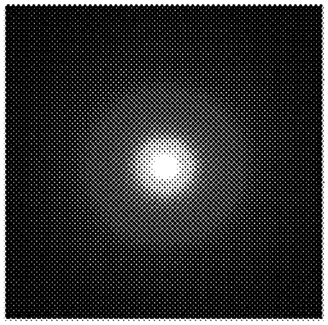
FIG. 11E
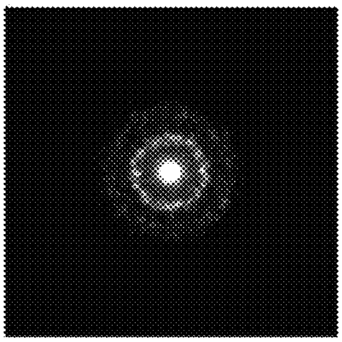

9101

9102

9200

9201

9201

9201

DISPLAY DEVICE, DISPLAY MODULE, AND ELECTRONIC DEVICE

This application is a 371 of international application PCT/IB2020/053289 filed on Apr. 7, 2020 which is incorporated herein by reference. This application is based on Japanese Patent Application Serial No. 2019-080046 filed on Apr. 19, 2019, the entire contents of which are hereby incorporated herein by reference.

TECHNICAL FIELD

One embodiment of the present invention relates to a display device, a display module, and an electronic device.

Note that one embodiment of the present invention is not limited to the above technical field. Examples of the technical field of one embodiment of the present invention include a semiconductor device, a display device, a light-emitting apparatus, a power storage device, a memory device, an electronic device, a lighting device, an input device (e.g., a touch sensor), an input/output device (e.g., a touch panel), a driving method thereof, or a manufacturing method thereof.

BACKGROUND ART

In recent years, application of display devices to a variety of uses has been expected. Examples of uses for a large display device include a television device for home use (also referred to as a TV or a television receiver), digital signage, and a PID (Public Information Display). In addition, a smartphone and a tablet terminal including a touch panel are being developed as portable information terminals.

Light-emitting apparatuses including light-emitting devices (also referred to as light-emitting elements) have been developed as display devices, for example. Light-emitting devices (also referred to as EL devices or EL elements) utilizing an electroluminescence (hereinafter referred to as EL) phenomenon have features such as ease of reduction in thickness and weight, high-speed response to an input signal, and driving with a direct-current low voltage source, and have been used in display devices. For example, Patent Document 1 discloses a light-emitting apparatus having flexibility, in which an organic EL device (also referred to as an organic EL element) is used.

REFERENCES

Patent Document

[Patent Document 1] Japanese Published Patent Application No. 2014-197522

SUMMARY OF THE INVENTION

Problems to be Solved by the Invention

An object of one embodiment of the present invention is to provide a display device having a long lifetime. An object of one embodiment of the present invention is to provide a highly reliable display device. An object of one embodiment of the present invention is to provide a large display device. An object of one embodiment of the present invention is to provide a display device with high productivity. An object of one embodiment of the present invention is to provide a display device with high display quality.

Note that the descriptions of these objects do not preclude the existence of other objects. One embodiment of the present invention does not need to achieve all the objects. Other objects can be derived from the descriptions of the specification, the drawings, and the claims.

Means for Solving the Problems

One embodiment of the present invention is a display device including a first light-emitting device and a second light-emitting device. The first light-emitting device includes a first electrode and a common electrode. The second light-emitting device includes a second electrode and the common electrode. The first light-emitting device includes a first light-emitting layer and an electron-transport layer in this order from a side of one of the first electrode and the common electrode which functions as an anode. The second light-emitting device includes a second light-emitting layer between the second electrode and the common electrode. The first light-emitting layer contains a first organic compound emitting light of a first color. The second light-emitting layer contains a second organic compound emitting light of a second color. The electron-transport layer contains a third organic compound and a first substance. The third organic compound is an electron-transport material. The first substance is a metal, a metallic salt, a metal oxide, or an organometallic salt. The electron-transport layer includes a first region and a second region. The first region and the second region differ in a concentration of the first substance.

When the first region is positioned closer to the first light-emitting layer than the second region is, the first region preferably has a higher concentration of the first substance than the second region.

The second light-emitting device preferably includes a layer common to the first light-emitting device between the second electrode and the common electrode.

It is preferable that the third organic compound have a HOMO level higher than or equal to −6.0 eV, and have an electron mobility higher than or equal to $1\times10^{7}$ $cm^2/Vs$ and lower than or equal to $5\times10^{-5}$ $cm^2/Vs$ when a square root of electric field strength [V/cm] is 600.

The second light-emitting layer preferably further contains a fourth organic compound and a fifth organic compound. A combination of the fourth organic compound and the fifth organic compound preferably forms an exciplex.

The first light-emitting device preferably further includes a hole-injection layer. The hole-injection layer is preferably in contact with one of the first electrode and the common electrode which functions as an anode. The hole-injection layer preferably contains a first compound and a second compound. The first compound preferably has a property of accepting electrons from the second compound. The second compound preferably has a HOMO level higher than or equal to −5.7 eV and lower than or equal to −5.4 eV.

The first light-emitting device preferably further includes a first hole-transport layer. The first hole-transport layer is preferably positioned between the hole-injection layer and the first light-emitting layer. The first hole-transport layer preferably contains a third compound. The HOMO level of the third compound is preferably a value lower than or equal to the HOMO level of the second compound. The difference between the HOMO level of the third compound and the HOMO level of the second compound is preferably 0.2 eV or less. The second compound and the third compound each preferably include at least one of a carbazole skeleton, a dibenzofuran skeleton, a dibenzothiophene skeleton, and an anthracene skeleton.

The first light-emitting device preferably further includes a second hole-transport layer. The second hole-transport layer is preferably positioned between the first hole-transport layer and the first light-emitting layer. The second hole-transport layer preferably contains a fourth compound. The HOMO level of the fourth compound is preferably lower than the HOMO level of the third compound. The second compound, the third compound, and the fourth compound each preferably include at least one of a carbazole skeleton, a dibenzofuran skeleton, a dibenzothiophene skeleton, and an anthracene skeleton.

The first organic compound is preferably a fluorescent substance.

The first color is preferably blue. The second color is preferably red or green.

The first substance is preferably an organometallic complex containing an alkali metal or an alkaline earth metal.

The first substance is preferably an organometallic complex including a ligand containing nitrogen and oxygen, and an alkali metal or an alkaline earth metal.

The first substance is preferably an organometallic complex including a quinolinol ligand, and an alkali metal or an alkaline earth metal.

One embodiment of the present invention is a display module including the display device having any of the above structures; for example, a display module provided with a connector such as a flexible printed circuit (hereinafter referred to FPC) or a TCP (Tape Carrier Package), or a display module on which an integrated circuit (IC) is implemented by a COG (Chip On Glass) method, a COF (Chip On Film) method, or the like.

One embodiment of the present invention is an electronic device including the above display module and at least one of an antenna, a battery, a housing, a camera, a speaker, a microphone, and an operation button.

Effect of the Invention

According to one embodiment of the present invention, a display device having a long lifetime can be provided. According to one embodiment of the present invention, a highly reliable display device can be provided. According to one embodiment of the present invention, a large display device can be provided. According to one embodiment of the present invention, a display device with high productivity can be provided. According to one embodiment of the present invention, a display device with high display quality can be provided.

Note that the descriptions of these effects do not preclude the existence of other effects. One embodiment of the present invention does not need to have all the effects. Other effects can be derived from the descriptions of the specification, the drawings, and the claims.

BRIEF DESCRIPTION OF THE DRAWINGS

FIG. 8A and FIG. 8B are cross-sectional views illustrating an example of a display device.

FIG. 11A is a diagram showing classification of crystal structures of IGZO. FIG. 11B is a diagram showing an XRD spectrum of a quartz glass substrate. FIG. 11C is a diagram showing an XRD spectrum of a crystalline IGZO film. FIG. 11D is a diagram showing a nanobeam electron diffraction pattern of the quartz glass substrate. FIG. 11E is a diagram showing a nanobeam electron diffraction pattern of the crystalline IGZO film.

MODE FOR CARRYING OUT THE INVENTION

Figure 1A:
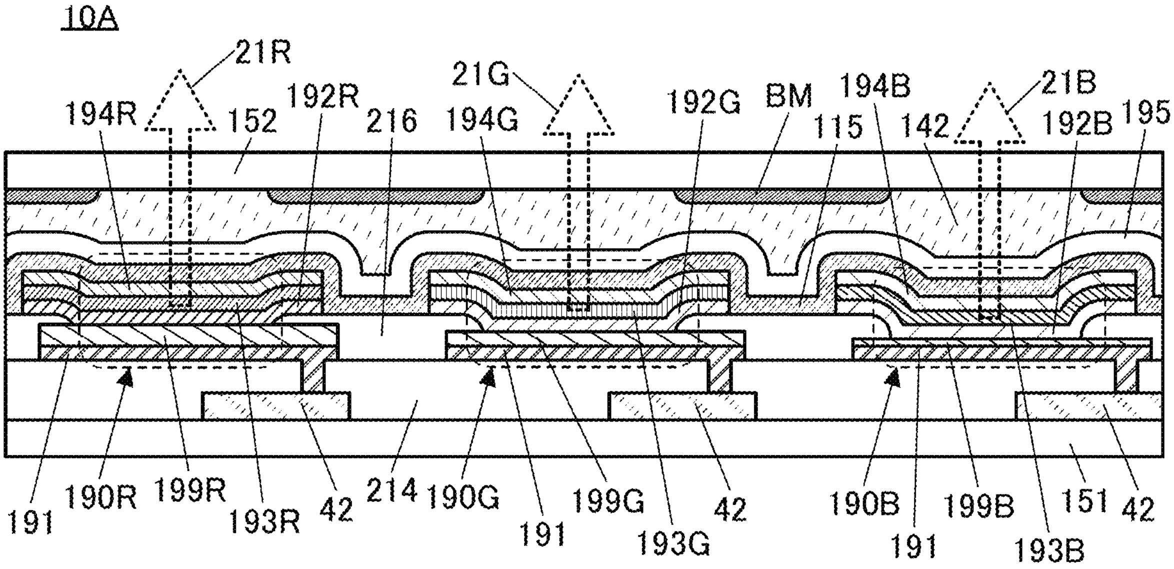
FIG. 1A and FIG. 1B are cross-sectional views each illustrating an example of a display device.

Embodiments are described in detail with reference to the drawings. Note that the present invention is not limited to the following description, and it will be readily appreciated by those skilled in the art that modes and details of the present invention can be modified in various ways without departing from the spirit and scope of the present invention. Thus, the present invention should not be construed as being limited to the description in the following embodiments.

Note that in structures of the invention described below, the same portions or portions having similar functions are denoted by the same reference numerals in different drawings, and a description thereof is not repeated. Furthermore, the same hatch pattern is used for the portions having similar functions, and the portions are not especially denoted by reference numerals in some cases.

In addition, the position, size, range, or the like of each structure illustrated in drawings does not represent the actual position, size, range, or the like in some cases for easy understanding. Therefore, the disclosed invention is not necessarily limited to the position, size, range, or the like disclosed in the drawings.

Note that the term "film" and the term "layer" can be interchanged with each other depending on the case or according to circumstances. For example, the term "conductive layer" can be changed into the term "conductive film". As another example, the term "insulating film" can be changed into the term "insulating layer".

In this specification and the like, unless otherwise specified, in describing a structure including a plurality of elements (e.g., light-emitting devices and light-emitting layers), alphabets are not added when a common part of the elements is described. For example, when a common part for a light-emitting layer 193R, a light-emitting layer 193G, and the like is described, the light-emitting layers are simply referred to as the light-emitting layer 193 in some cases.

Embodiment 1

In this embodiment, display devices of one embodiment of the present invention are described with reference to FIG. 1 to FIG. 9.

The display device of this embodiment includes a light-emitting device in its display portion and can display an image on the display portion.

As the light-emitting devices, EL devices such as OLEDs (Organic Light Emitting Diodes) or QLEDs (Quantum-dot Light Emitting Diodes) are preferably used. As a light-emitting substance contained in the EL device, a substance emitting fluorescence (a fluorescent substance), a substance emitting phosphorescence (a phosphorescent substance), an inorganic compound (such as a quantum dot material), a substance exhibiting thermally activated delayed fluorescence (a thermally activated delayed fluorescence (TADF) material), or the like can be given.

As a coloring method for the display device of this embodiment, a separate coloring method is employed. In the case of employing a separate coloring method for a small display device, the alignment accuracy of a metal mask can be increased and the yield in separate coloring can be increased, which is preferable. Furthermore, a large display device can have a relatively low resolution, which is advantageous in employing a light-emitting device formed by a separate coloring method.

Light-emitting devices included in subpixels of respective colors include light-emitting layers different from each other. The light-emitting layers included in the respective light-emitting devices are preferably separated from each other. Note that when the resolution of the display device is high, the light-emitting layers of the light-emitting devices partly overlap each other in some cases.

The display device of this embodiment can have any of a top-emission structure in which light is emitted in a direction opposite to a substrate where a light-emitting device is formed, a bottom-emission structure in which light is emitted toward the substrate where the light-emitting device is formed, and a dual-emission structure in which light is emitted toward both surfaces.

The light-emitting device preferably employs a micro optical resonator (microcavity) structure. Specifically, it is preferable that to adjust the optical distance between a pair of electrodes, in EL layers, not only a light-emitting layer but also a layer of another kind (e.g., a hole-transport layer) be formed by separate coloring for the light-emitting devices of the respective colors and other layers be shared by the light-emitting devices of the respective colors. This can achieve a display device with a simplified process, good light extraction efficiency, and capability of display with a wide color gamut.

The display device of this embodiment includes a light-emitting device in which holes are easily injected into a light-emitting layer and electrons are less likely to be injected into the light-emitting layer. Holes are easily injected from an anode side and the amount of electrons injected into the light-emitting layer from a cathode side is suppressed, whereby the light-emitting layer can be inhibited from having excess electrons. Moreover, injection of electrons into the light-emitting layer with time increases luminance, and the luminance increase can cancel out initial decay. Using a light-emitting device with little initial decay and an extremely long driving lifetime can extend lifetime of the display device and increase the reliability thereof. The structure of the light-emitting device is described later with reference to FIG. 4 to FIG. 6.

Figure 2A:
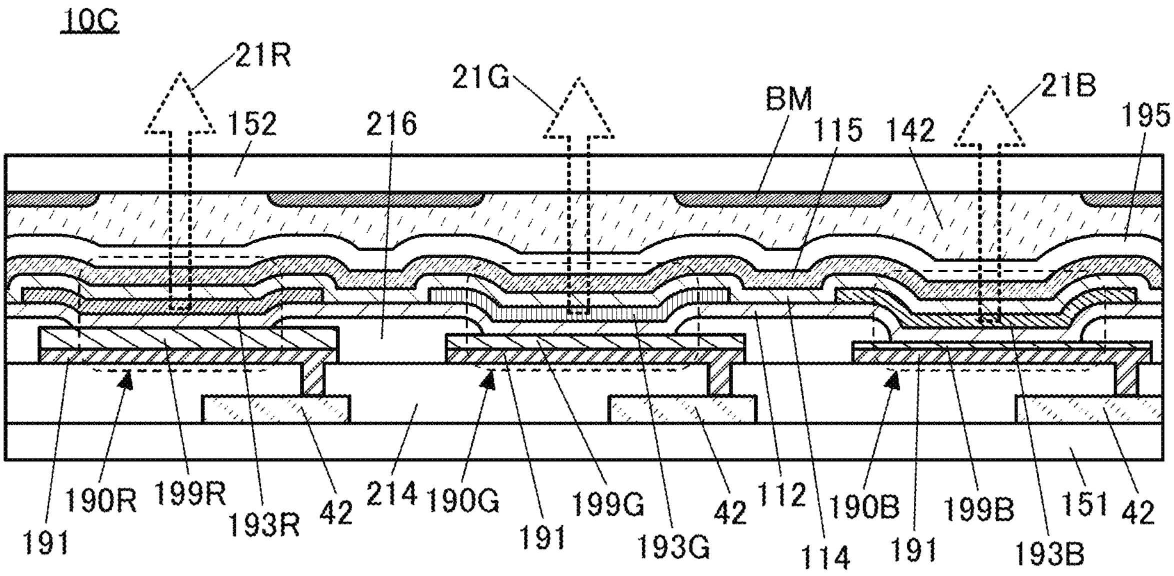
FIG. 2A and FIG. 2B are cross-sectional views each illustrating an example of a display device.
Figure 2B:
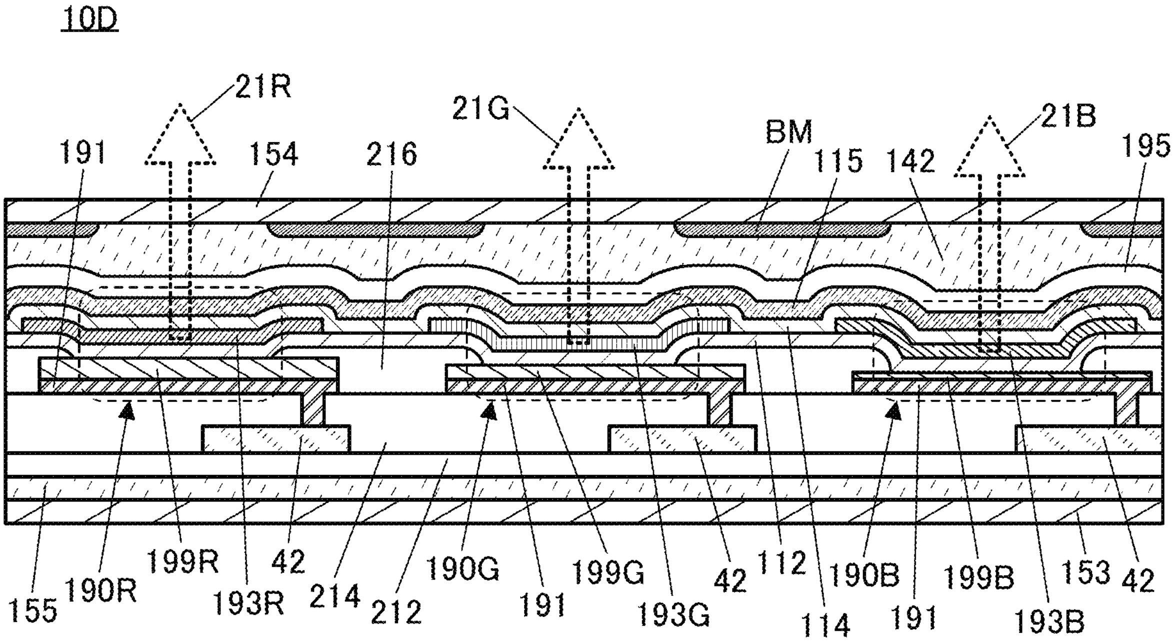
Figure 3:
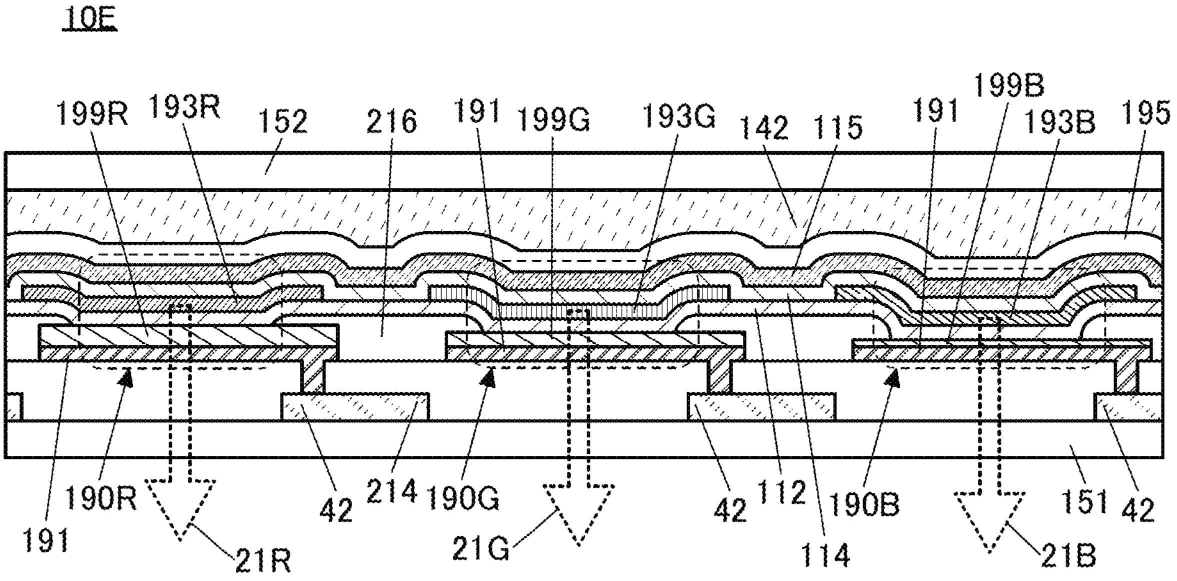
FIG. 3 is a cross-sectional view illustrating an example of a display device.

First, FIG. 1 to FIG. 3 illustrate structure examples of the display devices. In each of the display devices illustrated in FIG. 1 to FIG. 3, at least one light-emitting device employs a structure of the light-emitting device illustrated in FIG. 4 to FIG. 6.

[Display Device 10A]

FIG. 1A shows a cross-sectional view of a display device 10A.

The display device 10A includes a light-emitting device 190R that emits red light 21R, a light-emitting device 190G that emits green light 21G, and a light-emitting device 190B that emits blue light 21B.

The light-emitting device 190R includes a pixel electrode 191, an optical adjustment layer 199R, a buffer layer 192R, a light-emitting layer 193R, a buffer layer 194R, and a common electrode 115. The light-emitting layer 193R contains an organic compound emitting red light.

The light-emitting device 190G includes the pixel electrode 191, an optical adjustment layer 199G, a buffer layer 192G, a light-emitting layer 193G, a buffer layer 194G, and the common electrode 115. The light-emitting layer 193G contains an organic compound emitting green light.

The light-emitting device 190B includes the pixel electrode 191, an optical adjustment layer 199B, a buffer layer 192B, a light-emitting layer 193B, a buffer layer 194B, and the common electrode 115. The light-emitting layer 193B contains an organic compound emitting blue light.

Note that in this specification and the like, an organic compound emitting blue light is referred to as a first organic compound, and an organic compound emitting red light or an organic compound emitting green light is referred to as a second organic compound in some cases.

At least one of the light-emitting device 190R, the light-emitting device 190G, and the light-emitting device 190B employs the structure of the light-emitting device illustrated in FIG. 4 to FIG. 6.

In this embodiment, the case where the pixel electrode 191 functions as an anode and the common electrode 115 functions as a cathode is described as an example.

The pixel electrode 191, the optical adjustment layer 199R, the optical adjustment layer 199G, the optical adjustment layer 199B, the buffer layer 192R, the buffer layer 192G, the buffer layer 192B, the light-emitting layer 193R, the light-emitting layer 193G, the light-emitting layer 193B, the buffer layer 194R, the buffer layer 194G, the buffer layer 194B, and the common electrode 115 may each have a single-layer structure or a stacked-layer structure.

The pixel electrode 191 is positioned over an insulating layer 214. The end portion of the pixel electrode 191 is covered with the bank 216. The pixel electrodes 191 are electrically insulated (also referred to as being electrically isolated) from each other by the bank 216.

An organic insulating film is suitable for the bank 216. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins.

The buffer layer 192 is positioned over the pixel electrode 191. The light-emitting layer 193 overlaps the pixel electrode 191 with the buffer layer 192 therebetween. The buffer layer 194 is positioned over the light-emitting layer 193. The light-emitting layer 193 overlaps the common electrode 115 with the buffer layer 194 therebetween. The buffer layer 192 can include one or both of a hole-injection layer and a hole-transport layer. The buffer layer 194 can include one or both of an electron-injection layer and an electron-transport layer.

The common electrode 115 is a layer used in common by the light-emitting devices 190 of the respective colors.

The display device 10A includes the light-emitting devices 190, transistors 42, and the like between a pair of substrates (a substrate 151 and a substrate 152).

In the light-emitting device 190, the buffer layer 192, the light-emitting layer 193, and the buffer layer 194 that are positioned between the pixel electrode 191 and the common electrode 115 can be referred to as an EL layer. The pixel electrode 191 preferably has a function of reflecting visible light. The common electrode 115 has a function of transmitting visible light.

The light-emitting device included in the display device of this embodiment preferably employs a microcavity structure. Therefore, one of the pair of electrodes included in the light-emitting device is preferably an electrode having properties of transmitting and reflecting visible light (a transflective electrode), and the other is preferably an electrode having a property of reflecting visible light (a reflective electrode). When the light-emitting device has a microcavity structure, light emission obtained from the light-emitting layer can be resonated between the electrodes, whereby light emitted from the light-emitting device can be intensified.

Note that the transflective electrode can have a stacked-layer structure of a reflective electrode and an electrode having a property of transmitting visible light (also referred to as a transparent electrode). In this specification and the like, a reflective electrode functioning as part of a transflective electrode may be referred to as a pixel electrode or a common electrode, and a transparent electrode may be referred to as an optical adjustment layer; in some cases, a transparent electrode (an optical adjustment layer) can also be regarded as having a function of a pixel electrode or a common electrode.

The light transmittance of the transparent electrode is greater than or equal to 40%. For example, an electrode whose transmittance for each of visible light (light with a wavelength greater than or equal to 400 nm and less than 750 nm) and near-infrared light (light with a wavelength greater than or equal to 750 nm and less than or equal to 1300 nm) is greater than or equal to 40% is preferably used in the light-emitting device. The reflectance of the transflective electrode for each of visible light and near-infrared light is greater than or equal to 10% and less than or equal to 95%, preferably greater than or equal to 30% and less than or equal to 80%. The reflectance of the reflective electrode for each of visible light and near-infrared light is greater than or equal to 40% and less than or equal to 100%, preferably greater than or equal to 70% and less than or equal to 100%. These electrodes preferably have a resistivity less than or equal to $1\times10^{-2}$ Ωcm.

In this embodiment, an example in which the optical adjustment layer 199 is provided over the pixel electrode 191 is described, but the optical adjustment layer 199 is not necessarily provided. For example, the buffer layer 192 or the buffer layer 194 may have a function of an optical adjustment layer. By changing the thickness of the buffer layer 192 or the buffer layer 194, light of a particular color can be intensified and extracted from each light-emitting device. Note that when the transflective electrode has a stacked-layer structure of a reflective electrode and a transparent electrode, the optical distance between the pair of electrodes represents the optical distance between a pair of reflective electrodes.

The light-emitting device 190 has a function of emitting visible light. Specifically, the light-emitting device 190 is an electroluminescent device that emits light to the substrate 152 side by voltage application between the pixel electrode 191 and the common electrode 115.

The pixel electrode 191 is electrically connected to a source or a drain of the transistor 42 through an opening provided in the insulating layer 214. The transistor 42 has a function of controlling driving of the light-emitting device 190.

The light-emitting devices 190 are preferably covered with a protective layer 195. In FIG. 1A, the protective layer 195 is provided over and in contact with the common electrode 115. With the protective layer 195, entry of impurities such as water into the light-emitting device 190 can be inhibited, leading to an increase in the reliability of the light-emitting device 190. The protective layer 195 and the substrate 152 are bonded to each other with an adhesive layer 142.

For a light-blocking layer BM, a material that blocks light emitted from the light-emitting device can be used. The light-blocking layer BM preferably absorbs visible light. As the light-blocking layer BM, a black matrix can be formed using a metal material or a resin material containing pigment (e.g., carbon black) or dye, for example. The light-blocking layer BM may have a stacked-layer structure of a red color filter, a green color filter, and a blue color filter.

The light-emitting layer 193R preferably contains a phosphorescent substance as the organic compound emitting red light. The light-emitting layer 193G preferably contains a phosphorescent substance as the organic compound emitting green light. In the light-emitting device 190R, an exciplex is preferably formed in the light-emitting layer 193R by voltage application between the pixel electrode 191 and the common electrode 115. Similarly, in the light-emitting device 190G, an exciplex is preferably formed in the light-emitting layer 193G by voltage application between the pixel electrode 191 and the common electrode 115. Such a structure can increase the emission efficiency of the light-emitting device 190R and the light-emitting device 190G.

The light-emitting layer 193R and the light-emitting layer 193G each preferably contain two kinds of organic compounds in addition to the light-emitting substance, for example. The two kinds of organic compounds are preferably substances that form an exciplex. The two kinds of organic compounds can be regarded as a combination that forms an exciplex. In each of the light-emitting layer 193R and the light-emitting layer 193G, the two kinds of organic compounds can be referred to as a host material and an assist material, or a first host material and a second host material. In addition, the host materials contained in each of the light-emitting layer 193R and the light-emitting layer 193G can also be regarded as a mixed material of two kinds of organic compounds. The two kinds of organic compounds contained in the light-emitting layer 193R and the two kinds of organic compounds contained in the light-emitting layer 193G may be the same materials or different materials.

Note that in this specification and the like, the two kinds of organic compounds are referred to as a fourth organic compound and a fifth organic compound in some cases. A structure of the light-emitting layer in which an exciplex can be formed will be described later.

The light-emitting layer 193B preferably contains a fluorescent substance as the organic compound emitting blue light.

[Display Device 10B]

Figure 1B:
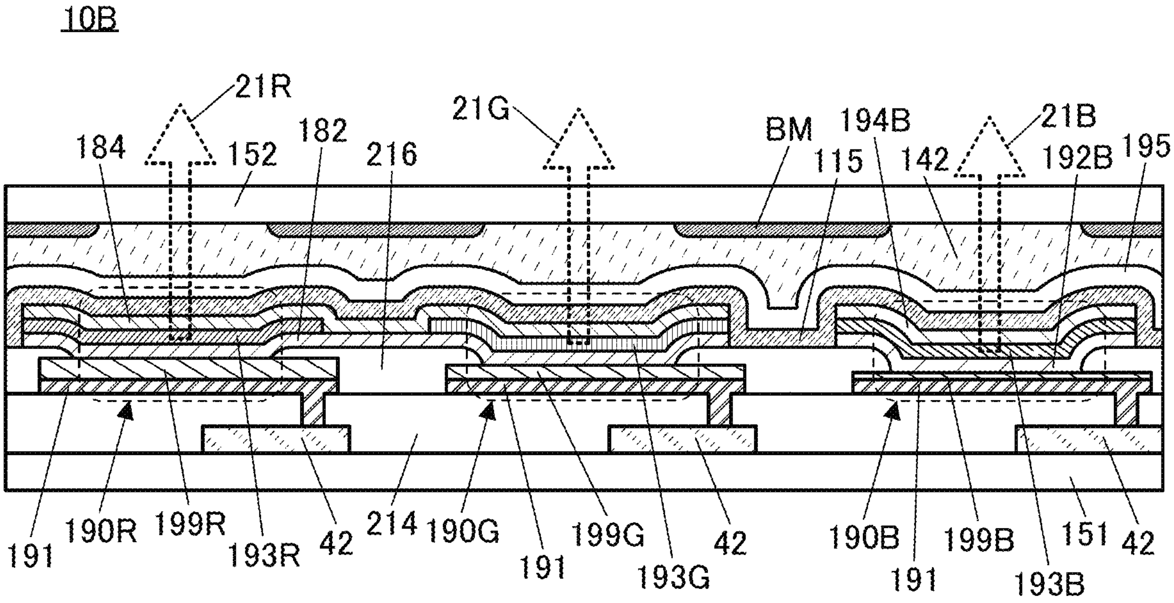

FIG. 1B shows a cross-sectional view of a display device 10B. Note that in the description of the display device below, components similar to those of the above-mentioned display device are not described in some cases.

The display device 10B is different from the display device 10A in that the red-light-emitting device 190R and the green-light-emitting device 190G include a common layer 182 and a common layer 184.

It is preferable that at least two of the red-light-emitting device 190R, the green-light-emitting device 190G, and the blue-light-emitting device 190B include at least one layer used in common (a common layer). Accordingly, the display device can be manufactured through fewer manufacturing steps.

FIG. 1B illustrates an example in which the light-emitting device 190R and the light-emitting device 190G include the common layer 182 and the common layer 184; however, the display device of one embodiment of the present invention may have a structure in which the light-emitting device 190R and the light-emitting device 190G include only the common layer 182 or the common layer 184.

The common layer 182 is positioned between the pixel electrode 191 and the light-emitting layer 193R and between the pixel electrode 191 and the light-emitting layer 193G.

The common layer 184 is positioned between the light-emitting layer 193R and the common electrode 115 and between the light-emitting layer 193G and the common electrode 115.

The common layer 182 and the common layer 184 may each have a single-layer structure or a stacked-layer structure.

One or both of a hole-injection layer and a hole-transport layer can be formed as the common layer 182, for example.

One or both of an electron-injection layer and an electron-transport layer can be formed as the common layer 184, for example.

The light-emitting device 190R and the light-emitting device 190G may include a buffer layer in at least one of positions between the pixel electrode 191 and the common layer 182, between the common layer 182 and the light-emitting layer, between the light-emitting layer and the common layer 184, and between the common layer 184 and the common electrode 115. For example, at least one of a hole-injection layer, a hole-transport layer, an electron-transport layer, and an electron-injection layer can be formed as the buffer layer.

For example, the light-emitting device 190B preferably employs the structure of the light-emitting device illustrated in FIG. 4 to FIG. 6. Alternatively, both the light-emitting device 190R and the light-emitting device 190G may employ the structure of the light-emitting device illustrated in FIG. 4 to FIG. 6.

In the case where the light-emitting device 190B and one of the light-emitting device 190R and the light-emitting device 190G, i.e., two light-emitting devices in total, employ the structure of the light-emitting device illustrated in FIG. 4 to FIG. 6, the light-emitting device 190B and one of the light-emitting device 190R and the light-emitting device 190G preferably include the common layer 182 and the common layer 184. In this case, the structure of the light-emitting device illustrated in FIG. 4 to FIG. 6 is preferably employed as the structures of the common layer 182 and the common layer 184.

[Display Device 10C]

FIG. 2A shows a cross-sectional view of a display device 10C.

The display device 10C is different from the display device 10A in that the red-light-emitting device 190R, the green-light-emitting device 190G, and the blue-light-emitting device 190B include a common layer 112 and a common layer 114.

It is preferable that the red-light-emitting device 190R, the green-light-emitting device 190G, and the blue-light-emitting device 190B include at least one layer used in common (a common layer). Accordingly, the display device can be manufactured through fewer manufacturing steps.

FIG. 2A illustrates an example in which the light-emitting devices of the respective colors include the common layer 112 and the common layer 114, but the display device of one embodiment of the present invention may have a structure in which the light-emitting devices of the respective colors include only the common layer 112 or the common layer 114.

The common layer 112 is positioned between the pixel electrode 191 and the light-emitting layers of the respective colors.

The common layer 114 is positioned between the light-emitting layers of the respective colors and the common electrode 115.

The common layer 112 and the common layer 114 may each have a single-layer structure or a stacked-layer structure.

One or both of a hole-injection layer and a hole-transport layer can be formed as the common layer 112, for example.

One or both of an electron-injection layer and an electron-transport layer can be formed as the common layer 114, for example.

The light-emitting devices may include a buffer layer in at least one of positions between the pixel electrode 191 and the common layer 112, between the common layer 112 and the light-emitting layer, between the light-emitting layer and the common layer 114, and between the common layer 114 and the common electrode 115. For example, at least one of a hole-injection layer, a hole-transport layer, an electron-transport layer, and an electron-injection layer can be formed as the buffer layer.

[Display Device 10D]

FIG. 2B shows a cross-sectional view of a display device 10D.

The display device 10D is different from the display device 10C in that the substrate 151 and the substrate 152 are not included and a substrate 153, a substrate 154, an adhesive layer 155, and an insulating layer 212 are included.

The substrate 153 and the insulating layer 212 are bonded to each other with the adhesive layer 155. The substrate 154 and the protective layer 195 are bonded to each other with the adhesive layer 142.

The display device 10D has a structure formed in such a manner that the insulating layer 212, the transistors 42, the light-emitting devices of the respective colors, and the like that are formed over a formation substrate are transferred onto the substrate 153. The substrate 153 and the substrate 154 preferably have flexibility. Accordingly, the flexibility of the display device 10D can be increased. For example, a resin is preferably used for each of the substrate 153 and the substrate 154.

For each of the substrate 153 and the substrate 154, a polyester resin such as polyethylene terephthalate (PET) or polyethylene naphthalate (PEN), a polyacrylonitrile resin, an acrylic resin, a polyimide resin, a polymethyl methacrylate resin, a polycarbonate (PC) resin, a polyether sulfone (PES) resin, a polyamide resin (e.g., nylon or aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, or cellulose nanofiber can be used, for example. Glass that is thin enough to have flexibility may be used for one or both of the substrate 153 and the substrate 154.

As the substrate included in the display device of this embodiment, a film having high optical isotropy may be used. Examples of the film having high optical isotropy include a triacetyl cellulose (TAC, also referred to as cellulose triacetate) film, a cycloolefin polymer (COP) film, a cycloolefin copolymer (COC) film, and an acrylic film.

[Display Device 10E]

FIG. 3 shows a cross-sectional view of a display device 10E.

The display device 10E is of a bottom-emission type, which is different from the display device 10C.

The pixel electrode 191 has a function of transmitting visible light. The common electrode 115 preferably has a function of reflecting visible light.

The transistors 42 are preferably provided in positions not overlapping light-emitting regions of the light-emitting devices.

Although the display device 10E is an example in which the substrate 152 is provided over the protective layer 195 with the adhesive layer 142, the adhesive layer 142 and the substrate 152 are not necessarily provided.

[Light-Emitting Device]

Figure 4A:
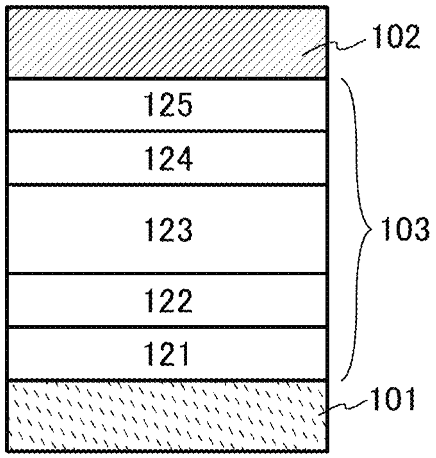
FIG. 4A to FIG. 4C are cross-sectional views each illustrating an example of a light-emitting device.
Figure 4B:
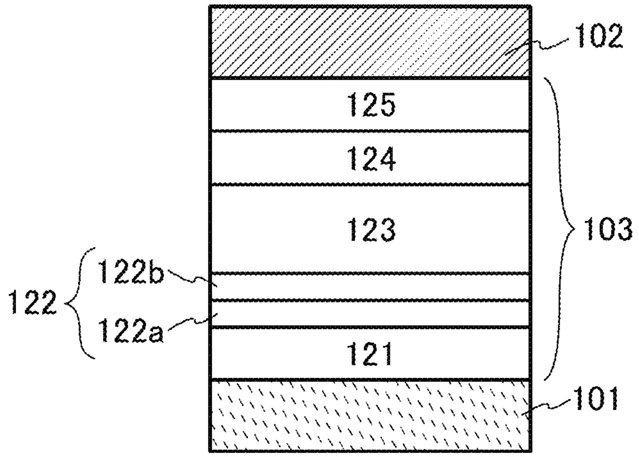
Figure 4C:
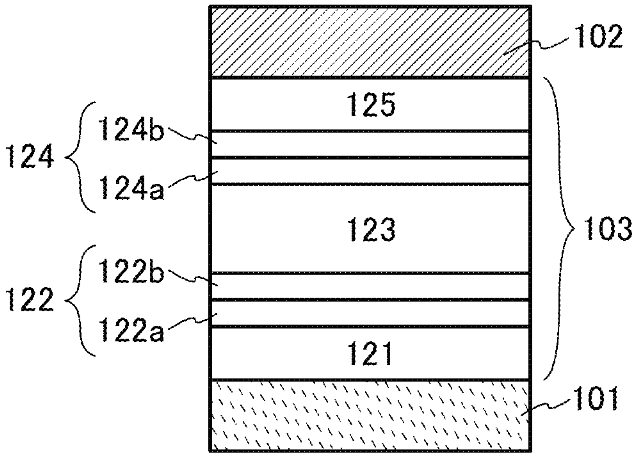

FIG. 4A to FIG. 4C each illustrate an example of a light-emitting device that can be used for the display device of this embodiment.

A light-emitting device illustrated in FIG. 4A includes an anode 101, an EL layer 103, and a cathode 102. The EL layer 103 includes a hole-injection layer 121, a hole-transport layer 122, a light-emitting layer 123, an electron-transport layer 124, and an electron-injection layer 125 from the anode 101 side. Although not illustrated in FIG. 4A to FIG. 4C, the light-emitting device may include an optical adjustment layer.

The anode 101, the cathode 102, the hole-injection layer 121, the hole-transport layer 122, the light-emitting layer 123, the electron-transport layer 124, and the electron-injection layer 125 may each have a single-layer structure or a stacked-layer structure.

The hole-transport layer 122 included in each of the light-emitting devices illustrated in FIG. 4B and FIG. 4C has a two-layer structure of a hole-transport layer 122*a* on the hole-injection layer 121 side and a hole-transport layer 122*b* on the light-emitting layer 123 side.

The electron-transport layer 124 included in the light-emitting device illustrated in FIG. 4C has a two-layer structure of an electron-transport layer 124*a* on the light-emitting layer 123 side and an electron-transport layer 124*b* on the electron-injection layer 125 side.

Materials that can be used for the light-emitting device are described below.

<Electrode>

As a material that forms the pair of electrodes of the light-emitting device, a metal, an alloy, an electrically conductive compound, a mixture thereof, and the like can be used as appropriate. Specific examples include In—Sn oxide (also referred to as ITO), In—Si—Sn oxide (also referred to as ITSO), In—Zn oxide, and In—W—Zn oxide. In addition, it is possible to use a metal such as aluminum (Al), titanium (Ti), chromium (Cr), manganese (Mn), iron (Fe), cobalt (Co), nickel (Ni), copper (Cu), gallium (Ga), zinc (Zn), indium (In), tin (Sn), molybdenum (Mo), tantalum (Ta), tungsten (W), palladium (Pd), gold (Au), platinum (Pt), silver (Ag), yttrium (Y), or neodymium (Nd) or an alloy containing an appropriate combination of any of these metals. It is also possible to use an element belonging to Group 1 or Group 2 in the periodic table, which is not described above (e.g., lithium (Li), cesium (Cs), calcium (Ca), or strontium (Sr)), a rare earth metal such as europium (Eu) or ytterbium (Yb), an alloy containing an appropriate combination of any of these, graphene, or the like.

To manufacture a light-emitting device having a microcavity structure, a reflective electrode and a transflective electrode are used. Thus, a single layer or stacked layers can be formed using one or more desired conductive materials. For fabrication of the electrodes, a sputtering method or a vacuum evaporation method can be used.

<Hole-Injection Layer>

The hole-injection layer 121 contains a first compound and a second compound.

The first compound is an electron-accepting material (an acceptor material) and has a property of accepting electrons from the second compound.

The second compound is a hole-transport material. The hole-transport material has a hole-transport property higher than an electron-transport property.

The highest occupied molecular orbital level (HOMO level) of the second compound is preferably relatively low (deep). Specifically, the HOMO level of the second compound is preferably higher than or equal to −5.7 eV and lower than or equal to −5.4 eV. A relatively low HOMO level of the second compound is preferable because hole injection into the hole-transport layer 122 can be easily performed.

As the first compound, an organic compound including an electron-withdrawing group (particularly a cyano group or a halogen group such as a fluoro group) can be used.

For example, as the first compound, organic acceptors such as a quinodimethane derivative, a chloranil derivative, and a hexaazatriphenylene derivative can be used. Specific examples include 7,7,8,8-tetracyano-2,3,5,6-tetrafluoroquinodimethane (abbreviation: $F_4$-TCNQ), chloranil, 2,3,6,7,10,11-hexacyano-1,4,5,8,9,12-hexaazatriphenylene (abbreviation: HAT-CN), 1,3,4,5,7,8-hexafluorotetracyano-naphthoquinodimethane (abbreviation: F6-TCNNQ), and 2-(7-dicyanomethylen-1,3,4,5,6,8,9,10-octafluoro-7H-pyren-2-ylidene)malononitrile. A compound in which electron-withdrawing groups are bonded to a condensed aromatic ring having a plurality of hetero atoms, such as HAT-CN, is particularly preferable because it is thermally stable. Alternatively, a [3]radialene derivative including an electron-withdrawing group (in particular, a cyano group or a halogen group such as a fluoro group) is preferable because it has a very high electron-accepting property. Examples of the [3]radialene derivative including an electron-withdrawing group include α,α',α"-1,2,3-cyclopropanetriylidenetris[4-cyano-2,3,5,6-tetrafluorobenzeneacetonitrile], α,α',α"-1,2,3-cyclopropanetriylidenetris[2,6-dichloro-3,5-difluoro-4-(trifluoromethyl)benzeneacetonitrile], and α,α',α"-1,2,3-cyclopropanetriylidenetris[2,3,4,5,6-pentafluorobenzeneacetonitrile].

The second compound preferably includes a hole-transport skeleton. A carbazole skeleton, a dibenzofuran skeleton, a dibenzothiophene skeleton, and an anthracene skeleton, with which the HOMO levels of the hole-transport materials do not become too high (shallow), are preferably used as the hole-transport skeleton.

The second compound preferably includes at least one of a carbazole skeleton, a dibenzofuran skeleton, a dibenzothiophene skeleton, and an anthracene skeleton. The hole-transport material may be an aromatic amine including a substituent that includes a dibenzofuran ring or a dibenzothiophene ring, an aromatic monoamine that includes a naphthalene ring, or an aromatic monoamine in which a 9-fluorenyl group is bonded to nitrogen of the amine through an arylene group.

The second compound including an N,N-bis(4-biphenyl)amino group is preferred because a light-emitting device having a long lifetime can be manufactured.

Examples of the second compound include N-(4-biphenyl)-6,N-diphenylbenzo[b]naphtho[1,2-d]furan-8-amine (abbreviation: BnfABP), N,N-bis(4-biphenyl)-6-phenylbenzo[b]naphtho[1,2-d]furan-8-amine (abbreviation: BBABnf), 4,4'-bis(6-phenylbenzo[b]naphtho[1,2-d]furan-8-yl-4"-phenyltriphenylamine (abbreviation: BnfBB1BP), N,N-bis(4-biphenyl)benzo[b]naphtho[1,2-d]furan-6-amine (abbreviation: BBABnf(6)), N,N-bis(4-biphenyl)benzo[b]naphtho[1,2-d]furan-8-amine (abbreviation: BBABnf(8)), N,N-bis(4-biphenyl)benzo[b]naphtho[2,3-d]furan-4-amine (abbreviation: BBABnf(II) (4)), N,N-bis[4-(dibenzofuran-4-yl)phenyl]-4-amino-p-terphenyl (abbreviation: DBfBB1TP), N-[4-(dibenzothiophen-4-yl)phenyl]-N-phenyl-4-biphenylamine (abbreviation: ThBA1BP), 4-(2-naphthyl)-4',4"-diphenyltriphenylamine (abbreviation: BBAβNB), 4-[4-(2-naphthyl)phenyl]-4',4"-diphenyltriphenylamine (abbreviation: BBAβNBi), 4,4'-diphenyl-4"-(6;1'-binaphthyl-2-yl)triphenylamine (abbreviation: BBAαNβNB), 4,4'-diphenyl-4"-(7;1'-binaphthyl-2-yl)triphenylamine (abbreviation: BBAαNβNB-03), 4,4'-diphenyl-4"-(7-phenyl)naphthyl-2-yltriphenylamine (abbreviation: BBAβNB-03), 4,4'-diphenyl-4"-(6;2'-binaphthyl-2-yl)triphenylamine (abbreviation: BBA(βN2)B), 4,4'-diphenyl-4"-(7;2'-binaphthyl-2-yl)triphenylamine (abbreviation: BBA(βN2)B-03), 4,4'-diphenyl-4"-(4;2'-binaphthyl-1-yl)triphenylamine (abbreviation: BBAβNαNB), 4,4'-diphenyl-4"-(5;2'-binaphthyl-1-yl)triphenylamine (abbreviation: BBAβNαNB-02), 4-(4-biphenylyl)-4'-(2-naphthyl)-4"-phenyltriphenylamine (abbreviation: TPBiAβNB), 4-(3-biphenylyl)-4'-[4-(2-naphthyl)phenyl]-4"-phenyltriphenylamine (abbreviation: mTPBiAβNBi), 4-(4-biphenylyl)-4'-[4-(2-naphthyl)phenyl]-4"-phenyltriphenylamine (abbreviation: TPBiAβNBi), 4-phenyl-4'-(1-naphthyl)triphenylamine (abbreviation: αNBA1BP), 4,4'-bis(1-naphthyl)triphenylamine (abbreviation: αNBB1BP), 4,4'-diphenyl-4"-[4'-(carbazol-9-yl)biphenyl-4-yl]triphenylamine (abbreviation: YGTBi1BP), 4'-[4-(3-phenyl-9H-carbazol-9-yl)phenyl]tris(1,1'-biphenyl-4-yl)amine (abbreviation: YGTBi1BP-02), 4-[4'-(carbazol-9-yl)biphenyl-4-yl]-4'-(2-naphthyl)-4"-phenyltriphenylamine (abbreviation: YGTBiβNB), N-[4-(9-phenyl-9H-carbazol-3-yl)phenyl]-N-[4-(1-naphthyl)phenyl]-9,9'-spirobi(9H-fluoren)-2-amine (abbreviation: PCBNBSF), N,N-bis([1,1'-biphenyl]-4-yl)-9,9'-spirobi[9H-fluoren]-2-amine (abbreviation: BBASF), N,N-bis([1,1'-biphenyl]-4-yl)-9,9'-spirobi[9H-fluoren]-4-amine (abbreviation: BBASF(4)), N-(1,1'-biphenyl-2-yl)-N-(9,9-dimethyl-9H-fluoren-2-yl)-9,9'-spiro-bi(9H-fluoren)-4-amine (abbreviation: oFBiSF), N-(4-biphenyl)-N-(9,9-dimethyl-9H-fluoren-2-yl)dibenzofuran-4-amine (abbreviation: FrBiF), N-[4-(1-naphthyl)phenyl]-N-[3-(6-phenyldibenzofuran-4-yl)phenyl]-1-naphthylamine (abbreviation: mPDBfBNBN), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-[4-(9-phenylfluoren-9-yl)phenyl]triphenylamine (abbreviation: BPAFLBi), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), N-phenyl-N-[4-(9-phenyl-9H-carbazol-3-yl)phenyl]spiro-9,9'-bifluoren-2-amine (abbreviation: PCBASF), N-(1,1'-biphenyl-4-yl)-9,9-dimethyl-N-[4-(9-phenyl-9H-carbazol-3-yl)phenyl]-9H-fluoren-2-amine (abbreviation: PCBBiF), 3,3'-(naphthalene-1,4-diyl)bis(9-phenyl-9H-carbazole) (abbreviation: PCzN2), and 4-(10-phenyl-9-anthryl)-4'-(9-phenyl-9H-fluoren-9-yl)triphenylamine (abbreviation: FLPAPA).

<Hole-Transport Layer>

The hole-transport layer 122 is a layer that transports holes injected by the hole-injection layer 121, to the light-emitting layer 123.

The hole-transport layer 122 preferably contains a third compound.

The third compound is a hole-transport material. As the hole-transport material, a hole-transport material that can be used as the second compound can be used.

The HOMO level of the third compound is preferably lower than or equal to the HOMO level of the second compound. A difference between the HOMO level of the third compound and the HOMO level of the second compound is preferably 0.2 eV or less.

It is preferable that the second compound and the third compound each include at least one of a carbazole skeleton, a dibenzofuran skeleton, a dibenzothiophene skeleton, and an anthracene skeleton.

It is preferable that the second compound and the third compound include the same hole-transport skeleton (particularly a dibenzofuran skeleton), in which case holes can be injected smoothly.

It is further preferable that the second compound and the third compound be the same compound, in which case holes can be injected smoothly.

In the case where the hole-transport layer 122 has a stacked-layer structure, each of the layers included in the hole-transport layer 122 is a layer that transports holes to the light-emitting layer 123.

The hole-transport layer 122*a* in FIG. 4B and FIG. 4C can have a structure similar to that of the hole-transport layer 122 in FIG. 4A.

The hole-transport layer 122*b* in FIG. 4B and FIG. 4C (i.e., the layer in the hole-transport layer 122 which is positioned closest to the light-emitting layer 123) preferably has a function of an electron-blocking layer.

The hole-transport layer 122*b* preferably contains a fourth compound.

The fourth compound is a hole-transport material. As the hole-transport material, a hole-transport material that can be used as the second compound can be used.

The HOMO level of the fourth compound is preferably lower than the HOMO level of the third compound. A difference between the HOMO level of the fourth compound and the HOMO level of the third compound is preferably 0.2 eV or less.

It is preferable that the second compound, the third compound, and the fourth compound each include at least one of a carbazole skeleton, a dibenzofuran skeleton, a dibenzothiophene skeleton, and an anthracene skeleton.

It is preferable that the second compound, the third compound, and the fourth compound include the same hole-transport skeleton (particularly a dibenzofuran skeleton), in which case holes can be injected smoothly.

Owing to the above-described relation between the hole-transport materials used for the hole-injection layer 121, the hole-transport layer 122*a*, and the hole-transport layer 122*b*, holes can be injected into each layer smoothly, which can prevent an increase in driving voltage and deficiency of holes in the light-emitting layer 123.

<Light-Emitting Layer>

The light-emitting layer is a layer containing a light-emitting substance. The light-emitting layer can contain one or more kinds of light-emitting substances. As the light-emitting substance, a substance that exhibits an emission color of blue, purple, bluish purple, green, yellowish green, yellow, orange, red, or the like is appropriately used. As the light-emitting substance, a substance that emits near-infrared light can also be used.

The light-emitting layer may contain one or more kinds of organic compounds (e.g., a host material and an assist material) in addition to the light-emitting substance (a guest material). As the one or more kinds of organic compounds, one or both of the hole-transport material and the electron-transport material described in this embodiment can be used. As the one or more kinds of organic compounds, a bipolar material may be used.

There is no particular limitation on the light-emitting substance that can be used for the light-emitting layer, and it is possible to use a light-emitting substance that converts singlet excitation energy into light emission in the visible light range or the near-infrared light range or a light-emitting substance that converts triplet excitation energy into light emission in the visible light range or the near-infrared light range.

As an example of the light-emitting substance that converts singlet excitation energy into light, a fluorescent substance can be given; examples include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative. A pyrene derivative is particularly preferable because it has a high emission quantum yield. Specific examples of the pyrene derivative include N,N'-bis(3-methylphenyl)-N,N'-bis[3-(9-phenyl-9H-fluoren-9-yl)phenyl]pyrene-1,6-diamine (abbreviation: 1,6mMemFLPAPrn), N,N'-diphenyl-N,N'-bis[4-(9-phenyl-9H-fluoren-9-yl)phenyl]pyrene-1,6-diamine (abbreviation: 1,6FLPAPrn), N,N'-bis(dibenzofuran-2-yl)-N,N'-diphenylpyrene-1,6-diamine (abbreviation: 1,6FrAPrn), N,N'-bis(dibenzothiophen-2-yl)-N,N'-diphenylpyrene-1,6-diamine (abbreviation: 1,6ThAPrn), N,N'-(pyrene-1,6-diyl)bis[(N-phenylbenzo[b]naphtho[1,2-d]furan)-6-amine] (abbreviation: 1,6BnfAPrn), N,N'-(pyrene-1,6-diyl)bis[(N-phenylbenzo[b]naphtho[1,2-d]furan)-8-amine] (abbreviation: 1,6BnfAPrn-02), and N,N'-(pyrene-1,6-diyl)bis[(6,N-diphenylbenzo[b]naphtho[1,2-d]furan)-8-amine] (abbreviation: 1,6BnfAPrn-03). Condensed aromatic diamine compounds typified by pyrenediamine compounds such as 1,6FLPAPrn, 1,6mMemFLPAPrn, and 1,6BnfAPrn-03 are particularly preferable because of their high hole-trapping properties, high emission efficiency, and high reliability.

In addition, it is possible to use 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), 4-(10-phenyl-9-anthryl)-4'-(9-phenyl-9H-carbazol-3-yl)triphenylamine (abbreviation: PCBAPA), 4-[4-(10-phenyl-9-anthryl)phenyl]-4'-(9-phenyl-9H-carbazol-3-yl)triphenylamine (abbreviation: PCBAPBA), perylene, 2,5,8,11-tetra(tert-butyl)perylene (abbreviation: TBP), N,N'-(2-tert-butylanthracene-9,10-diyldi-4,1-phenylene)bis[N,N',N'-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N,N'-triphenyl-1,4-phenylenediamine (abbreviation: 2DPAPPA), 3,10-bis[N-(9-phenyl-9H-carbazol-2-yl)-N-phenylamino]naphtho[2,3-b;6,7-b']bisbenzofuran (abbreviation: 3,10PCA2Nbf(IV)-

02), 3,10-bis[N-(dibenzofuran-3-yl)-N-phenylamino]naphtho[2,3-b;6,7-b']bisbenzofuran (abbreviation: 3,10FrA2Nbf(IV)-02), or the like.

Examples of the light-emitting substance that converts triplet excitation energy into luminescence include a phosphorescent substance and a thermally activated delayed fluorescence (TADF) material that exhibits thermally activated delayed fluorescence.

Examples of the phosphorescent substance include an organometallic complex (particularly an iridium complex) including a 4H-triazole skeleton, a 1H-triazole skeleton, an imidazole skeleton, a pyrimidine skeleton, a pyrazine skeleton, or a pyridine skeleton; an organometallic complex (particularly an iridium complex) in which a phenylpyridine derivative including an electron-withdrawing group is a ligand; a platinum complex; and a rare earth metal complex.

As a phosphorescent substance that exhibits blue or green and whose emission spectrum has a peak wavelength at greater than or equal to 450 nm and less than or equal to 570 nm, the following substances can be given.

The examples include organometallic complexes including a 4H-triazole skeleton, such as tris{2-[5-(2-methylphenyl)-4-(2,6-dimethylphenyl)-4H-1,2,4-triazol-3-yl-κN2]phenyl-κC}iridium(III) (abbreviation: $[Ir(mpptz\text{-}dmp)_3]$), tris(5-methyl-3,4-diphenyl-4H-1,2,4-triazolato)iridium(III) (abbreviation: $[Ir(Mptz)_3]$), tris[4-(3-biphenyl)-5-isopropyl-3-phenyl-4H-1,2,4-triazolato]iridium(III) (abbreviation: $[Ir(iPrptz\text{-}3b)_3]$), and tris[3-(5-biphenyl)-5-isopropyl-4-phenyl-4H-1,2,4-triazolato]iridium(III) (abbreviation: $Ir(iPr5btz)_3]$); organometallic complexes including a 1H-triazole skeleton, such as tris[3-methyl-1-(2-methylphenyl)-5-phenyl-1H-1,2,4-triazolato]iridium(III) (abbreviation: $[Ir(Mptz1\text{-}mp)_3]$) and tris(1-methyl-5-phenyl-3-propyl-1H-1,2,4-triazolato)iridium(III) (abbreviation: $[Ir(Prptz1\text{-}Me)_3]$); organometallic complexes including an imidazole skeleton, such as fac-tris[1-(2,6-diisopropylphenyl)-2-phenyl-1H-imidazole]iridium(III) (abbreviation: $[Ir(iPrpmi)_3]$), and tris[3-(2,6-dimethylphenyl)-7-methylimidazo[1,2-f]phenanthridinato]iridium(III) (abbreviation: $[Ir(dmpimpt\text{-}Me)_3]$); organometallic complexes in which a phenylpyridine derivative including an electron-withdrawing group is a ligand, such as bis[2-(4',6'-difluorophenyl)pyridinato-N,$C^{2'}$]iridium(III) tetrakis(1-pyrazolyl)borate (abbreviation: FIr6), bis[2-(4',6'-difluorophenyl)pyridinato-N,$C^{2'}$]iridium(III) picolinate (abbreviation: FIrpic), bis{2-[3',5'-bis(trifluoromethyl)phenyl]pyridinato-N,$C^{2'}$}iridium(III) picolinate (abbreviation: $[Ir(CF_3ppy)_2(pic)]$), and bis[2-(4',6'-difluorophenyl)pyridinato-N,$C^{2'}$]iridium(III) acetylacetonate (abbreviation: FIr(acac)); and the like.

As a phosphorescent substance that exhibits green or yellow and whose emission spectrum has a peak wavelength at greater than or equal to 495 nm and less than or equal to 590 nm, the following substances can be given.

The examples include organometallic iridium complexes including a pyrimidine skeleton, such as tris(4-methyl-6-phenylpyrimidinato)iridium(III) (abbreviation: $[Ir(mppm)_3]$), tris(4-t-butyl-6-phenylpyrimidinato)iridium(III) (abbreviation: $[Ir(tBuppm)_3]$), (acetylacetonato)bis(6-methyl-4-phenylpyrimidinato)iridium(III) (abbreviation: $[Ir(mppm)_2(acac)]$), (acetylacetonato)bis(6-tert-butyl-4-phenylpyrimidinato)iridium(III) (abbreviation: $[Ir(tBuppm)_2(acac)]$), (acetylacetonato)bis[6-(2-norbornyl)-4-phenylpyrimidinato]iridium(III) (abbreviation: $[Ir(nbppm)_2(acac)]$), (acetylacetonato)bis[5-methyl-6-(2-methylphenyl)-4-phenylpyrimidinato]iridium(III) (abbreviation: $[Ir(mpmppm)_2(acac)]$), (acetylacetonato)bis{4,6-dimethyl-2-[6-(2,6-dimethylphenyl)-4-pyrimidinyl-κN3]phenyl-κC}iridium(III) (abbreviation: $[Ir(dmppm\text{-}dmp)_2(acac)]$), and (acetylacetonato)bis(4,6-diphenylpyrimidinato)iridium(III) (abbreviation: $[Ir(dppm)_2(acac)]$); organometallic iridium complexes including a pyrazine skeleton, such as (acetylacetonato)bis(3,5-dimethyl-2-phenylpyrazinato)iridium(III) (abbreviation: $[Ir(mppr\text{-}Me)_2(acac)]$) and (acetylacetonato)bis(5-isopropyl-3-methyl-2-phenylpyrazinato)iridium(III) (abbreviation: $[Ir(mppr\text{-}iPr)_2(acac)]$); organometallic iridium complexes including a pyridine skeleton, such as tris(2-phenylpyridinato-N,$C^{2'}$)iridium(III) (abbreviation: $[Ir(ppy)_3]$), bis(2-phenylpyridinato-N,$C^{2'}$)iridium(III) acetylacetonate (abbreviation: $[Ir(ppy)_2(acac)]$), bis(benzo[h]quinolinato)iridium(III) acetylacetonate (abbreviation: $[Ir(bzq)_2(acac)]$), tris(benzo[h]quinolinato)iridium(III) (abbreviation: $[Ir(bzq)_3]$), tris(2-phenylquinolinato-N,$C^{2'}$)iridium(III) (abbreviation: $[Ir(pq)_3]$), bis(2-phenylquinolinato-N,$C^{2'}$)iridium(III) acetylacetonate (abbreviation: $[Ir(pq)_2(acac)]$), [2-(4-phenyl-2-pyridinyl-κN)phenyl-κC]bis[2-(2-pyridinyl-κN)phenyl-κC]iridium(III) (abbreviation: $[Ir(ppy)_2(4dppy)]$), and bis[2-(2-pyridinyl-κN)phenyl-κC][2-(4-methyl-5-phenyl-2-pyridinyl-κN)phenyl-κC]; organometallic complexes such as bis(2,4-diphenyl-1,3-oxazolato-N,$C^{2'}$)iridium(III) acetylacetonate (abbreviation: $[Ir(dpo)_2(acac)]$), bis{2-[4'-(perfluorophenyl)phenyl]pyridinato-N,$C^{2'}$}iridium(III) acetylacetonate (abbreviation: $[Ir(p\text{-}PF\text{-}ph)_2(acac)]$), and bis(2-phenylbenzothiazolato-N,$C^{2'}$)iridium(III) acetylacetonate (abbreviation: $[Ir(bt)_2(acac)]$); and rare earth metal complexes such as tris(acetylacetonato) (monophenanthroline) terbium(III) (abbreviation: $[Tb(acac)_3(Phen)]$).

As a phosphorescent substance that exhibits yellow or red and whose emission spectrum has a peak wavelength at greater than or equal to 570 nm and less than or equal to 750 nm, the following substances can be given.

The examples include organometallic complexes including a pyrimidine skeleton, such as (diisobutyrylmethanato)bis[4,6-bis(3-methylphenyl)pyrimidinato]iridium(III) (abbreviation: $[Ir(5mdppm)_2(dibm)]$), bis[4,6-bis(3-methylphenyl)pyrimidinato](dipivaloylmethanato)iridium(III) (abbreviation: $[Ir(5mdppm)_2(dpm)]$), bis[4,6-di(naphthalen-1-yl)pyrimidinato](dipivaloylmethanato)iridium(III) (abbreviation: $[Ir(d1npm)_2(dpm)]$), and tris(4-t-butyl-6-phenylpyrimidinato)iridium(III) (abbreviation: $[Ir(tBuppm)_3]$); organometallic complexes including a pyrazine skeleton, such as (acetylacetonato)bis(2,3,5-triphenylpyrazinato)iridium(III) (abbreviation: $[Ir(tppr)_2(acac)]$), bis(2,3,5-triphenylpyrazinato)(dipivaloylmethanato)iridium(III) (abbreviation: $[Ir(tppr)_2(dpm)]$), bis{4,6-dimethyl-2-[3-(3,5-dimethylphenyl)-5-phenyl-2-pyrazinyl-N]phenyl-κC}(2,6-dimethyl-3,5-heptanedionato-$\kappa^2$O,O')iridium(III) (abbreviation: $[Ir(dmdppr\text{-}P)_2(dibm)]$), bis{4,6-dimethyl-2-[5-(4-cyano-2,6-dimethylphenyl)-3-(3,5-dimethylphenyl)-2-pyrazinyl-κN]phenyl-κC}(2,2,6,6-tetramethyl-3,5-heptanedionato-$\kappa^2$O,O')iridium(III) (abbreviation: $[Ir(dmdppr\text{-}dmCP)_2(dpm)]$), (acetylacetonato)bis[2-methyl-3-phenylquinoxalinato-N,$C^{2'}$]iridium(III) (abbreviation: $[Ir(mpq)_2(acac)]$), (acetylacetonato)bis(2,3-diphenylquinoxalinato-N,$C^{2'}$)iridium(III) (abbreviation: $[Ir(dpq)_2(acac)]$), (acetylacetonato)bis[2,3-bis(4-fluorophenyl)quinoxalinato]iridium(III) (abbreviation: $[Ir(Fdpq)_2(acac)]$), and bis{4,6-dimethyl-2-[5-(5-cyano-2-methylphenyl)-3-(3,5-dimethylphenyl)-2-pyrazinyl-κN]phenyl-κC}(2,2,6,6-tetramethyl-3,5-heptanedionato-$\kappa^2$O,O')iridium(III) (abbreviation: $[Ir(dmdppr\text{-}m5CP)_2(dpm)]$); organometallic complexes including a pyridine skeleton, such as tris(1-phenylisoquinolinato-N,$C^{2'}$)iridium(III) (abbreviation: $[Ir(piq)_3]$), bis(1-phenylisoquinolinato-N,$C^{2'}$)iridium(III)

acetylacetonate (abbreviation: $[Ir(piq)_2(acac)]$), and bis[4,6-dimethyl-2-(2-quinolinyl-κN)phenyl-κC](2,4-pentanedionato-$\kappa^2$O,O')iridium(III); platinum complexes such as 2,3,7,8,12,13,17,18-octaethyl-21H,23H-porphyrinplatinum(II) (abbreviation: [PtOEP]); and rare earth metal complexes such as tris(1,3-diphenyl-1,3-propanedionato) (monophenanthroline)europium(III) (abbreviation: $[Eu(DBM)_3(Phen)]$) and tris[1-(2-thenoyl)-3,3,3-trifluoroacetonato] (monophenanthroline)europium(III) (abbreviation: $[Eu(TTA)_3(Phen)]$).

As the organic compounds (e.g., the host material and the assist material) used in the light-emitting layer, one or more kinds of substances having a larger energy gap than the light-emitting substance can be selected and used.

As an organic compound used in combination with the fluorescent substance, it is preferable to use an organic compound that has a high energy level in a singlet excited state and has a low energy level in a triplet excited state.

In terms of a preferable combination with the light-emitting substance (the fluorescent substance or the phosphorescent substance), specific examples of the organic compounds are shown below although some of them overlap the specific examples shown above.

Examples of the organic compound that can be used in combination with the fluorescent substance include condensed polycyclic aromatic compounds, such as an anthracene derivative, a tetracene derivative, a phenanthrene derivative, a pyrene derivative, a chrysene derivative, and a dibenzo[g,p]chrysene derivative.

Specific examples of the organic compound (the host material) used in combination with the fluorescent substance include 9-phenyl-3-[4-(10-phenyl-9-anthryl)phenyl]-9H-carbazole (abbreviation: PCzPA), 3,6-diphenyl-9-[4-(10-phenyl-9-anthryl)phenyl]-9H-carbazole (abbreviation: DPCzPA), 3-[4-(1-naphthyl)-phenyl]-9-phenyl-9H-carbazole (abbreviation: PCPN), 9,10-diphenylanthracene (abbreviation: DPAnth), N,N'-diphenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), YGAPA, PCAPA, N,9-diphenyl-N-{4-[4-(10-phenyl-9-anthryl)phenyl]phenyl}-9H-carbazol-3-amine (abbreviation: PCAPBA), N-(9,10-diphenyl-2-anthryl)-N,9-diphenyl-9H-carbazol-3-amine (abbreviation: 2PCAPA), 6,12-dimethoxy-5,11-diphenylchrysene, N,N,N',N',N",N",N"',N"'-octaphenyldibenzo[g,p]chrysene-2,7,10,15-tetraamine (abbreviation: DBC1), 9-[4-(10-phenyl-9-anthracenyl)phenyl]-9H-carbazole (abbreviation: CzPA), 7-[4-(10-phenyl-9-anthryl)phenyl]-7H-dibenzo[c,g]carbazole (abbreviation: cgDBCzPA), 6-[3-(9,10-diphenyl-2-anthryl)phenyl]-benzo[b]naphtho[1,2-d]furan (abbreviation: 2mBnfPPA), 9-phenyl-10-{4-(9-phenyl-9H-fluoren-9-yl)-biphenyl-4'-yl}anthracene (abbreviation: FLPPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 1,3,5-tri(1-pyrenyl)benzene (abbreviation: TPB3), 5,12-diphenyltetracene, 5,12-bis(biphenyl-2-yl)tetracene, and 9-(1-naphthyl)-10-[4-(2-naphthyl)phenyl]anthracene (abbreviation: αN-βNPAnth).

As the organic compound used in combination with the phosphorescent substance, an organic compound whose triplet excitation energy (energy difference between a ground state and a triplet excited state) is higher than the triplet excitation energy of the light-emitting substance is selected.

In the case where a plurality of organic compounds (e.g., a first host material and a second host material (or an assist material)) are used in combination with the light-emitting substance in order to form an exciplex, the plurality of organic compounds are preferably mixed with a phosphorescent substance (particularly an organometallic complex).

Such a structure makes it possible to efficiently obtain light emission utilizing ExTET (Exciplex-Triplet Energy Transfer), which is energy transfer from an exciplex to a light-emitting substance. Note that a combination of a plurality of organic compounds which easily forms an exciplex is preferable, and it is particularly preferable to combine a compound that easily accepts holes (a hole-transport material) and a compound that easily accepts electrons (an electron-transport material). When a combination of materials is selected so as to form an exciplex that exhibits light emission whose wavelength overlaps the wavelength on a lowest-energy-side absorption band of the light-emitting substance, energy can be transferred smoothly and light emission can be obtained efficiently. As the hole-transport material and the electron-transport material, specifically, any of the materials described in this embodiment can be used. With this structure, high efficiency, low-voltage driving, and a long lifetime of the light-emitting device can be achieved at the same time.

In a combination of materials for forming an exciplex, the HOMO level of the hole-transport material is preferably higher than or equal to the HOMO level of the electron-transport material. The LUMO level (lowest unoccupied molecular orbital level) of the hole-transport material is preferably higher than or equal to the LUMO level of the electron-transport material. Note that the LUMO levels and the HOMO levels of the materials can be derived from the electrochemical characteristics (the reduction potentials and the oxidation potentials) of the materials that are measured by cyclic voltammetry (CV) measurement.

Note that the formation of an exciplex can be confirmed by a phenomenon in which the emission spectrum of a mixed film in which the hole-transport material and the electron-transport material are mixed is shifted to the longer wavelength side than the emission spectrum of each of the materials (or has another peak on the longer wavelength side), observed by comparison of the emission spectrum of the hole-transport material, the emission spectrum of the electron-transport material, and the emission spectrum of the mixed film of these materials, for example. Alternatively, the formation of an exciplex can be confirmed by a difference in transient response, such as a phenomenon in which the transient photoluminescence (PL) lifetime of the mixed film has longer lifetime components or has a larger proportion of delayed components than that of each of the materials, observed by comparison of the transient PL of the hole-transport material, the transient PL of the electron-transport material, and the transient PL of the mixed film of these materials. The transient PL can be rephrased as transient electroluminescence (EL). That is, the formation of an exciplex can also be confirmed by a difference in transient response observed by comparison of the transient EL of the hole-transport material, the transient EL of the electron-transport material, and the transient EL of the mixed film of these materials.

Examples of the organic compound that can be used in combination with the phosphorescent substance include an aromatic amine (a compound including an aromatic amine skeleton), a carbazole derivative (a compound including a carbazole skeleton), a dibenzothiophene derivative (a thiophene derivative), a dibenzofuran derivative (a furan derivative), a zinc- or aluminum-based metal complex, an oxadiazole derivative, a triazole derivative, a benzimidazole derivative, a quinoxaline derivative, a dibenzoquinoxaline derivative, a pyrimidine derivative, a triazine derivative, a pyridine derivative, a bipyridine derivative, and a phenanthroline derivative.

As specific examples of the aromatic amine, the carbazole derivative, the dibenzothiophene derivative, and the dibenzofuran derivative, which are organic compounds having a high hole-transport property, the following substances can be given.

Examples of the carbazole derivative include a bicarbazole derivative (e.g., a 3,3'-bicarbazole derivative) and an aromatic amine including a carbazolyl group.

Specific examples of the bicarbazole derivative (e.g., a 3,3'-bicarbazole derivative) include 3,3'-bis(9-phenyl-9H-carbazole) (abbreviation: PCCP), 9,9'-bis(1,1'-biphenyl-4-yl)-3,3'-bi-9H-carbazole, 9,9'-bis(1,1'-biphenyl-3-yl)-3,3'-bi-9H-carbazole, 9-(1,1'-biphenyl-3-yl)-9'-(1,1'-biphenyl-4-yl)-9H,9'H-3,3'-bicarbazole (abbreviation: mBPCCBP), and 9-(2-naphthyl)-9'-phenyl-9H,9'H-3,3'-bicarbazole (abbreviation: pNCCP).

Specific examples of the aromatic amine including a carbazolyl group include PCBA1BP, N-(4-biphenyl)-N-(9,9-dimethyl-9H-fluoren-2-yl)-9-phenyl-9H-carbazol-3-amine (abbreviation: PCBiF), PCBBiF, PCBBi1BP, PCBANB, PCBNBB, 4-phenyldiphenyl-(9-phenyl-9H-carbazol-3-yl)amine (abbreviation: PCA1BP), N,N'-bis(9-phenylcarbazol-3-yl)-N,N'-diphenylbenzene-1,3-diamine (abbreviation: PCA2B), N,N',N''-triphenyl-N,N',N''-tris(9-phenylcarbazol-3-yl)benzene-1,3,5-triamine (abbreviation: PCA3B), 9,9-dimethyl-N-phenyl-N-[4-(9-phenyl-9H-carbazol-3-yl)phenyl]fluoren-2-amine (abbreviation: PCBAF), PCBASF, 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), 3-[N-(4-diphenylaminophenyl)-N-phenylamino]-9-phenylcarbazole (abbreviation: PCzDPA1), 3,6-bis[N-(4-diphenylaminophenyl)-N-phenylamino]-9-phenylcarbazole (abbreviation: PCzDPA2), 3,6-bis[N-(4-diphenylaminophenyl)-N-(1-naphthyl)amino]-9-phenylcarbazole (abbreviation: PCzTPN2), 2-[N-(9-phenylcarbazol-3-yl)-N-phenylamino]spiro-9,9'-bifluorene (abbreviation: PCASF), N-[4-(9H-carbazol-9-yl)phenyl]-N-(4-phenyl)phenylaniline (abbreviation: YGA1BP), N,N'-bis[4-(carbazol-9-yl)phenyl]-N,N'-diphenyl-9,9-dimethylfluorene-2,7-diamine (abbreviation: YGA2F), and 4,4',4''-tris(carbazol-9-yl)triphenylamine (abbreviation: TCTA).

In addition to the above, other examples of the carbazole derivative include 3-[4-(9-phenanthryl)-phenyl]-9-phenyl-9H-carbazole (abbreviation: PCPPn), PCPN, 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), 1,3,5-tris[4-(N-carbazolyl)phenyl]benzene (abbreviation: TCPB), and CzPA.

Specific examples of the thiophene derivative (a compound including a thiophene skeleton) and the furan derivative (a compound including a furan skeleton) include compounds including a thiophene skeleton, such as 4,4',4''-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), and 4-[4-(9-phenyl-9H-fluoren-9-yl)phenyl]-6-phenyldibenzothiophene (abbreviation: DBTFLP-IV), and 4-{3-[3-(9-phenyl-9H-fluoren-9-yl)phenyl]phenyl}dibenzofuran (abbreviation: mmDBFFLBi-II).

Specific examples of the aromatic amine include 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), BPAFLP, mBPAFLP, N-(9,9-dimethyl-9H-fluoren-2-yl)-N-{9,9-dimethyl-2-[N'-phenyl-N'-(9,9-dimethyl-9H-fluoren-2-yl)amino]-9H-fluoren-7-yl}phenylamine (abbreviation: DFLADFL), N-(9,9-dimethyl-2-diphenylamino-9H-fluoren-7-yl)diphenylamine (abbreviation: DPNF), 2-[N-(4-diphenylaminophenyl)-N-phenylamino]spiro-9,9'-bifluorene (abbreviation: DPASF), 2,7-bis[N-(4-diphenylaminophenyl)-N-phenylamino]spiro-9,9'-bifluorene (abbreviation: DPA2SF), 4,4',4''-tris[N-(1-naphthyl)-N-phenylamino]triphenylamine (abbreviation: 1'-TNATA), 4,4',4''-tris(N,N'-diphenylamino)triphenylamine (abbreviation: TDATA), 4,4',4''-tris[N-(3-methylphenyl)-N-phenylamino]triphenylamine (abbreviation: m-MTDATA), N,N'-di(p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), 4,4'-bis(N'-{4-[N'-(3-methylphenyl)-N'-phenylamino]phenyl}-N-phenylamino)biphenyl (abbreviation: DNTPD), and 1,3,5-tris[N-(4-diphenylaminophenyl)-N-phenylamino]benzene (abbreviation: DPA3B).

As the organic compound having a high hole-transport property, a high molecular compound such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide](abbreviation: PTPDMA), or poly[N,N'-bis(4-butylphenyl)-N,N'-bis(phenyl)benzidine](abbreviation: Poly-TPD) can also be used.

Specific examples of the zinc- and aluminum-based metal complexes, which are organic compounds having a high electron-transport property, include metal complexes including a quinoline skeleton or a benzoquinoline skeleton, such as tris(8-quinolinolato)aluminum(III) (abbreviation: Alq), tris(4-methyl-8-quinolinolato)aluminum(III) (abbreviation: $Almq_3$), bis(10-hydroxybenzo[h]quinolinato)beryllium(II) (abbreviation: $BeBq_2$), bis(2-methyl-8-quinolinolato)(4-phenylphenolato)aluminum(III) (abbreviation: BAlq), and bis(8-quinolinolato)zinc(II) (abbreviation: Znq).

A metal complex having an oxazole-based or thiazole-based ligand, such as bis[2-(2-benzoxazolyl)phenolato]zinc(II) (abbreviation: ZnPBO) or bis[2-(2-benzothiazolyl)phenolato]zinc(II) (abbreviation: ZnBTZ), or the like can also be used.

Specific examples of the oxadiazole derivative, the triazole derivative, the benzimidazole derivative, the quinoxaline derivative, the dibenzoquinoxaline derivative, and the phenanthroline derivative, which are organic compounds having a high electron-transport property, include 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 3-(4-biphenylyl)-4-phenyl-5-(4-tert-butylphenyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), 2-{4-[9,10-di(naphthalen-2-yl)-2-anthryl]phenyl}-1-phenyl-1H-benzimidazole (abbreviation:

ZADN), 2,2',2"-(1,3,5-benzenetriyl)tris(1-phenyl-1H-benzimidazole) (abbreviation: TPBI), 2-[3-(dibenzothiophen-4-yl)phenyl]-1-phenyl-1H-benzimidazole (abbreviation: mDBTBIm-II), 4,4'-bis(5-methylbenzoxazol-2-yl)stilbene (abbreviation: BzOs), bathophenanthroline (abbreviation: Bphen), bathocuproine (abbreviation: BCP), 2,9-bis(naphthalen-2-yl)-4,7-diphenyl-1,10-phenanthroline (abbreviation: NBphen), 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 2-[4-(3,6-diphenyl-9H-carbazol-9-yl)phenyl]dibenzo[f,h]quinoxaline (abbreviation: 2CzPDBq-III), 7-[3-(dibenzothiophen-4-yl)phenyl]dibenzo[f,h]quinoxaline (abbreviation: 7mDBTPDBq-II), and 6-[3-(dibenzothiophen-4-yl)phenyl]dibenzo[f,h]quinoxaline (abbreviation: 6mDBTPDBq-II).

Specific examples of a heterocyclic compound having a diazine skeleton, a heterocyclic compound having a triazine skeleton, and a heterocyclic compound having a pyridine skeleton, which are organic compounds having a high electron-transport property, include 4,6-bis[3-(phenanthren-9-yl)phenyl]pyrimidine (abbreviation: 4,6mPnP2Pm), 4,6-bis[3-(4-dibenzothienyl)phenyl]pyrimidine (abbreviation: 4,6mDBTP2Pm-II), 4,6-bis[3-(9H-carbazol-9-yl)phenyl]pyrimidine (abbreviation: 4,6mCzP2Pm), 2-{4-[3-(N-phenyl-9H-carbazol-3-yl)-9H-carbazol-9-yl]phenyl}-4,6-diphenyl-1,3,5-triazine (abbreviation: PCCzPTzn), 9-[3-(4,6-diphenyl-1,3,5-triazin-2-yl)phenyl]-9'-phenyl-2,3'-bi-9H-carbazole (abbreviation: mPCCzPTzn-02), 2-[3'-(9,9-dimethyl-9H-fluorene-2-yl)-1,1'-biphenyl-3-yl]-4,6-diphenyl-1,3,5-triazine (abbreviation: mFBPTzn), 2-[(1,1'-biphenyl)-4-yl]-4-phenyl-6-[9,9'-spirobi(9H-fluoren)-2-yl]-1,3,5-triazine (abbreviation: BP-SFTzn), 2-{3-[3-(benzo[b]naphtho[1,2-d]furan-8-yl)phenyl]phenyl}-4,6-diphenyl-1,3,5-triazine (abbreviation: mBnfBPTzn), 2-{3-[3-(benzo[b]naphtho[1,2-d]furan-6-yl)phenyl]phenyl}-4,6-diphenyl-1,3,5-triazine (abbreviation: mBnfBPTzn-02), 3,5-bis(3-(9H-carbazol-9-yl)phenyl)pyridine (abbreviation: 35DCzPPy), and 1,3,5-tri[3-(3-pyridyl)phenyl]benzene (abbreviation: TmPyPB).

As the organic compound having a high electron-transport property, a high molecular compound such as poly(2,5-pyridinediyl) (abbreviation: PPy), poly[(9,9-dihexylfluorene-2,7-diyl)-co-(pyridine-3,5-diyl)] (abbreviation: PF-Py), or poly[(9,9-dioctylfluorene-2,7-diyl)-co-(2,2'-bipyridine-6,6'-diyl)] (abbreviation: PF-BPy) can also be used.

The TADF material is a material that has a small difference between the $S_1$ level (the energy level in a singlet excited state) and the $T_1$ level (the energy level in a triplet excited state) and has a function of converting triplet excitation energy into singlet excitation energy by reverse intersystem crossing. Thus, it is possible to upconvert triplet excitation energy into singlet excitation energy (reverse intersystem crossing) using a little thermal energy and to efficiently generate a singlet excited state. In addition, the triplet excitation energy can be converted into light emission. Thermally activated delayed fluorescence is efficiently obtained under the condition where the difference in energy between the $S_1$ level and the $T_1$ level is greater than or equal to 0 eV and less than or equal to 0.2 eV, preferably greater than or equal to 0 eV and less than or equal to 0.1 eV. Delayed fluorescence by the TADF material refers to light emission having a spectrum similar to that of normal fluorescence and an extremely long lifetime. The lifetime is $10^{-6}$ seconds or longer, preferably $10^{-3}$ seconds or longer.

An exciplex whose excited state is formed by two kinds of substances has an extremely small difference between the $S_1$ level and the $T_1$ level and functions as a TADF material that can convert triplet excitation energy into singlet excitation energy.

A phosphorescent spectrum observed at low temperatures (e.g., 77 K to 10 K) is used for an index of the $T_1$ level. When the level of energy with a wavelength of the line obtained by extrapolating a tangent to the fluorescent spectrum at a tail on the short wavelength side is the $S_1$ level and the level of energy with a wavelength of the line obtained by extrapolating a tangent to the phosphorescent spectrum at a tail on the short wavelength side is the $T_1$ level, the difference between $S_1$ and $T_1$ of the TADF material is preferably less than or equal to 0.3 eV, further preferably less than or equal to 0.2 eV.

The TADF material may be used as a guest material or may be used as a host material.

Examples of the TADF material include fullerene, a derivative thereof, an acridine derivative such as proflavine, and eosin. Other examples include a metal-containing porphyrin such as a porphyrin containing magnesium (Mg), zinc (Zn), cadmium (Cd), tin (Sn), platinum (Pt), indium (In), or palladium (Pd). Examples of the metal-containing porphyrin include a protoporphyrin-tin fluoride complex (abbreviation: $SnF_2$(Proto IX)), a mesoporphyrin-tin fluoride complex (abbreviation: $SnF_2$(Meso IX)), a hematoporphyrin-tin fluoride complex (abbreviation: $SnF_2$(Hemato IX)), a coproporphyrin tetramethyl ester-tin fluoride complex (abbreviation: $SnF_2$(Copro III-4Me)), an octaethylporphyrin-tin fluoride complex (abbreviation: $SnF_2$(OEP)), an etioporphyrin-tin fluoride complex (abbreviation: $SnF_2$(Etio I)), and an octaethylporphyrin-platinum chloride complex (abbreviation: $PtCl_2$OEP).

Other than these, a heterocyclic compound having a π-electron rich heteroaromatic ring and a π-electron deficient heteroaromatic ring, such as 2-(biphenyl-4-yl)-4,6-bis(12-phenylindolo[2,3-a]carbazol-11-yl)-1,3,5-triazine (abbreviation: PIC-TRZ), PCCzPTzn, 2-[4-(10H-phenoxazin-10-yl)phenyl]-4,6-diphenyl-1,3,5-triazine (abbreviation: PXZ-TRZ), 3-[4-(5-phenyl-5,10-dihydrophenazin-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), 10-phenyl-10H,10'H-spiro[acridin-9,9'-anthracen]-10'-one (abbreviation: ACRSA), 4-(9'-phenyl-3,3'-bi-9H-carbazol-9-yl)benzofuro[3,2-d]pyrimidine (abbreviation: 4PCCzBfpm), 4-[4-(9'-phenyl-3,3'-bi-9H-carbazol-9-yl)phenyl]benzofuro[3,2-d]pyrimidine (abbreviation: 4PCCzPBfpm), or 9-[3-(4,6-diphenyl-1,3,5-triazin-2-yl)phenyl]-9'-phenyl-2,3'-bi-9H-carbazole (abbreviation: mPCCzPTzn-02) can be used. The heterocyclic compound is preferable because of having both a high electron-transport property and a high hole-transport property owing to a π-electron rich heteroaromatic ring and a π-electron deficient heteroaromatic ring. Note that an aromatic ring to which an electron-withdrawing group such as a cyano group is bonded may be used instead of the π-electron deficient heteroaromatic ring. Furthermore, a π-electron deficient skeleton can be used instead of the π-electron deficient heteroaromatic ring. Similarly, a π-electron rich skeleton can be used instead of the π-electron rich heteroaromatic ring.

Among skeletons having a π-electron deficient heteroaromatic ring, a pyridine skeleton, a diazine skeleton (a pyrimidine skeleton, a pyrazine skeleton, or a pyridazine skeleton), and a triazine skeleton are particularly preferable because of their high stability and reliability. In particular, a benzofuropyrimidine skeleton, a benzothienopyrimidine skeleton, a benzofuropyrazine skeleton, and a benzothienopyrazine skeleton are preferable because of their high electron-accepting properties and reliability.

Among skeletons having a π-electron rich heteroaromatic ring, an acridine skeleton, a phenoxazine skeleton, a phenothiazine skeleton, a furan skeleton, a thiophene skeleton, and a pyrrole skeleton have high stability and reliability; therefore, at least one of these skeletons is preferably included. A dibenzofuran skeleton, a dibenzothiophene skeleton, an indole skeleton, a carbazole skeleton, an indolocarbazole skeleton, a bicarbazole skeleton, and a 3-(9-phenyl-9H-carbazol-3-yl)-9H-carbazole skeleton are particularly preferable.

Note that a substance in which a π-electron rich heteroaromatic ring is directly bonded to a π-electron deficient heteroaromatic ring is particularly preferable because both the donor property of the π-electron rich heteroaromatic ring and the acceptor property of the π-electron deficient heteroaromatic ring are improved and the energy difference between the singlet excited state and the triplet excited state becomes small.

As a π-electron rich skeleton, an aromatic amine skeleton, a phenazine skeleton, or the like can be used. As a π-electron deficient skeleton, a xanthene skeleton, a thioxanthene dioxide skeleton, an oxadiazole skeleton, a triazole skeleton, an imidazole skeleton, an anthraquinone skeleton, a boron-containing skeleton such as phenylborane or boranthrene, an aromatic ring or a heteroaromatic ring having a nitrile group or a cyano group, such as benzonitrile or cyanobenzene, a carbonyl skeleton such as benzophenone, a phosphine oxide skeleton, a sulfone skeleton, or the like can be used.

Note that the TADF material can also be used in combination with another organic compound when used as a light-emitting substance. In particular, the TADF material can be combined with the host material (the hole-transport material or the electron-transport material) described above. In the case of using the TADF material, the $S_1$ level of the host material is preferably higher than the $S_1$ level of the TADF material. In addition, the $T_1$ level of the host material is preferably higher than the $T_1$ level of the TADF material.

Alternatively, the TADF material may be used as a host material, and a fluorescent substance may be used as a guest material. When the TADF material is used as the host material, triplet excitation energy generated in the TADF material is converted into singlet excitation energy by reverse intersystem crossing and transferred to the light-emitting substance, whereby the emission efficiency of the light-emitting device can be increased. At this time, the TADF material functions as an energy donor, and the light-emitting substance functions as an energy acceptor. Therefore, the use of the TADF material as the host material is very effective in the case where a fluorescent substance is used as the guest material. In that case, the $S_1$ level of the TADF material is preferably higher than the $S_1$ level of the fluorescent substance in order that high emission efficiency can be achieved. Furthermore, the $T_1$ level of the TADF material is preferably higher than the $S_1$ level of the fluorescent substance. Therefore, the $T_1$ level of the TADF material is preferably higher than the $T_1$ level of the fluorescent substance.

It is preferable to use a TADF material that exhibits light emission whose wavelength overlaps the wavelength on a lowest-energy-side absorption band of the fluorescent substance. This enables smooth transfer of excitation energy from the TADF material to the fluorescent substance and accordingly enables efficient light emission, which is preferable.

In addition, in order that singlet excitation energy is efficiently generated from the triplet excitation energy by reverse intersystem crossing, carrier recombination preferably occurs in the TADF material. It is also preferable that the triplet excitation energy generated in the TADF material not be transferred to the triplet excitation energy of the fluorescent substance. For that reason, the fluorescent substance preferably has a protective group around a luminophore (a skeleton which causes light emission) of the fluorescent substance. As the protective group, a substituent having no π bond and a saturated hydrocarbon group are preferably used. Specific examples include an alkyl group having 3 to 10 carbon atoms, a substituted or unsubstituted cycloalkyl group having 3 to 10 carbon atoms, and a trialkylsilyl group having 3 to 10 carbon atoms. It is further preferable that the fluorescent substance have a plurality of protective groups. The substituent having no π bond has a poor carrier-transport property, whereby the TADF material and the luminophore of the fluorescent substance can be made away from each other with little influence on carrier transportation or carrier recombination. Here, the luminophore refers to an atomic group (skeleton) that causes light emission in a fluorescent substance. The luminophore is preferably a skeleton having a π bond, further preferably includes an aromatic ring, and still further preferably includes a condensed aromatic ring or a condensed heteroaromatic ring. Examples of the condensed aromatic ring or the condensed heteroaromatic ring include a phenanthrene skeleton, a stilbene skeleton, an acridone skeleton, a phenoxazine skeleton, and a phenothiazine skeleton. Specifically, a fluorescent substance including any of a naphthalene skeleton, an anthracene skeleton, a fluorene skeleton, a chrysene skeleton, a triphenylene skeleton, a tetracene skeleton, a pyrene skeleton, a perylene skeleton, a coumarin skeleton, a quinacridone skeleton, and a naphthobisbenzofuran skeleton is preferable because of its high fluorescence quantum yield.

<Electron-Transport Layer>

The electron-transport layer 124 is a layer that transports electrons injected from the cathode 102, to the light-emitting layer 123.

The electron-transport layer 124 contains a third organic compound and a first substance.

The third organic compound is an electron-transport material. The electron-transport material has an electron-transport property higher than a hole-transport property.

The highest occupied molecular orbital level (HOMO level) of the third organic compound is preferably higher than or equal to −6.0 eV.

The electron mobility of the third organic compound is preferably higher than or equal to $1\times10^{-7}$ $cm^2/Vs$ and lower than or equal to $1\times10^{-5}$ $cm^2/Vs$, further preferably higher than or equal to $1\times10^{-7}$ $cm^2/Vs$ and lower than or equal to $5\times10^{-5}$ $cm^2$ when the square root of electric field strength [V/cm] is 600.

The electron mobility of the third organic compound when the square root of the electric field strength [V/cm] is 600 is preferably lower than the electron mobility of the host material of the light-emitting layer 123 when the square root of the electric field strength [V/cm] is 600. The amount of electrons injected into the light-emitting layer 123 can be controlled by reduction in the electron-transport property of the electron-transport layer 124, whereby the light-emitting layer 123 can be prevented from having excess electrons.

The third organic compound preferably includes an anthracene skeleton, and further preferably includes an anthracene skeleton and a heterocyclic skeleton. The heterocyclic skeleton is preferably a nitrogen-containing five-membered ring skeleton. It is particularly preferable that the nitrogen-containing five-membered ring skeleton include two heteroatoms in a ring, like a pyrazol ring, an imidazole ring, an oxazole ring, or, a thiazole ring.

In addition, some of the above-described electron-transport materials that can be used as the host material, and the above-described substances given as materials that can be used as the host material in combination with the above fluorescent substance can be used for the electron-transport layer 124.

Examples of the third organic compound include 2-{4-[9,10-di(naphthalen-2-yl)-2-anthryl]phenyl}-1-phenyl-1H-benzimidazole (abbreviation: ZADN), 9-(1-naphthyl)-10-[4-(2-naphthyl)phenyl]anthracene (abbreviation: α,N-βNPAnth), 9-[4-(10-phenyl-9-anthracenyl)phenyl]-9H-carbazole (abbreviation: CzPA), and 7-[4-(10-phenyl-9-anthryl)phenyl]-7H-dibenzo[c,g]carbazole (abbreviation: cgDBCzPA).

In addition, as the third organic compound, it is possible to use the electron-transport materials that can be used for the above-described light-emitting layer, the organic compounds (host materials) that can be used in combination with the fluorescent material, or the like.

The first substance is a metal, a metallic salt, a metal oxide, or an organometallic salt.

Examples of the metal include an alkali metal, an alkaline earth metal, and a rare earth metal. Specific examples include Li, Na, K, Rb, Cs, Mg, Ca, Sr, and Ba.

Examples of the metallic salt include halides of the above metals and carbonates of the above metals. Specific examples include LiF, NaF, KF, RbF, CsF, $MgF_2$, $CaF_2$, $SrF_2$, $BaF_2$, LiCl, NaCl, KCl, RbCl, CsCl, $MgCl_2$, $CaCl_2$), $SrCl_2$, $BaCl_2$, $Li_2CO_3$, and $Cs_2CO_3$.

Examples of the metal oxide are oxides of the above metals. Specific examples include $Li_2O$, $Na_2O$, $Cs_2O$, MgO, and CaO.

Examples of the organometallic salt are organometallic complexes.

The first substance is preferably an organometallic complex containing an alkali metal or an alkaline earth metal.

The first substance is preferably an organometallic complex including a ligand containing nitrogen and oxygen, and an alkali metal or an alkaline earth metal.

The first substance is preferably an organometallic complex including a quinolinol ligand, and an alkali metal or an alkaline earth metal.

Examples of the organometallic complex include 8-(quinolinolato)lithium (abbreviation: Liq), 8-(quinolinolato)sodium (abbreviation: Naq), 8-(quinolinolato)potassium (abbreviation: Kq), (8-quinolinolato)magnesium (abbreviation: $Mgq_2$), and (8-quinolinolato)zinc (abbreviation: $Znq_2$).

As the first substance, Liq is particularly preferable.

As illustrated in FIG. 4C, the electron-transport layer 124 may include the electron-transport layer 124*a* on the light-emitting layer 123 side and the electron-transport layer 124*b* on the cathode 102 side. The electron-transport layer 124*a* and the electron-transport layer 124*b* preferably differ in the concentration ratio of the third organic compound to the first substance. For example, the concentration of the first substance is preferably higher in the electron-transport layer 124*a* than in the electron-transport layer 124*b*.

<Electron-Injection Layer>

The electron-injection layer 125 is a layer that increases the injection efficiency of electrons from the cathode 102. The difference between the work function of the material of the cathode 102 and the LUMO level of the material used for the electron-injection layer 125 is preferably small (0.5 eV or less).

The electron-injection layer 125 can be formed using an alkali metal, an alkaline earth metal, or a compound thereof, such as lithium, cesium, lithium fluoride (LiF), cesium fluoride (CsF), calcium fluoride ($CaF_2$), 8-(quinolinolato) lithium (abbreviation: Liq), 2-(2-pyridyl)phenolatolithium (abbreviation: LiPP), 2-(2-pyridyl)-3-pyridinolatolithium (abbreviation: LiPPy), 4-phenyl-2-(2-pyridyl)phenolatolithium (abbreviation: LiPPP), lithium oxide ($LiO_x$), or cesium carbonate. A rare earth metal compound such as erbium fluoride ($ErF_3$) can also be used. In addition, an electride may be used for the electron-injection layer. Examples of the electride include a substance in which electrons are added at high concentration to a mixed oxide of calcium and aluminum. Any of the above-described substances for forming the electron-transport layer can also be used.

For the electron-injection layer, a composite material containing an electron-transport material and a donor material (an electron-donating material) may be used. Such a composite material is excellent in an electron-injection property and an electron-transport property because electrons are generated in the organic compound by the electron donor. The organic compound here is preferably a material excellent in transporting the generated electrons; specifically, for example, the above-described electron-transport materials (e.g., a metal complex or a heteroaromatic compound) can be used. As the electron donor, a substance showing a property of donating electrons to an organic compound is used. Specifically, an alkali metal, an alkaline earth metal, and a rare earth metal are preferable, and lithium, cesium, magnesium, calcium, erbium, ytterbium, and the like are given. In addition, an alkali metal oxide and an alkaline earth metal oxide are preferable, and lithium oxide, calcium oxide, barium oxide, and the like are given. Alternatively, a Lewis base such as magnesium oxide can be used. Further alternatively, an organic compound such as tetrathiafulvalene (abbreviation: TTF) can be used.

For manufacture of the light-emitting device of one embodiment of the present invention, a vacuum process such as an evaporation method or a solution process such as a spin coating method or an ink-jet method can be used. In the case of using an evaporation method, a physical vapor deposition method (PVD method) such as a sputtering method, an ion plating method, an ion beam evaporation method, a molecular beam evaporation method, or a vacuum evaporation method, a chemical vapor deposition method (CVD method), or the like can be used. Specifically, the functional layers (the hole-injection layer, the hole-transport layer, the light-emitting layer, the electron-transport layer, and the electron-injection layer) included in the EL layer can be formed by an evaporation method (e.g., a vacuum evaporation method), a coating method (e.g., a dip coating method, a die coating method, a bar coating method, a spin coating method, or a spray coating method), a printing method (e.g., an ink-jet method, screen printing (stencil), offset printing (planography), flexography (relief printing), gravure printing, or micro-contact printing), or the like.

Materials of the functional layers included in the light-emitting device are not limited to the above-described corresponding materials. For example, as the materials of the functional layers, a high molecular compound (e.g., an oligomer, a dendrimer, and a polymer), a middle molecular compound (a compound between a low molecular compound and a high molecular compound with a molecular weight of 400 to 4000), or an inorganic compound (e.g., a quantum dot material) may be used. As the quantum dot material, a colloidal quantum dot material, an alloyed quantum dot material, a core-shell quantum dot material, a core quantum dot material, or the like can be used.

[Light Emission Model in Light-Emitting Device]

A light emission model of the light-emitting device that can be used for the display device of this embodiment is described.

Here, a light emission model of a light-emitting device is described using the hole-transport layer 122, the light-emitting layer 123, and the electron-transport layer 124 illustrated in FIG. 4A. The light emission model can also be applied to a light-emitting device having a structure other than that in FIG. 4A.

Figure 5A:
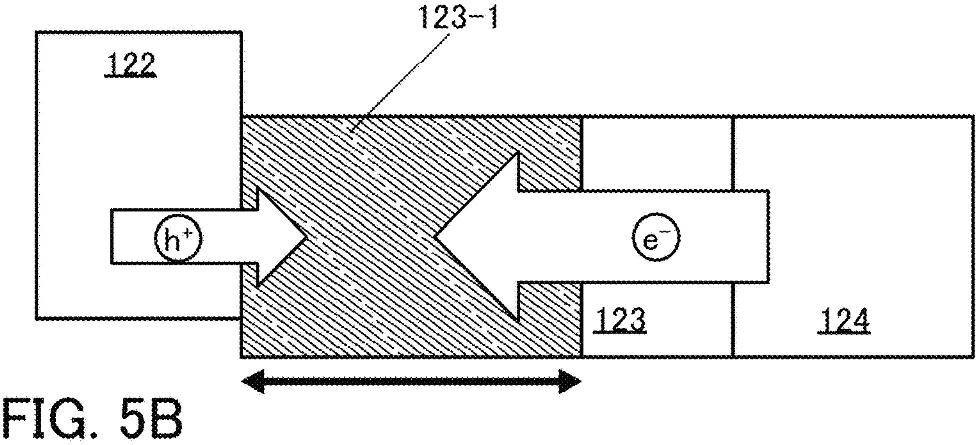
FIG. 5A to FIG. 5C are conceptual diagrams showing a light-emitting model of a light-emitting device.

When the light-emitting layer 123 has excess electrons, a light-emitting region 123-1 is formed in a limited region of the light-emitting layer 123, as illustrated in FIG. 5A. In other words, the width of the light-emitting region 123-1 in the light-emitting layer 123 is small. Therefore, electrons ($e^-$) and holes ($h^+$) are recombined intensively in the limited region of the light-emitting layer 123, which accelerates degradation. In addition, the lifetime or emission efficiency may be reduced when electrons that have not been recombined in the light-emitting layer 123 pass through the light-emitting layer 123.

Figure 5B:
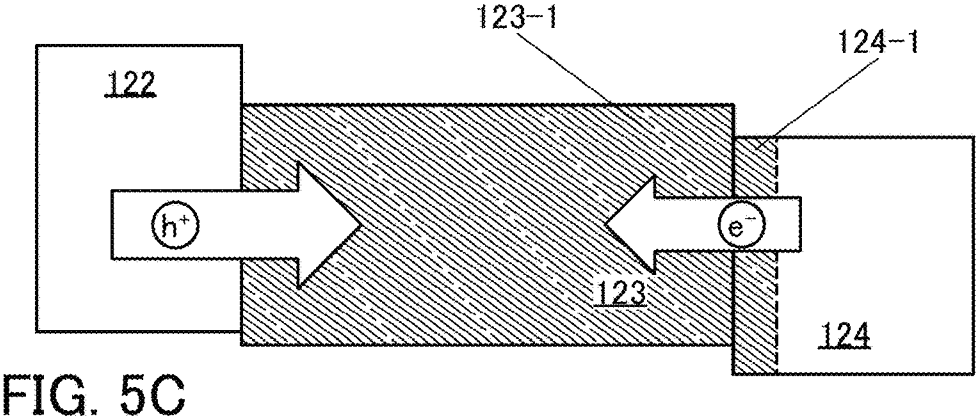
Figure 5C:
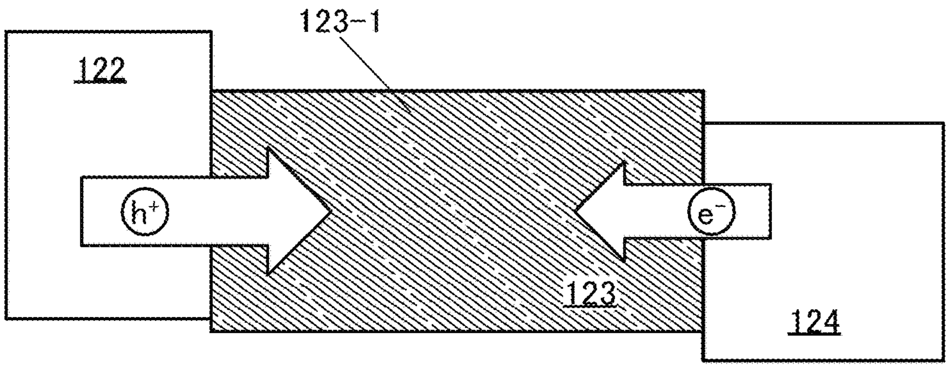

Meanwhile, in the light-emitting device of one embodiment of the present invention, the width of the light-emitting region 123-1 in the light-emitting layer 123 can be increased because of a low electron-transport property of the electron-transport layer 124 (FIG. 5B and FIG. 5C). Increasing the width of the light-emitting region 123-1 enables an electron-hole recombination region in the light-emitting layer 123 to be dispersed. Accordingly, a light-emitting device having a long lifetime and high emission efficiency can be provided.

At the initial driving stage of the light-emitting device of one embodiment of the present invention, a recombination region may extend to the electron-transport layer 124, as illustrated in FIG. 5B. In FIG. 5B, a recombination region in the electron-transport layer 124 is denoted by a region 124-1. Specifically, in the light-emitting device of one embodiment of the present invention, the light-emitting region 123-1 (i.e., the recombination region) may be formed in the entire light-emitting layer 123 and the recombination region may also be formed in the electron-transport layer 124, because a hole injection barrier is small at the initial driving stage and the electron-transport property of the electron-transport layer 124 is relatively low.

Since the HOMO level of the third organic compound contained in the electron-transport layer 124 is higher than or equal to −6.0 eV, which is relatively high, some holes reach the electron-transport layer 124 to cause recombination also in the electron-transport layer 124 in some cases. Note that this phenomenon sometimes occurs when the difference in the HOMO level between the host material (or the assist material) contained in the light-emitting layer 123 and the third organic compound is 0.2 eV or less.

As illustrated in FIG. 5C, the carrier balance changes as the driving time of the light-emitting device of one embodiment of the present invention increases, and thus recombination is less likely to occur in the electron-transport layer 124. The recombination in the electron-transport layer 124 is inhibited while the light-emitting region 123-1 is formed in the entire light-emitting layer 123, whereby the energy of recombined carriers can contribute effectively to light emission. Accordingly, the luminance may increase compared to that at the initial driving stage. This luminance increase cancels out the rapid luminance decrease that appears at the initial driving stage of the light-emitting device, which is known as the initial decay; thus, the light-emitting device can have a long driving lifetime with a small initial decay. Note that in this specification and the like, the structure of the above-described light-emitting device may be referred to as a Recombination-Site Tailoring Injection structure (ReSTI structure).

Figure 5D:
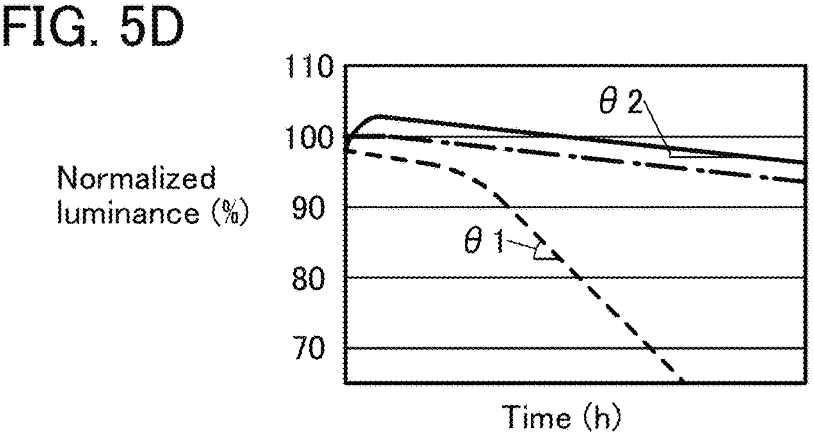
FIG. 5D is a diagram showing a normalized luminance of the light-emitting device over time.

Here, normalized luminance with time of the light-emitting device of this embodiment and a comparative light-emitting device is described with reference to FIG. 5D. In FIG. 5D, a thick solid line and a thick dashed-dotted line are each a decay curve of normalized luminance of the light-emitting device of this embodiment, and a thick dashed line is a decay curve of normalized luminance of the comparative light-emitting device.

As shown in FIG. 5D, the slope of the decay curve of normalized luminance is different between the light-emitting device of this embodiment and the comparative light-emitting device. Specifically, a slope θ2 of the decay curve of the light-emitting device of this embodiment is smaller than a slope θ1 of the decay curve of the comparative light-emitting device.

As shown in FIG. 5D, the light-emitting device of one embodiment of the present invention may have a local maximum value in the decay curve of luminance (the thick solid line) obtained in a driving test under a condition with a fixed current density. In other words, the light-emitting device of one embodiment of the present invention may show a behavior of luminance increase with time. This behavior can cancel out rapid degradation at the initial driving stage (i.e., initial decay). Note that the light-emitting device of one embodiment of the present invention is not limited to the above; for example, as indicated by the thick dashed-dotted line in FIG. 5D, the luminance does not have a local maximum value, that is, the slope of the decay curve can be smaller without the luminance increase. Thus, when a light-emitting device has the structure showing the behavior, the light-emitting device can have a small initial decay and an extremely long driving lifetime.

A differential value of such a decay curve having a local maximum value is 0 in a part. Therefore, a light-emitting device having a decay curve whose differential value is 0 in a part can be referred to as a light-emitting device of one embodiment of the present invention.

In the light-emitting device of one embodiment of the present invention, the electron-transport layer 124 preferably includes a portion where the mixture ratio (concentrations) of the third organic compound and the first substance varies in the thickness direction. Specifically, the electron-transport layer 124 preferably includes a portion where the mixture ratio (concentrations) of the electron-transport material and a metal, a metallic salt, a metal oxide, or an organometallic salt varies.

The concentration of the first substance in the electron-transport layer 124 can be estimated from the amount of atoms and molecules detected by time-of-flight secondary ion mass spectrometry (ToF-SIMS). In portions that contain the same two kinds of materials with different mixture ratios, values measured by ToF-SIMS analysis correspond to the amounts of target atoms or molecules. Therefore, comparing the detected amounts of the electron-transport material and the organometallic complex allows estimation of their mixture ratio.

The content of the first substance in the electron-transport layer 124 is preferably smaller on the cathode 102 side than on the anode 101 side. In other words, the electron-transport layer 124 is preferably formed such that the concentration of the first substance increases from the cathode 102 side to the anode 101 side. That is, the electron-transport layer 124 includes a portion with a low concentration of the third organic compound on a side closer to the light-emitting layer 123 than a portion with a high concentration of the third organic compound is. In other words, the electron-transport layer 124 includes a portion with a high concentration of the first substance on a side closer to the light-emitting layer 123 than a portion with a low concentration of the first substance is.

In the electron-transport layer 124, the electron mobility of the portion with a high concentration of the third organic compound (the portion with a low concentration of the first substance) is preferably higher than or equal to $1\times10^{-7}$ $cm^2/Vs$ and lower than or equal to $5\times10^{-5}$ $cm^2/Vs$ when the square root of the electric field strength [V/cm] is 600.

Figure 6A:
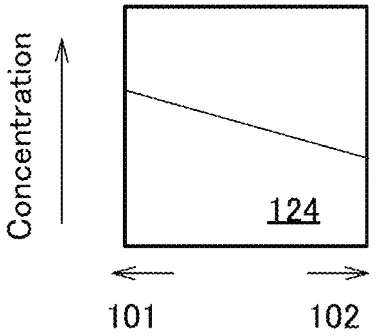
FIG. 6A to FIG. 6D are diagrams each showing the concentration of a first substance in an electron-transport layer.
Figure 6B:
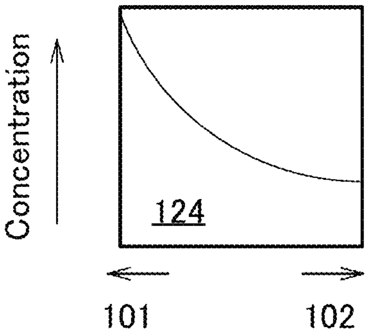
Figure 6C:
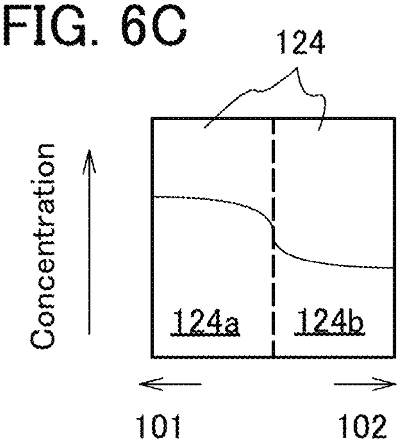
Figure 6D:
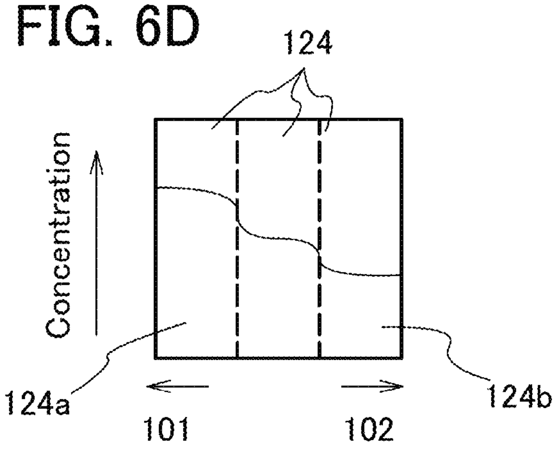

For example, the content (concentration) of the first substance in the electron-transport layer 124 can be as shown in each of FIG. 6A to FIG. 6D. Note that FIG. 6A and FIG. 6B show the case where no clear boundary exists in the electron-transport layer 124, and FIG. 6C and FIG. 6D show the case where a clear boundary exists in the electron-transport layer 124.

In the case where no clear boundary exists in the electron-transport layer 124, the concentrations of the third organic compound and the first substance change continuously as shown in FIG. 6A and FIG. 6B. Meanwhile, in the case where a clear boundary exists in the electron-transport layer 124, the concentrations of the third organic compound and the first substance change in a step-like manner as shown in FIG. 6C and FIG. 6D. The case where the concentrations of the third organic compound and the first substance change in a step-like manner suggests that the electron-transport layer 124 is formed of a plurality of layers. For example, FIG. 6C shows the case where the electron-transport layer 124 has a stacked-layer structure of two layers, and FIG. 6D shows the case where the electron-transport layer 124 has a stacked-layer structure of three layers. Note that in FIG. 6C and FIG. 6D, a dashed line indicates a boundary region between layers.

A change in carrier balance in the light-emitting device of one embodiment of the present invention is probably caused by a change in electron mobility of the electron-transport layer 124.

In the light-emitting device of one embodiment of the present invention, there is a concentration difference of the first substance in the electron-transport layer 124. The electron-transport layer 124 includes a region with a high concentration of the first substance between a region with a low concentration of the first substance and the light-emitting layer 123. That is, the region with a low concentration of the first substance is positioned closer to the cathode 102 than the region with a high concentration is.

The light-emitting device of one embodiment of the present invention having the above structure has an extremely long lifetime. In particular, the time taken for the luminance to decrease to 95% with the initial luminance being 100% (the time can also be referred to as LT95) can be extremely long.

A more detailed structure of the display device of one embodiment of the present invention is described below with reference to FIG. 7 to FIG. 9.

[Display Device 100A]

Figure 7:
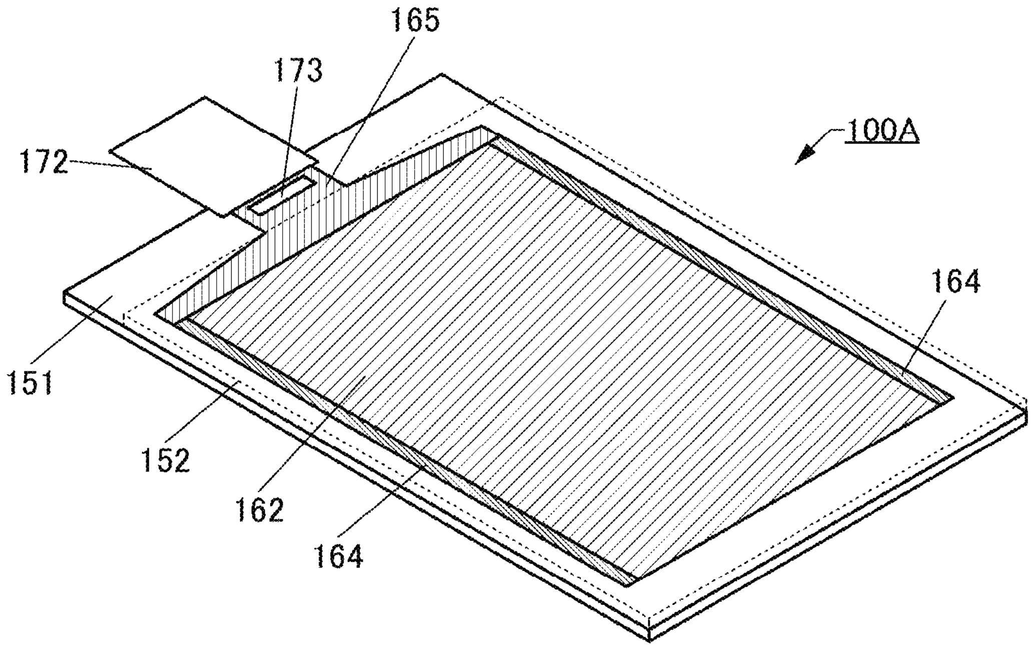
FIG. 7 is a perspective view illustrating an example of a display device.

FIG. 7 shows a perspective view of a display device 100A, and FIG. 8A shows a cross-sectional view of the display device 100A.

The display device 100A has a structure in which the substrate 152 and the substrate 151 are bonded to each other. In FIG. 7, the substrate 152 is denoted by a dashed line.

The display device 100A includes a display portion 162, a circuit 164, a wiring 165, and the like. FIG. 7 illustrates an example in which the display device 100A is provided with an IC (integrated circuit) 173 and an FPC 172. Thus, the structure illustrated in FIG. 7 can be regarded as a display module including the display device 100A, the IC, and the FPC.

As the circuit 164, a scan line driver circuit can be used, for example.

The wiring 165 has a function of supplying a signal and power to the display portion 162 and the circuit 164. The signal and the power are input to the wiring 165 from the outside through the FPC 172 or from the IC 173.

FIG. 7 illustrates an example in which the IC 173 is provided over the substrate 151 by a COG (Chip On Glass) method, a COF (Chip on Film) method, or the like. An IC including a scan line driver circuit, a signal line driver circuit, or the like can be used as the IC 173, for example. Note that the display device 100A and the display module may have a structure in which an IC is not provided. The IC may be mounted on the FPC by a COF method or the like.

FIG. 8A illustrates an example of a cross section including part of a region including the FPC 172, part of the circuit 164, part of the display portion 162, and part of a region including an end portion in the display device 100A.

The display device 100A illustrated in FIG. 8A includes a transistor 201, transistors 205, the light-emitting device 190R, the light-emitting device 190G, the light-emitting device 190B, and the like between the substrate 151 and the substrate 152.

The protective layer 195 and the substrate 152 are bonded to each other with the adhesive layer 142. A solid sealing structure, a hollow sealing structure, or the like can be employed to seal the light-emitting device 190. In FIG. 8A, a hollow sealing structure is employed in which a space 143 surrounded by the substrate 152, the adhesive layer 142, and the substrate 151 is filled with an inert gas (e.g., nitrogen or argon). The adhesive layer 142 may be provided to overlap the light-emitting device 190. The space 143 surrounded by the substrate 152, the adhesive layer 142, and the substrate 151 may be filled with a resin different from that of the adhesive layer 142.

The light-emitting device 190R has a stacked-layer structure in which the pixel electrode 191, the optical adjustment layer 199R, the common layer 112, the light-emitting layer 193R, the common layer 114, and the common electrode 115 are stacked in this order from the insulating layer 214 side. Similarly, the light-emitting device 190G has a stacked-layer structure in which the pixel electrode 191, the optical adjustment layer 199G, the common layer 112, the light-emitting layer 193G, the common layer 114, and the common electrode 115 are stacked in this order from the insulating layer 214 side. Furthermore, the light-emitting device 190B has a stacked-layer structure in which the pixel electrode 191, the optical adjustment layer 199B, the common layer 112, the light-emitting layer 193B, the common layer 114, and the common electrode 115 are stacked in this order from the insulating layer 214 side.

The pixel electrode 191 is connected to a conductive layer 222*b* included in the transistor 205 through an opening provided in the insulating layer 214.

The end portion of the pixel electrode 191 is covered with the bank 216. The pixel electrode 191 contains a material that reflects visible light, and the common electrode 115 contains a material that transmits visible light.

Light emitted from the light-emitting device 190 is emitted to the substrate 152 side. For the substrate 152, a material having a high visible-light-transmitting property is preferably used.

The transistor 201 and the transistors 205 are formed over the substrate 151. These transistors can be formed using the same materials in the same steps.

An insulating layer 211, an insulating layer 213, an insulating layer 215, and the insulating layer 214 are provided in this order over the substrate 151. Parts of the insulating layer 211 function as gate insulating layers of the transistors. Parts of the insulating layer 213 function as gate insulating layers of the transistors. The insulating layer 215 is provided to cover the transistors. The insulating layer 214 is provided to cover the transistors and has a function of a planarization layer. Note that there is no limitation on the number of gate insulating layers and the number of insulating layers covering the transistors, and each insulating layer may have either a single layer or two or more layers.

A material into which impurities such as water and hydrogen do not easily diffuse is preferably used for at least one of the insulating layers that cover the transistors. This allows the insulating layer to serve as a barrier layer. Such a structure can effectively inhibit diffusion of impurities into the transistors from the outside and increase the reliability of the display device.

An inorganic insulating film is preferably used as each of the insulating layer 211, the insulating layer 213, and the insulating layer 215. As the inorganic insulating film, for example, a silicon nitride film, a silicon oxynitride film, a silicon oxide film, a silicon nitride oxide film, an aluminum oxide film, an aluminum nitride film, or the like can be used. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may also be used. A stack including two or more of the above insulating films may also be used.

Here, an organic insulating film often has a lower barrier property than an inorganic insulating film. Therefore, the organic insulating film preferably has an opening in the vicinity of an end portion of the display device 100A. This can inhibit entry of impurities from the end portion of the display device 100A through the organic insulating film. Alternatively, the organic insulating film may be formed so that an end portion of the organic insulating film is positioned on the inner side compared to the end portion of the display device 100A, to prevent the organic insulating film from being exposed at the end portion of the display device 100A.

An organic insulating film is suitable for the insulating layer 214 functioning as a planarization layer. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins.

In a region 228 illustrated in FIG. 8A, an opening is formed in the insulating layer 214. This can inhibit entry of impurities into the display portion 162 from the outside through the insulating layer 214 even when an organic insulating film is used as the insulating layer 214. Thus, the reliability of the display device 100A can be increased.

Each of the transistor 201 and the transistors 205 includes a conductive layer 221 functioning as a gate, the insulating layer 211 functioning as the gate insulating layer, a conductive layer 222*a* and the conductive layer 222*b* functioning as a source and a drain, a semiconductor layer 231, the insulating layer 213 functioning as the gate insulating layer, and a conductive layer 223 functioning as a gate. Here, a plurality of layers obtained by processing the same conductive film are shown with the same hatching pattern. The insulating layer 211 is positioned between the conductive layer 221 and the semiconductor layer 231. The insulating layer 213 is positioned between the conductive layer 223 and the semiconductor layer 231.

There is no particular limitation on the structure of the transistor included in the light-emitting device of this embodiment. For example, a planar transistor, a staggered transistor, or an inverted staggered transistor can be used. A top-gate or a bottom-gate transistor structure may be employed. Alternatively, gates may be provided above and below a semiconductor layer where a channel is formed.

The structure in which the semiconductor layer where a channel is formed is provided between two gates is used for the transistor 201 and the transistors 205. The two gates may be connected to each other and supplied with the same signal to drive the transistor. Alternatively, a potential for controlling the threshold voltage may be supplied to one of the two gates and a potential for driving may be supplied to the other to control the threshold voltage of the transistor.

There is no particular limitation on the crystallinity of a semiconductor material used for the transistors, and an amorphous semiconductor or a semiconductor having crystallinity (a microcrystalline semiconductor, a polycrystalline semiconductor, a single-crystal semiconductor, or a semiconductor partly including crystal regions) may be used. A semiconductor having crystallinity is preferably used, in which case deterioration of the transistor characteristics can be inhibited.

A semiconductor layer of a transistor preferably includes a metal oxide (also referred to as an oxide semiconductor). That is, a transistor including a metal oxide in its channel formation region (hereinafter, also referred to as an OS transistor) is preferably used for the display device of this embodiment. Alternatively, the semiconductor layer of the transistor may contain silicon. Examples of silicon include amorphous silicon and crystalline silicon (e.g., low-temperature polysilicon or single crystal silicon).

The semiconductor layer preferably contains indium, M (M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, M is preferably one or more kinds selected from aluminum, gallium, yttrium, and tin.

It is particularly preferable to use an oxide containing indium (In), gallium (Ga), and zinc (Zn) (also referred to as IGZO) for the semiconductor layer.

In the case where the semiconductor layer is an In-M-Zn oxide, the atomic proportion of In is preferably greater than or equal to the atomic proportion of M in the In-M-Zn oxide. Examples of the atomic ratio of the metal elements in such an In-M-Zn oxide include In:M:Zn=1:1:1 or a composition in the neighborhood thereof, In:M:Zn=1:1:1.2 or a composition in the neighborhood thereof, In:M:Zn=2:1:3 or a composition in the neighborhood thereof, In:M:Zn=3:1:2 or a composition in the neighborhood thereof, In:M:Zn=4:2:3 or a composition in the neighborhood thereof, In:M:Zn=4:

2:4.1 or a composition in the neighborhood thereof, In:M:Zn=5:1:3 or a composition in the neighborhood thereof, In:M:Zn=5:1:6 or a composition in the neighborhood thereof, In:M:Zn=5:1:7 or a composition in the neighborhood thereof, In:M:Zn=5:1:8 or a composition in the neighborhood thereof, In:M:Zn=6:1:6 or a composition in the neighborhood thereof, and In:M:Zn=5:2:5 or a composition in the neighborhood thereof. Note that a composition in the neighborhood includes the range of ±30% of an intended atomic ratio.

For example, in the case where the atomic ratio is described as In:Ga:Zn=4:2:3 or a composition in the neighborhood thereof, the case is included where the atomic proportion of Ga is greater than or equal to 1 and less than or equal to 3 and the atomic proportion of Zn is greater than or equal to 2 and less than or equal to 4 with the atomic proportion of In being 4. In the case where the atomic ratio is described as In:Ga:Zn=5:1:6 or a composition in the neighborhood thereof, the case is included where the atomic proportion of Ga is greater than 0.1 and less than or equal to 2 and the atomic proportion of Zn is greater than or equal to 5 and less than or equal to 7 with the atomic proportion of In being 5. In the case where the atomic proportion is described as In:Ga:Zn=1:1:1 or a composition in the neighborhood thereof, the case is included where the atomic proportion of Ga is greater than 0.1 and less than or equal to 2 and the atomic proportion of Zn is greater than 0.1 and less than or equal to 2 with the atomic proportion of In being 1.

The transistor included in the circuit 164 and the transistor included in the display portion 162 may have the same structure or different structures. A plurality of transistors included in the circuit 164 may have the same structure or two or more kinds of structures. Similarly, a plurality of transistors included in the display portion 162 may have the same structure or two or more kinds of structures.

A connection portion 204 is provided in a region of the substrate 151 which does not overlap the substrate 152. In the connection portion 204, the wiring 165 is electrically connected to the FPC 172 through a conductive layer 166 and a connection layer 242. An example is illustrated in which the conductive layer 166 has a stacked-layer structure of a conductive film obtained by processing the same conductive film as the pixel electrode 191 and a conductive film obtained by processing the same conductive film as the optical adjustment layer. On a top surface of the connection portion 204, the conductive layer 166 is exposed. Thus, the connection portion 204 and the FPC 172 can be electrically connected to each other through the connection layer 242.

The light-blocking layer BM is preferably provided on a surface of the substrate 152 on the substrate 151 side. Any of a variety of optical members can be arranged on the outer side of the substrate 152. Examples of the optical members include a polarizing plate, a retardation plate, a light diffusion layer (a diffusion film or the like), an anti-reflective layer, and a light-condensing film. Furthermore, an antistatic film inhibiting the attachment of dust, a water repellent film suppressing the attachment of stain, a hard coat film inhibiting generation of a scratch caused by the use, a shock absorbing layer, or the like may be provided on the outer side of the substrate 152.

With the protective layer 195 that covers the light-emitting device 190, entry of impurities such as water into the light-emitting device 190 can be inhibited, leading to an increase in the reliability of the light-emitting device 190.

In the region 228 in the vicinity of the end portion of the display device 100A, the insulating layer 215 and the protective layer 195 are preferably in contact with each other through the opening in the insulating layer 214. In particular, the inorganic insulating film included in the insulating layer 215 and the inorganic insulating film included in the protective layer 195 are preferably in contact with each other. Thus, entry of impurities from the outside into the display portion 162 through the organic insulating film can be inhibited. Thus, the reliability of the display device 100A can be increased.

FIG. 8B illustrates an example in which the protective layer 195 has a three-layer structure. In FIG. 8B, the protective layer 195 includes an inorganic insulating layer **195*a* over the common electrode 115, an organic insulating layer 195*b* over the inorganic insulating layer 195*a*, and an inorganic insulating layer 195*c* over the organic insulating layer 195*b***.

An end portion of the inorganic insulating layer **195*a* and an end portion of the inorganic insulating layer 195*c* extend beyond an end portion of the organic insulating layer 195*b* and are in contact with each other. The inorganic insulating layer 195*a* is in contact with the insulating layer 215 (inorganic insulating layer) through the opening in the insulating layer 214 (organic insulating layer). Accordingly, the insulating layer 215 and the protective layer 195 can surround the light-emitting device 190, whereby the reliability of the light-emitting device 190** can be increased.

As described above, the protective layer 195 may have a stacked-layer structure of an organic insulating film and an inorganic insulating film. In that case, an end portion of the inorganic insulating film preferably extends beyond an end portion of the organic insulating film.

For each of the substrate 151 and the substrate 152, glass, quartz, ceramic, sapphire, resin, or the like can be used. When a flexible material is used for the substrate 151 and the substrate 152, the flexibility of the display device can be increased.

For the adhesive layer, a variety of curable adhesives, e.g., a photocurable adhesive such as an ultraviolet curable adhesive, a reactive curable adhesive, a thermosetting adhesive, and an anaerobic adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferred. Alternatively, a two-component resin may be used. An adhesive sheet or the like may be used.

As the connection layer 242, an anisotropic conductive film (ACF), an anisotropic conductive paste (ACP), or the like can be used.

The light-emitting device 190 may be of a top emission type, a bottom emission type, a dual emission type, or the like. A conductive film that transmits visible light is used as the electrode through which light is extracted. A conductive film that reflects visible light is preferably used as the electrode through which light is not extracted.

The light-emitting device 190 includes at least the light-emitting layer 193. The light-emitting device 190 may further include, as a layer other than the light-emitting layer 193, a layer containing a substance with a high hole-injection property, a substance with a high hole-transport property, a hole-blocking material, a substance with a high electron-transport property, a substance with a high electron-injection property, a substance with a bipolar property (a substance with a high electron- and hole-transport property), or the like. For example, the common layer 112 preferably includes one or both of a hole-injection layer and a hole-transport layer. For example, the common layer 114 preferably includes one or both of an electron-transport layer and an electron-injection layer.

The preferred structure of the light-emitting device 190 is as described above (FIG. 4 to FIG. 6).

The common layer 112, the light-emitting layer 193, and the common layer 114 may use either a low molecular compound or a high molecular compound and may also contain an inorganic compound. The layers that constitute the common layer 112, the light-emitting layer 193, and the common layer 114 can each be formed by a method such as an evaporation method (including a vacuum evaporation method), a transfer method, a printing method, an inkjet method, or a coating method.

The light-emitting layer 193 is a layer containing a light-emitting substance. The light-emitting layer 193 can contain one or more kinds of light-emitting substances. As the light-emitting substance, a substance that exhibits an emission color of blue, purple, bluish purple, green, yellowish green, yellow, orange, red, or the like is appropriately used.

As materials that can be used for a gate, a source, and a drain of a transistor and conductive layers such as a variety of wirings and electrodes included in a display device, metals such as aluminum, titanium, chromium, nickel, copper, yttrium, zirconium, molybdenum, silver, tantalum, or tungsten, an alloy containing any of these metals as its main component, and the like can be given. A film containing any of these materials can be used in a single layer or as a stacked-layer structure.

As a light-transmitting conductive material, a conductive oxide such as indium oxide, indium tin oxide, indium zinc oxide, zinc oxide, or zinc oxide containing gallium, or graphene can be used. Alternatively, a metal material such as gold, silver, platinum, magnesium, nickel, tungsten, chromium, molybdenum, iron, cobalt, copper, palladium, or titanium, or an alloy material containing the metal material can be used. Further alternatively, a nitride of the metal material (e.g., titanium nitride) or the like may be used. Note that in the case of using the metal material or the alloy material (or the nitride thereof), the thickness is preferably set small enough to be able to transmit light. A stacked-layer film of any of the above materials can be used as a conductive layer. For example, a stacked-layer film of indium tin oxide and an alloy of silver and magnesium, or the like is preferably used for increased conductivity. These materials can also be used for conductive layers such as a variety of wirings and electrodes included in the display device, and conductive layers (conductive layers functioning as a pixel electrode or a common electrode) included in the light-emitting device.

As an insulating material that can be used for each insulating layer, for example, a resin such as an acrylic resin or an epoxy resin, and an inorganic insulating material such as silicon oxide, silicon oxynitride, silicon nitride oxide, silicon nitride, or aluminum oxide can be given.

[Display Device 100B]

Figure 9A:
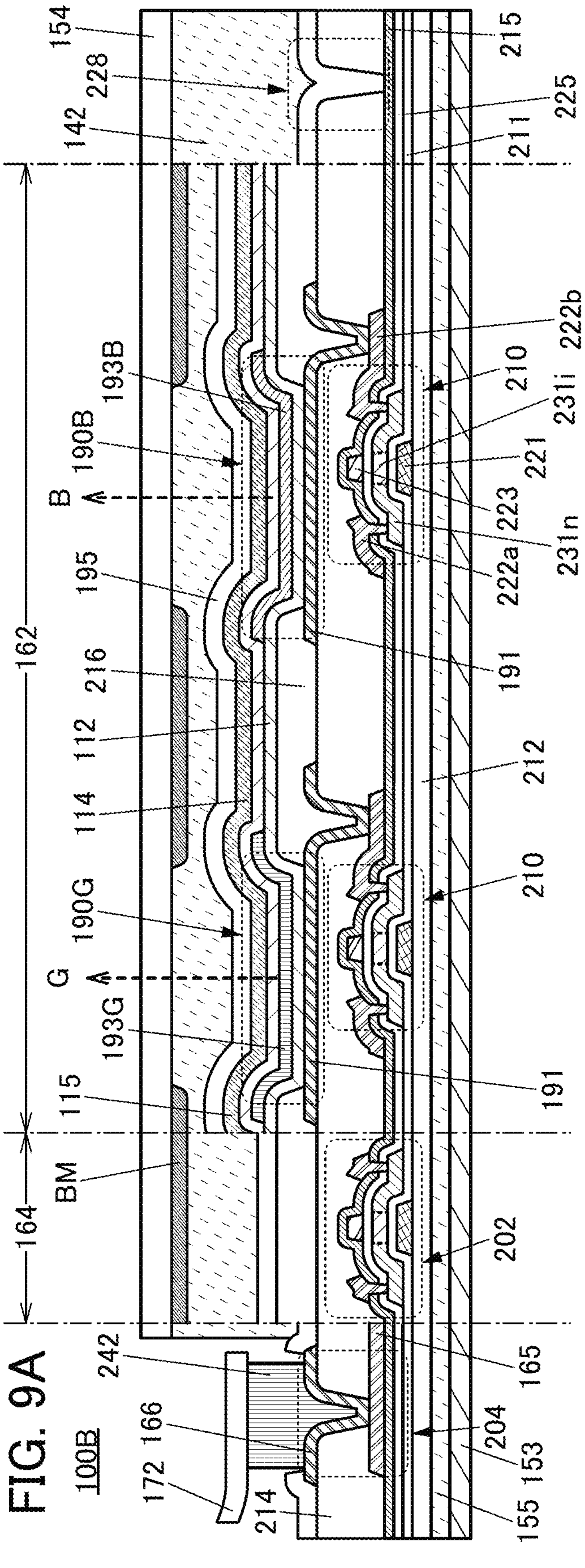
FIG. 9A is a cross-sectional view illustrating an example of a display device.

FIG. 9A shows a cross-sectional view of a display device 100B. A perspective view of the display device 100B is similar to that of the display device 100A (FIG. 7). FIG. 9A illustrates an example of a cross section including part of a region including the FPC 172, part of the circuit 164, and part of the display portion 162 in the display device 100B. FIG. 9A specifically illustrates an example of a cross section of a region including the light-emitting device 190G that emits green light and the light-emitting device 190B that emits blue light in the display portion 162.

The display device 100B illustrated in FIG. 9A includes a transistor 202, transistors 210, the light-emitting device 190G, the light-emitting device 190B, and the like between the substrate 153 and the substrate 154.

The substrate 154 and the protective layer 195 are bonded to each other with the adhesive layer 142. The adhesive layer 142 is provided to overlap the light-emitting device 190G and the light-emitting device 190B; that is, the display device 100B employs a solid sealing structure.

The substrate 153 and the insulating layer 212 are bonded to each other with the adhesive layer 155.

In a method for manufacturing the display device 100B, first, a formation substrate provided with the insulating layer 212, the transistors, the light-emitting devices, and the like is bonded to the substrate 154 provided with the light-blocking layer BM with the adhesive layer 142. Then, the substrate 153 is attached to a surface exposed by separation of the formation substrate, whereby the components formed over the formation substrate are transferred onto the substrate 153. The substrate 153 and the substrate 154 preferably have flexibility. Accordingly, the flexibility of the display device 100B can be increased.

The inorganic insulating film that can be used as the insulating layer 211, the insulating layer 213, and the insulating layer 215 can be used as the insulating layer 212.

The light-emitting device 190G has a stacked-layer structure in which the pixel electrode 191, the common layer 112, the light-emitting layer 193G, the common layer 114, and the common electrode 115 are stacked in this order from the insulating layer 214 side. Similarly, the light-emitting device 190B has a stacked-layer structure in which the pixel electrode 191, the common layer 112, the light-emitting layer 193B, the common layer 114, and the common electrode 115 are stacked in this order from the insulating layer 214 side.

The pixel electrode 191 is connected to the conductive layer 222*b* included in the transistor 210 through an opening provided in the insulating layer 214. The conductive layer 222*b* is connected to a low-resistance region 231*n* through an opening provided in the insulating layer 215 and an insulating layer 225. The transistor 210 has a function of controlling driving of the light-emitting device 190.

The end portion of the pixel electrode 191 is covered with the bank 216. The pixel electrode 191 contains a material that reflects visible light, and the common electrode 115 contains a material that transmits visible light.

Light emitted from the light-emitting device 190G and the light-emitting device 190B is emitted to the substrate 154 side. For the substrate 154, a material having a high visible-light-transmitting property is preferably used.

The pixel electrodes 191 included in the light-emitting devices can be formed using the same material in the same step. The common layer 112, the common layer 114, and the common electrode 115 are used in common by the light-emitting device 190G and the light-emitting device 190B. The light-emitting devices of the respective colors can have a common structure except the structure of the light-emitting layer 193.

The connection portion 204 is provided in a region of the substrate 153 which does not overlap the substrate 154. In the connection portion 204, the wiring 165 is electrically connected to the FPC 172 through the conductive layer 166 and the connection layer 242. The conductive layer 166 can be obtained by processing the same conductive film as the pixel electrode 191. Thus, the connection portion 204 and the FPC 172 can be electrically connected to each other through the connection layer 242.

Each of the transistor 202 and the transistors 210 includes the conductive layer 221 functioning as a gate, the insulating layer 211 functioning as a gate insulating layer, a semiconductor layer including a channel formation region 231*i* and a pair of low-resistance regions 231*n*, the conductive layer 222*a* connected to one of the pair of low-resistance regions 231*n*, the conductive layer 222*b* connected to the other of the pair of low-resistance regions 231*n*, the insulating layer 225 functioning as a gate insulating layer, the conductive layer 223 functioning as a gate, and the insulating layer 215 covering the conductive layer 223. The insulating layer 211 is positioned between the conductive layer 221 and the channel formation region 231*i*. The insulating layer 225 is positioned between the conductive layer 223 and the channel formation region 231*i*.

The conductive layer 222*a* and the conductive layer 222*b* are connected to the corresponding low-resistance regions 231*n* through openings provided in the insulating layer 215. One of the conductive layer 222*a* and the conductive layer 222*b* serves as a source, and the other serves as a drain.

FIG. 9A illustrates an example in which the insulating layer 225 covers a top and side surfaces of the semiconductor layer. The conductive layer 222*a* and the conductive layer 222*b* are connected to the corresponding low-resistance regions 231*n* through openings provided in the insulating layer 225 and the insulating layer 215.

Figure 9B:
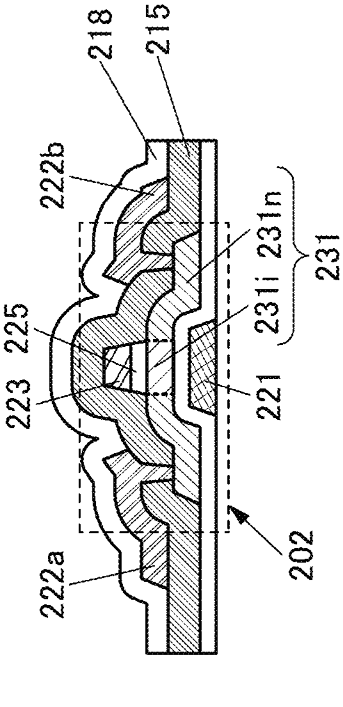
FIG. 9B is a cross-sectional view illustrating an example of a transistor.

Meanwhile, in FIG. 9B, the insulating layer 225 overlaps the channel formation region 231*i* of the semiconductor layer 231 and does not overlap the low-resistance regions 231*n*. The structure illustrated in FIG. 9B can be manufactured by processing the insulating layer 225 using the conductive layer 223 as a mask, for example. In FIG. 9B, the insulating layer 215 is provided to cover the insulating layer 225 and the conductive layer 223, and the conductive layer 222*a* and the conductive layer 222*b* are connected to the corresponding low-resistance regions 231*n* through the openings in the insulating layer 215. Furthermore, an insulating layer 218 covering the transistor may be provided.

As described above, a light-emitting device with little initial decay and an extremely long driving lifetime is used, whereby the reliability of a light-emitting apparatus can be increased.

This embodiment can be combined with the other embodiments as appropriate. In this specification, in the case where a plurality of structure examples are shown in one embodiment, the structure examples can be combined as appropriate.

Embodiment 2

In this embodiment, a display device of one embodiment of the present invention is described with reference to FIG. 10.

Figure 10A:
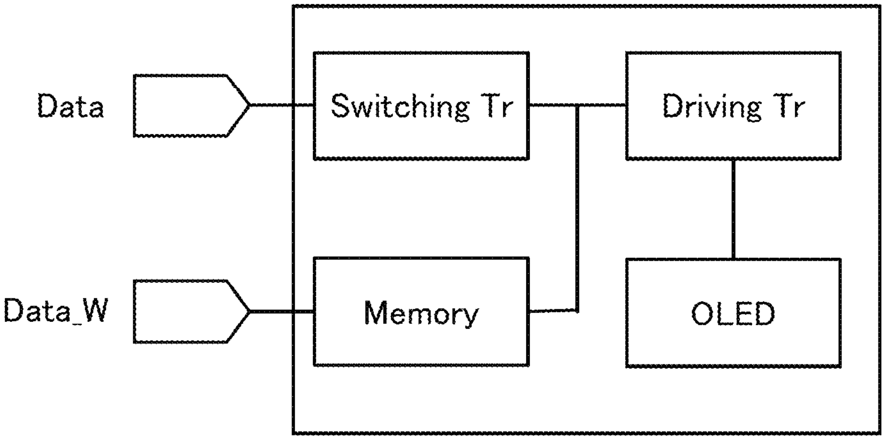
FIG. 10A is a block diagram illustrating an example of a pixel.

FIG. 10A is a block diagram of a pixel. The pixel illustrated in FIG. 10A includes a memory (Memory) in addition to a switching transistor (Switching Tr), a driving transistor (Driving Tr), and a light-emitting device (OLED).

Data Data_W is supplied to the memory. When the data Data_W is supplied to the pixel in addition to display data Data, a current flowing through the light-emitting device is large, so that the display device can have high luminance.

The light-emitting device included in the display device of one embodiment of the present invention is driven on the basis of the display data Data and the data Data_W, whereby the light-emitting device can emit light with high luminance.

Figure 10B:
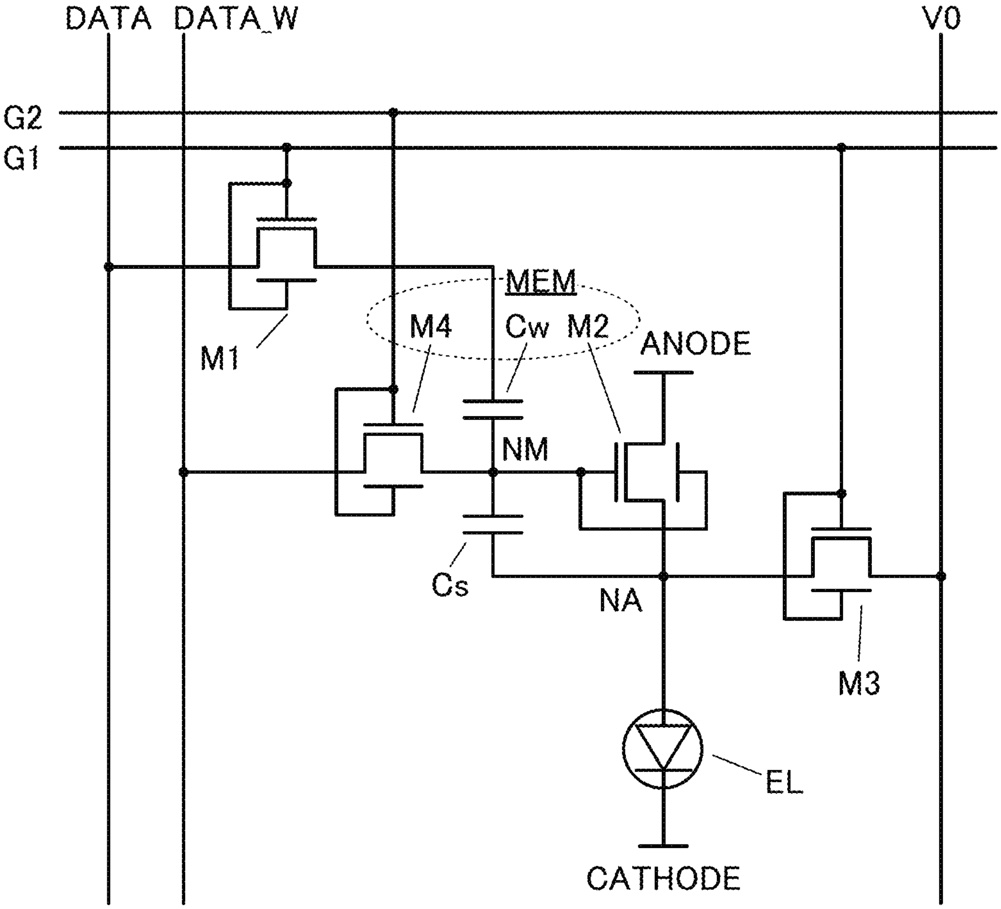
FIG. 10B is a circuit diagram illustrating an example of a pixel circuit.

FIG. 10B is a specific circuit diagram of the pixel circuit.

The pixel illustrated in FIG. 10B includes a transistor M1, a transistor M2, a transistor M3, a transistor M4, a capacitor Cs, a capacitor Cw, and a light-emitting device EL.

One of a source and a drain of the transistor M1 is electrically connected to one electrode of the capacitor Cw. The other electrode of the capacitor Cw is electrically connected to one of a source and a drain of the transistor M4. The one of the source and the drain of the transistor M4 is electrically connected to a gate of the transistor M2. The gate of the transistor M2 is electrically connected to one electrode of the capacitor Cs. The other electrode of the capacitor Cs is electrically connected to one of a source and a drain of the transistor M2. The one of the source and the drain of the transistor M2 is electrically connected to one of a source and a drain of the transistor M3. The one of the source and the drain of the transistor M3 is electrically connected to one electrode of the light-emitting device EL. The transistors illustrated in FIG. 10B each include a back gate electrically connected to its gate; however, the connection of the back gate is not limited thereto. The transistor does not necessarily include the back gate.

Here, a node to which the other electrode of the capacitor Cw, the one of the source and the drain of the transistor M4, the gate of the transistor M2, and the one electrode of the capacitor Cs are connected is referred to as a node NM. Moreover, a node to which the other electrode of the capacitor Cs, the one of the source and the drain of the transistor M2, the one of the source and the drain of the transistor M3, and the one electrode of the light-emitting device EL are connected is referred to as a node NA.

A gate of the transistor M1 is electrically connected to a wiring G1. A gate of the transistor M3 is electrically connected to the wiring G1. A gate of the transistor M4 is electrically connected to a wiring G2. The other of the source and the drain of the transistor M1 is electrically connected to a wiring DATA. The other of the source and the drain of the transistor M3 is electrically connected to a wiring V0. The other of the source and the drain of the transistor M4 is electrically connected to a wiring DATA_W.

The other of the source and the drain of the transistor M2 is electrically connected to a wiring ANODE (the high potential side). The other electrode of the light-emitting device EL is electrically connected to a wiring CATHODE (the low potential side).

The wiring G1 and the wiring G2 can have a function of signal lines for controlling the operation of the transistors. The wiring DATA can have a function of a signal line for supplying an image signal to the pixel. The wiring DATA_W can have a function of a signal line for writing data to a memory circuit MEM. The wiring DATA_W can have a function of a signal line for supplying a correction signal to the pixel. The wiring V0 has a function of a monitor line for obtaining the electrical characteristics of the transistor M4. A specific potential is supplied from the wiring V0 to the other electrode of the capacitor Cs through the transistor M3, whereby writing of an image signal can be stable.

The memory circuit MEM is formed of the transistor M2, the transistor M4, and the capacitor Cw. The node NM is a storage node; when the transistor M4 is turned on, a signal supplied to the wiring DATA_W can be written to the node NM. The use of a transistor with an extremely low off-state current as the transistor M4 allows the potential of the node NM to be retained for a long time.

As the transistor M4, a transistor containing a metal oxide in its channel formation region (OS transistor) can be used, for example. Thus, the off-state current of the transistor M4 can be extremely low, and the potential of the node NM can be retained for a long time. In this case, OS transistors are preferably used as the other transistors included in the pixel. For the specific example of the metal oxide, Embodiment 1 can be referred to.

An OS transistor has a large energy gap and thus has an extremely low off-state current. Unlike in a transistor in which Si is contained in the channel formation region (hereinafter, Si transistor), impact ionization, avalanche breakdown, short-channel effects, and the like do not occur in an OS transistor; accordingly, a highly reliable circuit can be configured.

Furthermore, a Si transistor may be used as the transistor M4. In this case, Si transistors are preferably used as the other transistors included in the pixel.

Examples of the Si transistor include a transistor containing amorphous silicon, a transistor containing crystalline silicon (typically, low-temperature polysilicon), and a transistor containing single crystal silicon.

One pixel may include both an OS transistor and a Si transistor.

In the pixel, the signal written to the node NM is capacitively coupled to the image signal supplied from the wiring DATA, and the resulting data can be output to the node NA. Note that the transistor M1 can have a function of selecting a pixel.

In other words, when an intended correction signal is stored in the node NM in advance, the correction signal can be added to the supplied image signal. Note that the correction signal is sometimes attenuated by a component on the transmission path; hence, the signal is preferably produced in consideration of the attenuation.

When the light-emitting device emits light with the use of the image signal and the correction signal, the amount of current flowing through the light-emitting device can be increased, and high luminance can be achieved. A voltage higher than or equal to the output voltage of a source driver can be applied as the gate voltage of the driving transistor, so that the power consumption of the source driver can be reduced.

This embodiment can be combined with the other embodiments as appropriate.

Embodiment 3

Described in this embodiment is a metal oxide (hereinafter also referred to as an oxide semiconductor) that can be used in an OS transistor described in the above embodiment.

The metal oxide preferably contains at least indium or zinc. In particular, indium and zinc are preferably contained. In addition, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

<Classification of Crystal Structure>

First, the classification of crystal structures of an oxide semiconductor is described with reference to FIG. 11A. FIG. 11A is a diagram showing the classification of crystal structures of an oxide semiconductor, typically IGZO (a metal oxide containing In, Ga, and Zn).

As shown in FIG. 11A, an oxide semiconductor is roughly classified into "Amorphous", "Crystalline", and "Crystal". The term "Amorphous" includes completely amorphous. The term "Crystalline" includes CAAC (c-axis-aligned crystalline), nc (nanocrystalline), and CAC (cloud-aligned composite). Note that the term "Crystalline" excludes single crystal, poly crystal, and completely amorphous. The term "Crystal" includes single crystal and poly crystal.

Note that the structures in the thick frame in FIG. 11A are in an intermediate state between "Amorphous" and "Crystal", and belong to a new crystalline phase. That is, these structures are completely different from "Amorphous", which is energetically unstable, and "Crystal".

A crystal structure of a film or a substrate can be analyzed with an X-ray diffraction (XRD) spectrum. Here, XRD spectra of a quartz glass substrate and an IGZO film having a crystal structure classified into "Crystalline" (also referred to as Crystalline IGZO), which are obtained by a GIXD (Grazing-Incidence) XRD measurement, are shown in FIG. 11B and FIG. 11C, respectively. Note that a GIXD method is also referred to as a thin film method or a Seemann-Bohlin method. The XRD spectrum that is shown in FIG. 11B and FIG. 11C and obtained by GIXD measurement is hereinafter simply referred to as an XRD spectrum. FIG. 11B shows an XRD spectrum of a quartz glass substrate, and FIG. 11C shows an XRD spectrum of a crystalline IGZO film. Note that the crystalline IGZO film shown in FIG. 11C has a composition in the vicinity of In:Ga:Zn=4:2:3 [atomic ratio]. Furthermore, the crystalline IGZO film shown in FIG. 11C has a thickness of 500 nm.

As indicated by arrows in FIG. 11B, the XRD spectrum of the quartz glass substrate shows a peak with a substantially bilaterally symmetrical shape. In contrast, as indicated by arrows in FIG. 11C, the XRD spectrum of the crystalline IGZO film shows a peak with a bilaterally asymmetrical shape. The asymmetrical peak of the XRD spectrum clearly shows the existence of crystal in the film or the substrate. In other words, the crystal structure of the film or the substrate cannot be regarded as "amorphous" unless it has a bilaterally symmetrical peak in the XRD spectrum. Note that in FIG. 11C, a crystal phase (IGZO crystal phase) is denoted at 2θ of 31° or in the vicinity thereof. The bilaterally asymmetrical peak of the XRD spectrum is probably attributed to a diffraction peak derived from such a crystal phase (a fine crystal).

Specifically, interference of an X-ray scattered by atoms contained in IGZO probably contributes to a peak at 2θ=34° or in the vicinity thereof. In addition, the fine crystal probably contributes to the peak at 2θ=31° or in the vicinity thereof. In the XRD spectrum of the crystalline IGZO film shown in FIG. 11C, the peak at 2θ of 34° or in the vicinity thereof is wide on the lower angle side. This indicates that the crystalline IGZO film includes a fine crystal attributed to the peak at 2θ of 31° or in the vicinity thereof.

A crystal structure of a film or a substrate can also be evaluated with a diffraction pattern obtained by a nanobeam electron diffraction (NBED) method (such a pattern is also referred to as a nanobeam electron diffraction pattern). Diffraction patterns of the quartz glass substrate and the IGZO film formed with a substrate temperature set at room temperature are shown in FIG. 11D and FIG. 11E, respectively. FIG. 11D shows the diffraction pattern of the quartz glass substrate and FIG. 11E shows the diffraction pattern of the IGZO film. Note that the IGZO film of FIG. 11E is formed by a sputtering method using an In—Ga—Zn oxide target with In:Ga:Zn=1:1:1 [atomic ratio]. In the nanobeam electron diffraction method, electron diffraction is performed with a probe diameter of 1 nm.

Note that as shown in FIG. 11D, a halo pattern is observed in the diffraction pattern of the quartz glass substrate, which indicates that the quartz glass substrate is in an amorphous state. As shown in FIG. 11E, not a halo pattern but a spot-like pattern is observed in the diffraction pattern of the IGZO film formed at room temperature. Thus, it is presumed that the IGZO film formed at room temperature is in an intermediate state, which is neither a crystal state nor an amorphous state, and it cannot be concluded that the IGZO film is in an amorphous state.

<<Structure of Oxide Semiconductor>>

Oxide semiconductors might be classified in a manner different from that in FIG. 11A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a stacked-layer structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution transmission electron microscope (TEM) image, for example.

When the CAAC-OS film is subjected to structural analysis by out-of-plane XRD measurement with an XRD apparatus using θ/2θ scanning, for example, a peak indicating c-axis alignment is detected at 2θ of 31≥ or in the vicinity thereof. Note that the position of the peak indicating c-axis alignment (the value of 20) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. Furthermore, a pentagonal or heptagonal lattice arrangement, for example, is included in the distortion in some cases. Note that a clear grain boundary cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear grain boundary is observed is what is called polycrystal. It is highly probable that the grain boundary becomes a recombination center and captures carriers and thus decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, a reduction in electron mobility due to the grain boundary is less likely to occur. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperatures in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods. For example, when an nc-OS film is subjected to structural analysis by out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., 1 nm or larger and 30 nm or smaller).

[a-Like OS]

The a-like OS is an oxide semiconductor having a structure between those of the nc-OS and the amorphous oxide semiconductor. The a-like OS has a void or a low-density region. That is, the a-like OS has lower crystallinity than the nc-OS and the CAAC-OS. Moreover, the a-like OS has higher hydrogen concentration in the film than the nc-OS and the CAAC-OS.

<<Structure of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted by [In], [Ga], and [Zn], respectively. For example, [In] of the first region in the CAC-OS in the In—Ga—Zn oxide is higher than [In] in the composition of the CAC-OS film. Moreover, [Ga] of the second region is higher than [Ga] in the composition of the CAC-OS film. Alternatively, for example, the first region has higher [In] than the second region and lower [Ga] than the second region. Moreover, the second region has higher [Ga] than the first region and lower [In] than the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

In a material composition of a CAC-OS in an In—Ga—Zn oxide that contains In, Ga, Zn, and O, regions containing Ga as a main component are observed in part of the CAC-OS and regions containing In as a main component are observed in part thereof. These regions are randomly dispersed to form a mosaic pattern. Thus, it is suggested that the CAC-OS has a structure in which metal elements are unevenly distributed.

The CAC-OS can be formed by a sputtering method under a condition where a substrate is not heated intentionally, for example. Moreover, in the case of forming the CAC-OS by a sputtering method, any one or more selected from an inert gas (typically, argon), an oxygen gas, and a nitrogen gas are used as a deposition gas. The flow rate of the oxygen gas to the total flow rate of the deposition gas in deposition is preferably as low as possible; for example, the flow rate of the oxygen gas to the total flow rate of the deposition gas in deposition is higher than or equal to 0% and lower than 30%, preferably higher than or equal to 0% and lower than or equal to 10%.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

Here, the first region has a higher conductivity than the second region. In other words, when carriers flow through the first region, the conductivity of a metal oxide is exhibited. Accordingly, when the first regions are distributed in a metal oxide as a cloud, high field-effect mobility (μ) can be achieved.

The second region has a higher insulating property than the first region. In other words, when the second regions are distributed in a metal oxide, leakage current can be inhibited.

Thus, in the case where a CAC-OS is used for a transistor, by the complementary function of the conducting function due to the first region and the insulating function due to the second region, the CAC-OS can have a switching function (On/Off function). A CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current ($I_{on}$), high field-effect mobility (μ), and excellent switching operation can be achieved.

A transistor using a CAC-OS has high reliability. Thus, the CAC-OS is most suitable for a variety of semiconductor devices such as display devices.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor having a low carrier concentration is preferably used for the transistor. For example, the carrier concentration of an oxide semiconductor is lower than or equal to $1\times10^{17}$ $cm^{-3}$, preferably lower than or equal to $1\times10^{15}$ $cm^{-3}$, further preferably lower than or equal to $1\times10^{13}$ $cm^{-3}$, still further preferably lower than or equal to $1\times10^{11}$ $cm^{-3}$, yet further preferably lower than $1\times10^{10}$ $cm^{-3}$, and higher than or equal to $1\times10^{-9}$ $cm^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and accordingly has a low density of trap states in some cases.

Electric charge trapped by the trap states in the oxide semiconductor takes a long time to disappear and might behave like fixed electric charge. Thus, a transistor whose channel formation region is formed in an oxide semiconductor with a high density of trap states has unstable electrical characteristics in some cases.

Accordingly, in order to obtain stable electrical characteristics of a transistor, reducing impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurities>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2\times10^{18}$ atoms/$cm^3$, preferably lower than or equal to $2\times10^{17}$ atoms/$cm^3$.

When the oxide semiconductor contains an alkali metal or an alkaline earth metal, defect states are formed and carriers are generated in some cases. Accordingly, a transistor including an oxide semiconductor that contains an alkali metal or an alkaline earth metal tends to have normally-on characteristics. Thus, the concentration of an alkali metal or an alkaline earth metal in the oxide semiconductor, which is obtained by SIMS, is set lower than or equal to $1\times10^{18}$ atoms/$cm^3$, preferably lower than or equal to $2\times10^{16}$ atoms/$cm^3$.

An oxide semiconductor containing nitrogen easily becomes n-type by generation of electrons serving as carriers and an increase in carrier concentration. Thus, a transistor using an oxide semiconductor containing nitrogen as the semiconductor tends to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained by SIMS, is set lower than $5\times10^{19}$ atoms/$cm^3$, preferably lower than or equal to $5\times10^{18}$ atoms/$cm^3$, further preferably lower than or equal to $1\times10^{18}$ atoms/$cm^3$, still further preferably lower than or equal to $5\times10^{17}$ atoms/$cm^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained by SIMS, is set lower than $1\times10^{20}$ atoms/$cm^3$, preferably lower than $1\times10^{19}$ atoms/$cm^3$, further preferably lower than $5\times10^{18}$ atoms/$cm^3$, still further preferably lower than $1\times10^{18}$ atoms/$cm^3$.

When an oxide semiconductor with sufficiently reduced impurities is used for the channel formation region of the transistor, stable electrical characteristics can be given.

This embodiment can be combined with any of the other embodiments as appropriate.

Embodiment 4

In this embodiment, electronic devices of embodiments of the present invention are described with reference to FIG. 12 to FIG. 17.

The electronic device of this embodiment includes the display device of one embodiment of the present invention in a display portion, and thus has a long lifetime and high reliability. The use of the display device of one embodiment of the present invention in the display portion enables the electronic device to have a long lifetime and a large screen.

The display portion of the electronic device in this embodiment can display a video with a definition of, for example, full high definition, 4K2K, 8K4K, 16K8K, or higher. As a screen size of the display portion, the diagonal size can be greater than or equal to 20 inches, greater than or equal to 30 inches, greater than or equal to 50 inches, greater than or equal to 60 inches, or greater than or equal to 70 inches.

Examples of the electronic devices include a digital camera, a digital video camera, a digital photo frame, a mobile phone, a portable game machine, a portable information terminal, and an audio reproducing device, in addition to electronic devices with a relatively large screen, such as a television device, a desktop or laptop personal computer, a monitor of a computer or the like, digital signage, and a large game machine such as a pachinko machine.

The electronic device in this embodiment can be incorporated along a curved surface of an inside wall or an outside wall of a house or a building or the interior or the exterior of a car.

The electronic device in this embodiment may include an antenna. When a signal is received by the antenna, a video, data, or the like can be displayed on the display portion. When the electronic device includes the antenna and a secondary battery, the antenna may be used for contactless power transmission.

The electronic device in this embodiment may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device in this embodiment can have a variety of functions. For example, the electronic device can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figure 12A:
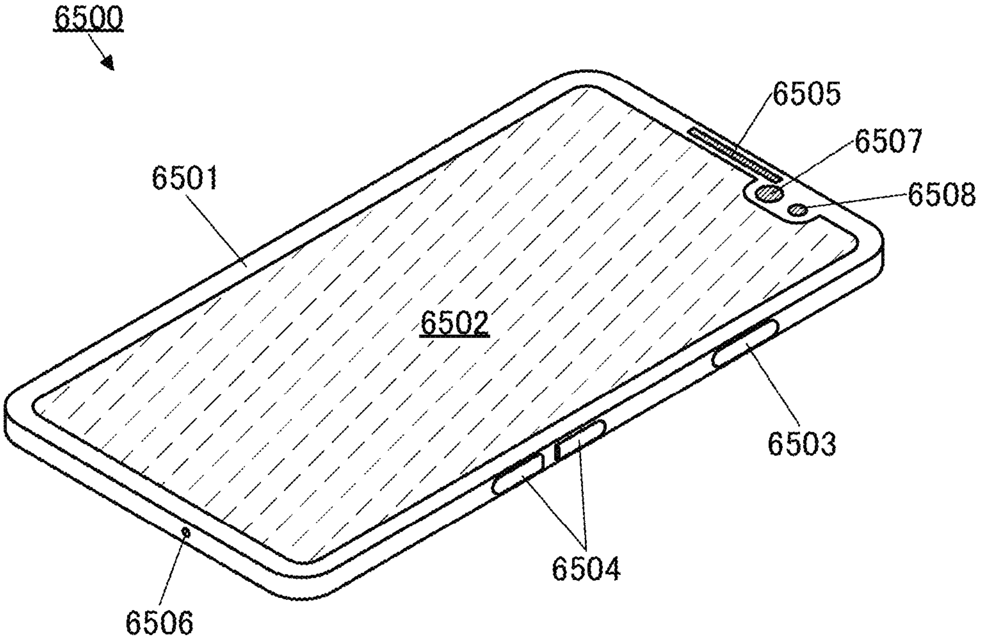
FIG. 12A and FIG. 12B are diagrams illustrating an example of an electronic device.

An electronic device 6500 illustrated in FIG. 12A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display device of one embodiment of the present invention can be used for the display portion 6502.

Figure 12B:
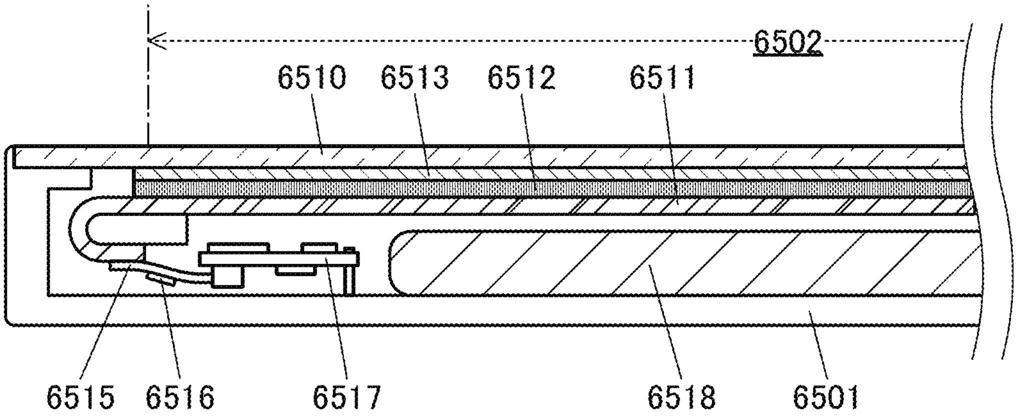

FIG. 12B is a schematic cross-sectional view including an end portion of the housing 6501 on the microphone 6506 side.

A protection member 6510 having a light-transmitting property is provided on the display surface side of the housing 6501, and a display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

The flexible display device of one embodiment of the present invention can be used for the display panel 6511. Thus, an extremely lightweight electronic device can be achieved. Since the display panel 6511 is extremely thin, the battery 6518 with high capacity can be mounted with the thickness of the electronic device controlled. An electronic device with a narrow frame can be achieved when part of the display panel 6511 is folded back so that the portion connected to the FPC 6515 is provided on the rear side of a pixel portion.

FIG. 13 to FIG. 15 each illustrate an example of an electronic device that includes a flexible display device and can be folded small.

Each of the electronic devices illustrated in FIG. 13 and FIG. 14 has a double-fold mechanism and can be folded such that its display surfaces face each other.

The electronic device illustrated in FIG. 15 has a tri-fold mechanism, and includes a region where the electronic device can be folded such that its display surfaces face each other and a region where the electronic device can be folded such that its surfaces opposite to the display surfaces face each other.

The electronic devices illustrated in FIG. 13 to FIG. 15 can be folded small along folds provided in the minor-axis direction, and thus can have higher portability even when including a display device with a relatively high aspect ratio of 16:9, 18:9, or 21:9, for example. In addition, a display region that cannot be seen when the electronic device is folded small is brought into a non-display state, whereby the power consumption can be greatly reduced.

Figure 13A:
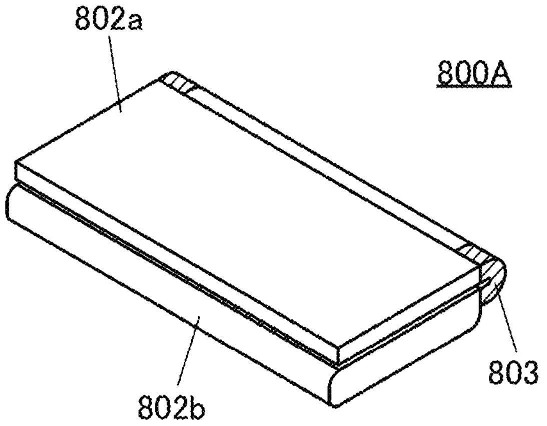
FIG. 13A to FIG. 13C are diagrams illustrating an example of an electronic device.
Figure 13B:
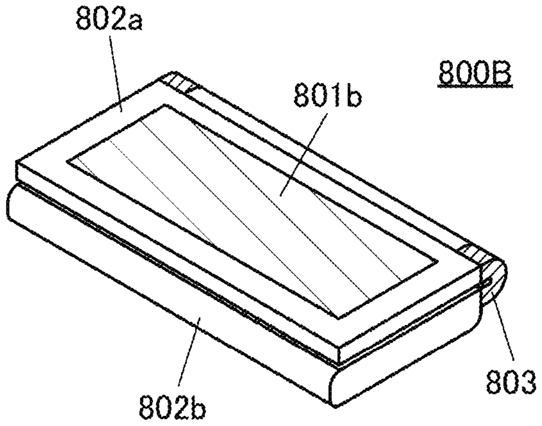
Figure 13C:
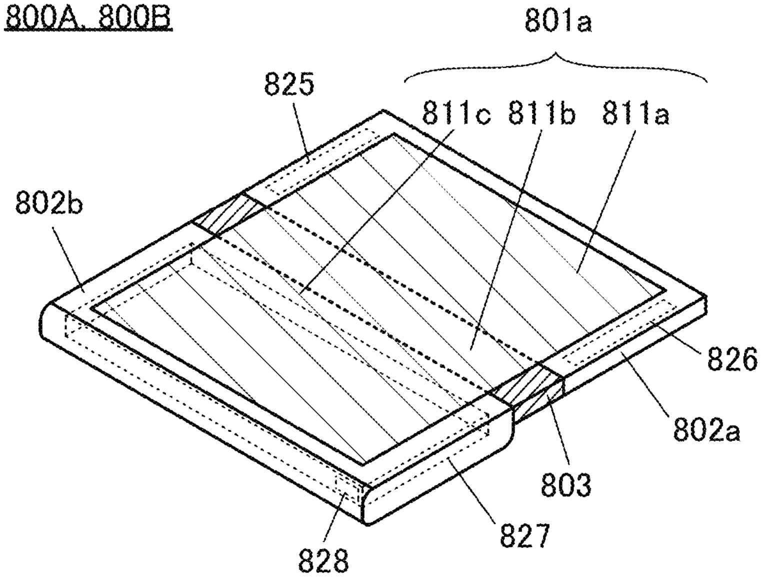

FIG. 13A is a diagram illustrating a state where an electronic device 800A is folded to the minimum size (folded in half). FIG. 13B is a diagram illustrating a state where an electronic device 800B is folded to the minimum size (folded in half). FIG. 13C is a diagram illustrating a state where the electronic device 800A or the electronic device 800B is opened.

The electronic device 800A and the electronic device 800B each include a display panel 801*a* having flexibility, a housing 802*a*, a housing 802*b*, and a hinge 803.

A seamless flexible display panel can be used as the display panel 801*a*. The display device of one embodiment of the present invention can be used for the display panel 801*a*.

In the electronic device 800A or the electronic device 800B that is opened, the display panel 801*a* includes a first region 811*a* overlapping the housing 802*a*, a second region 811*b* overlapping the hinge 803, and a third region 811*c* overlapping the housing 802*b*. These three regions are preferably included in a display region of the display panel 801*a*. In the state illustrated in FIG. 13A and FIG. 13B, the first region 811*a* and the third region 811*c* overlap each other. When the electronic device 800A or the electronic device 800B is folded as illustrated in FIG. 13A or FIG. 13B, the second region 811*b* is bent and accordingly the display surfaces in the first region 811*a* and the third region 811*c* face each other.

The housing 802*a* is connected to the housing 802*b* through the hinge 803.

At least part of the display panel 801*a* may be fixed to the housing 802*a*. At least part of the display panel 801*a* may be fixed to the housing 802*b*.

The electronic device 800B further includes a display panel 801*b*.

In the electronic device 800B, the display panel 801*a* and the display panel 801*b* overlap each other with the housing 802*a* therebetween. The display surface of the display panel 801*a* and the display surface of the display panel 801*b* face in opposite directions. The display panel 801*a* may be fixed to a first surface of the housing 802*a*, and the display panel 801*b* may be fixed to a second surface opposite to the first surface.

The display device of one embodiment of the present invention can be used for one or both of the display panel 801*a* and the display panel 801*b* included in the electronic device 800B.

When the electronic device 800B is folded, a user can see display on the display panel 801*b*. When the electronic device 800B is opened, the user can see display on the display panel 801*a*.

Figure 14A:
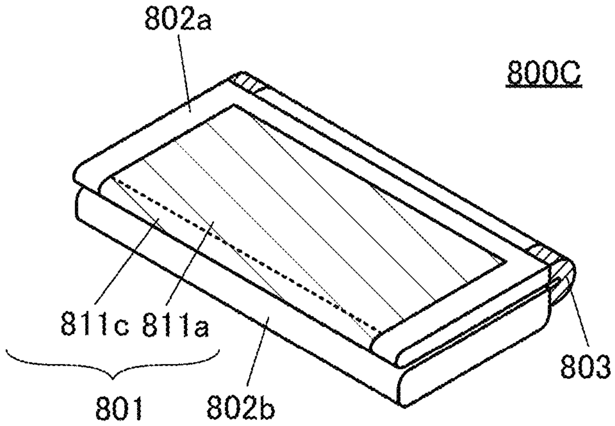
FIG. 14A and FIG. 14B are diagrams illustrating an example of an electronic device.
Figure 14B:
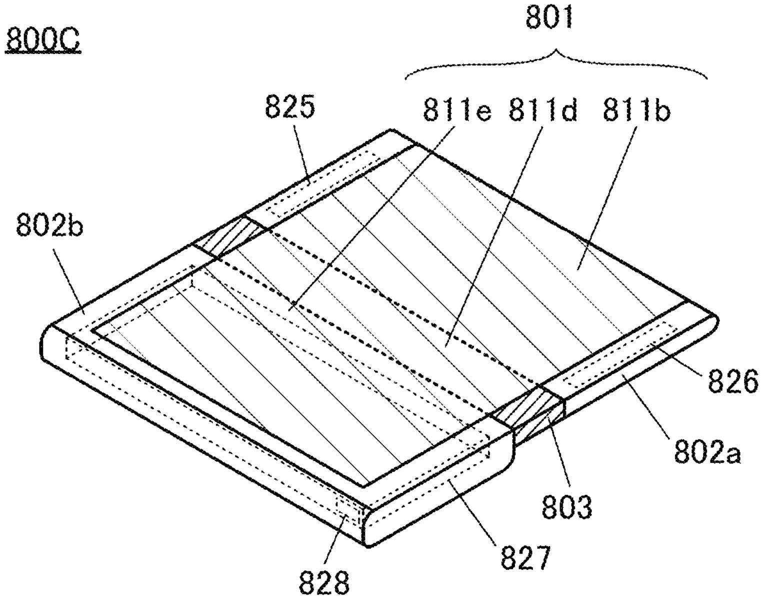

FIG. 14A is a diagram illustrating a state where an electronic device 800C is folded to the minimum size (folded in half). FIG. 14B is a diagram illustrating a state where the electronic device 800C is opened.

The electronic device 800C includes a display panel 801 having flexibility, the housing 802*a*, the housing 802*b*, and the hinge 803.

A seamless flexible display panel can be used as the display panel 801. The display device of one embodiment of the present invention can be used for the display panel 801.

In a state where the electronic device 800C is opened, the display panel 801 includes the first region 811*a* and the second region 811*b* that overlap each other with the housing 802*a* therebetween, the third region 811*c* that is positioned between the first region 811*a* and the second region 811*b* and has a curved surface, a fourth region 811*d* that overlaps the hinge 803, and a fifth region 811*e* that overlaps the housing 802*b*. These five regions are preferably included in the display region of the display panel 801. In the state illustrated in FIG. 14A, the first region 811*a*, the second region 811*b*, and the fifth region 811*e* overlap each other. In the state illustrated in FIG. 14A, a user can see display in the first region 811*a* and the third region 811*c*. In the state illustrated in FIG. 14B, the user can see display in the second region 811*b*, the fourth region 811*d*, and the fifth region 811*e* (furthermore, the third region 811*c*).

In the state illustrated in FIG. 14A, the display surfaces in the first region 811*a* and the fifth region 811*e* face in the same direction, and the display surface in the second region 811*b* face in a direction opposite to the direction. In the electronic device 800C folded as illustrated in FIG. 14A, the display surfaces in the second region 811*b* and the fifth region 811*e* face each other.

The housing 802*a* is connected to the housing 802*b* through the hinge 803.

At least part of the display panel 801 may be fixed to the housing 802*a*. The display panel 801 is provided along sequential three surfaces (a first surface, a second surface opposite to the first surface, and a third surface (side surface) between the first surface and the second surface) of the housing 802*a*. The display panel 801 in the first region 811*a* may be fixed to the first surface. The display panel in the second region 811*b* may be fixed to the second surface. The display panel 801 in the third region 811*c* may be fixed to the third surface.

At least part of the display panel 801*a* may be fixed to the housing 802*b*. The display panel 801 in the fifth region 811*e* may be fixed to the housing 802*b*.

Figure 15A:
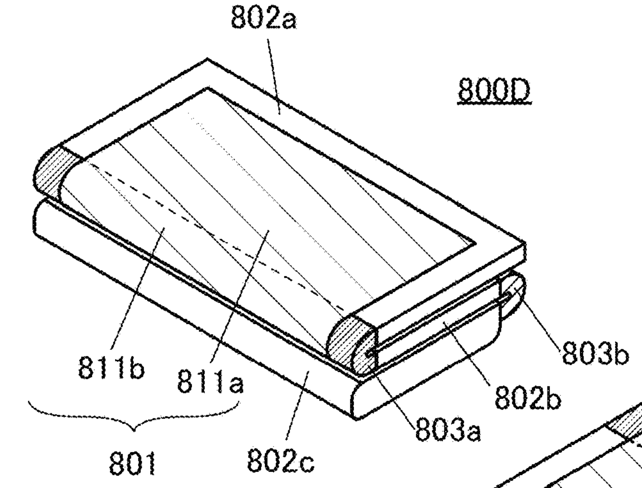
FIG. 15A to FIG. 15D are diagrams illustrating examples of electronic devices.
Figure 15B:
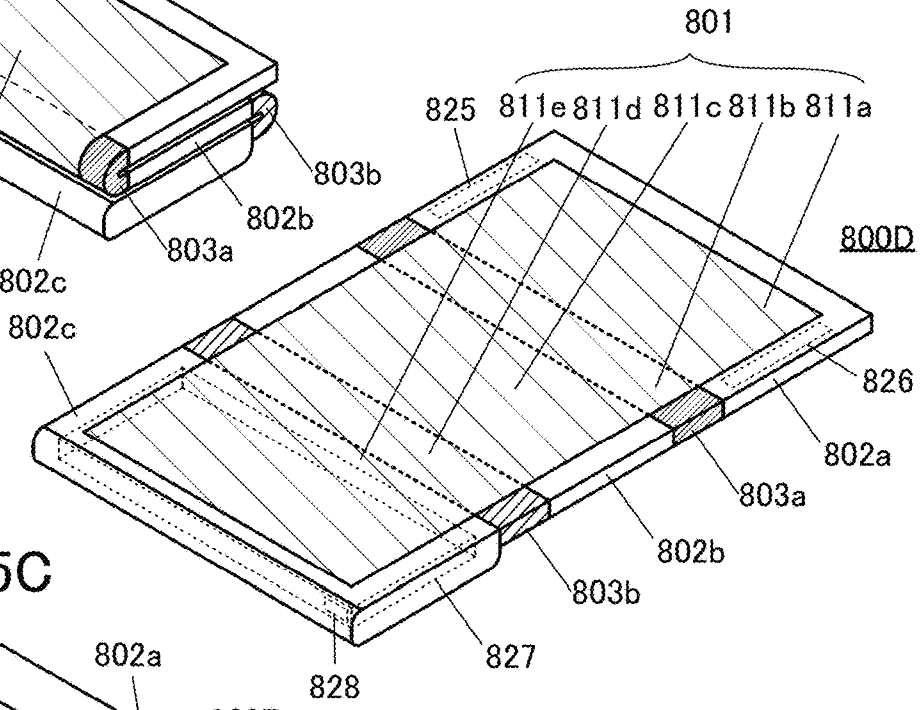
Figure 15C:
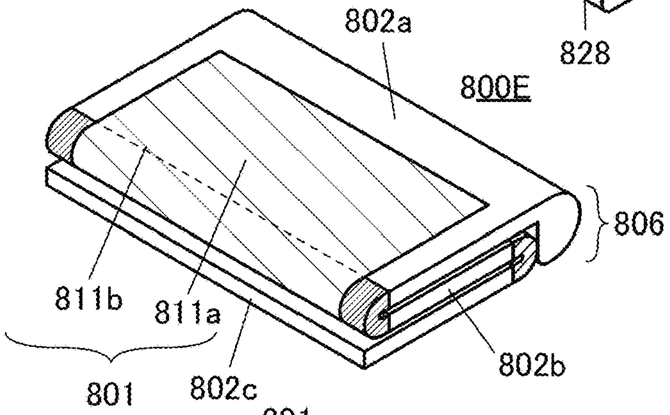
Figure 15D:
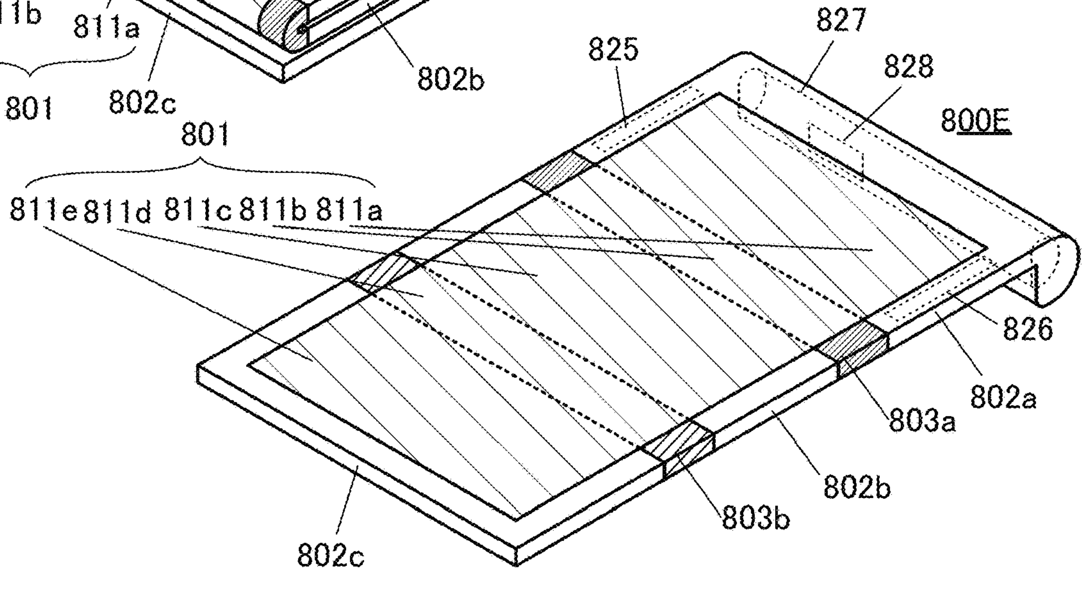

FIG. 15A is a diagram illustrating a state where an electronic device 800D is folded to the minimum size (folded in three). FIG. 15B is a diagram illustrating a state where the electronic device 800D is opened. FIG. 15C is a diagram illustrating a state where an electronic device 800E is folded to the minimum size (folded in three). FIG. 15D is a diagram illustrating a state where the electronic device 800E is opened.

The electronic device 800D and the electronic device 800E each include the display panel 801 having flexibility, the housing 802*a*, the housing 802*b*, a housing 802*c*, a hinge 803*a*, and a hinge 803*b*.

A seamless flexible display panel can be used as the display panel 801. The display device of one embodiment of the present invention can be used for the display panel 801.

In the electronic device 800D or the electronic device 800E that is opened, the display panel 801 includes the first region 811*a* overlapping the housing 802*a*, the second region 811*b* overlapping the hinge 803*a*, the third region 811*c* overlapping the housing 802*b*, the fourth region 811*d* overlapping the hinge 803*b*, and the fifth region 811*e* overlapping the housing 802*c*. These five regions are preferably included in the display region of the display panel 801. In the state illustrated in FIG. 15A and FIG. 15C, the first region 811*a*, the third region 811*c*, and the fifth region 811*e* overlap each other. In the state illustrated in FIG. 15A and FIG. 15C, a user can see display in the first region 811*a* and the second region 811*b*. In the state illustrated in FIG. 15B and FIG. 15D, the user can see display in all the five regions.

When the electronic device 800D or the electronic device 800E is folded as illustrated in FIG. 15A or FIG. 15C, the second region 811*b* is bent, and accordingly a surface opposite to the display surface in the first region 811*a* and a surface opposite to the display surface in the third region 811*c* face each other.

When the electronic device 800D or the electronic device 800E is folded as illustrated in FIG. 15A or FIG. 15C, the fourth region 811*d* is bent, and accordingly the display surfaces of the third region 811*c* and the fifth region 811*e* face each other.

The housing 802*a* is connected to the housing 802*b* through the hinge 803*a*. The housing 802*b* is connected to the housing 802*c* through the hinge 803*b*.

At least part of the display panel 801 may be fixed to the housing 802*a*. At least part of the display panel 801 may be fixed to the housing 802*b*. At least part of the display panel 801 may be fixed to the housing 802*c*.

In each of the electronic device 800A to the electronic device 800D, one of the plurality of housings is thicker than the other housings. In each of the electronic device 800A to the electronic device 800C, the housing 802*b* is thicker than the housing 802*a*. In the electronic device 800D, the housing 802*c* is thicker than the housing 802*a* and the housing 802*b*.

A battery 827 with a relatively large size can be included in a thick housing, which enables long-term operation of the electronic device. When including the battery 827 with a relatively heavy weight in the thick housing, the electronic device can have the center of gravity in the thick housing even in an opened state. When including a housing thicker than the other housings and having the center of gravity in the thick housing, the electronic device can be easier to hold even in a flat opened state.

As the battery 827, a lithium ion battery that can have higher capacity is preferably used. The battery 827 is preferably provided with a protection circuit 828.

In the electronic device 800E, the battery 827 is included in the housing 802*a*. The electronic device 800E includes a grip portion 806 for easy grip at an end portion of the housing 802*a*, and the grip portion 806 can include the battery 827. The center of gravity of the electronic device 800E is positioned in the grip portion 806 including the heavy battery 827, which can improve the ease of holding. As illustrated in FIG. 15D, the flat opened electronic device 800E can be used in a stable mode on a desk with the grip portion 806 serving as a leg. Furthermore, since the display surface is inclined, the visibility can be improved.

The shapes of the electronic devices of this embodiment may be changed manually, or may be changed using electric power or mechanical power such as a spring.

The electronic device 800A to the electronic device 800E are preferably easy to handle regardless of the user's dominant hand, and it is preferable that the electronic device 800A to the electronic device 800E can display an image in a direction in which a user can easily see the image.

The operation is performed in such a manner that, for example, a sensor (an acceleration sensor, a gyro sensor, or the like) included in the electronic device sense the inclination of the electronic device, and the direction of displaying an image is determined on the basis of the inclination. In addition, the sensor can sense vibration of the electronic device from a change in the inclination. Since the vibration varies among individuals, an artificial intelligence (AI) that has learned the vibration information can recognize the user. Utilizing this function, individual authentication can also be performed.

The electronic device 800A to the electronic device 800E each preferably include an antenna in the housing. Although this embodiment shows an example in which an antenna 825 and an antenna 826 are provided in the housing 802*a*, the number of antennas and the position where the antenna is provided are not limited thereto. The antenna 825 is an antenna for the fourth-generation mobile communication system (4G), and the antenna 826 is an antenna for the fifth-generation mobile communication system (5G).

When both the antenna 825 and the antenna 826 are provided in the housing 802*a*, favorable communication can be performed easily. In particular, each of the electronic device 800B to the electronic device 800E is often used (put or held) in a state where display is easily seen by a user even when the electronic device is folded. Thus, the electronic device often faces in a direction in which the housing 802*a* can easily receive radio wave, leading to easy reception of radio wave.

Figure 16A:
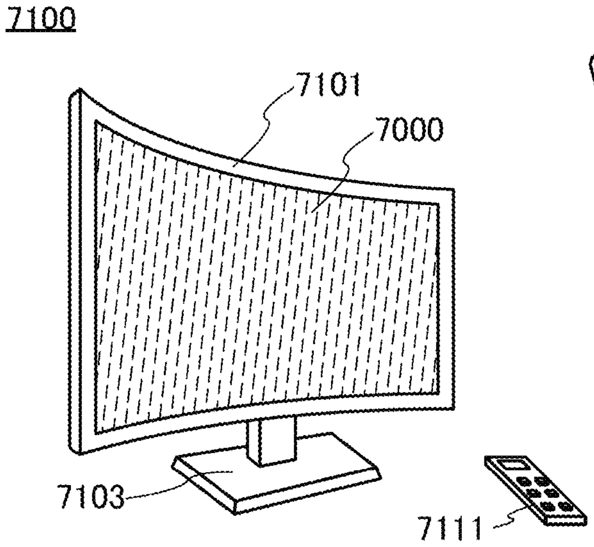
FIG. 16A to FIG. 16D are diagrams each illustrating an example of an electronic device.

FIG. 16A illustrates an example of a television device. In a television device 7100, a display portion 7000 is incorporated in a housing 7101. Here, a structure in which the housing 7101 is supported by a stand 7103 is illustrated.

A display device of one embodiment of the present invention can be used for the display portion 7000.

Operation of the television device 7100 illustrated in FIG. 16A can be performed with an operation switch provided in the housing 7101 or a separate remote controller 7111. Alternatively, the display portion 7000 may include a touch sensor, and the television device 7100 may be operated by a touch on the display portion 7000 with a finger or the like. The remote controller 7111 may be provided with a display portion for displaying data output from the remote controller 7111. With operation keys or a touch panel provided in the remote controller 7111, channels and volume can be operated and videos displayed on the display portion 7000 can be operated.

Note that the television device 7100 has a structure in which a receiver, a modem, and the like are provided. A general television broadcast can be received with the receiver. When the television device is connected to a communication network with or without wires via the modem, one-way (from a transmitter to a receiver) or two-way (between a transmitter and a receiver or between receivers, for example) data communication can be performed.

Figure 16B:
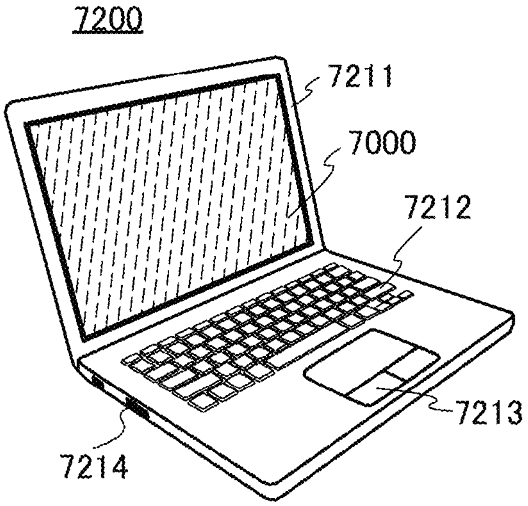

FIG. 16B shows an example of a laptop personal computer. A laptop personal computer 7200 includes a housing 7211, a keyboard 7212, a pointing device 7213, an external connection port 7214, and the like. In the housing 7211, the display portion 7000 is incorporated.

A display device of one embodiment of the present invention can be used for the display portion 7000.

Figure 16C:
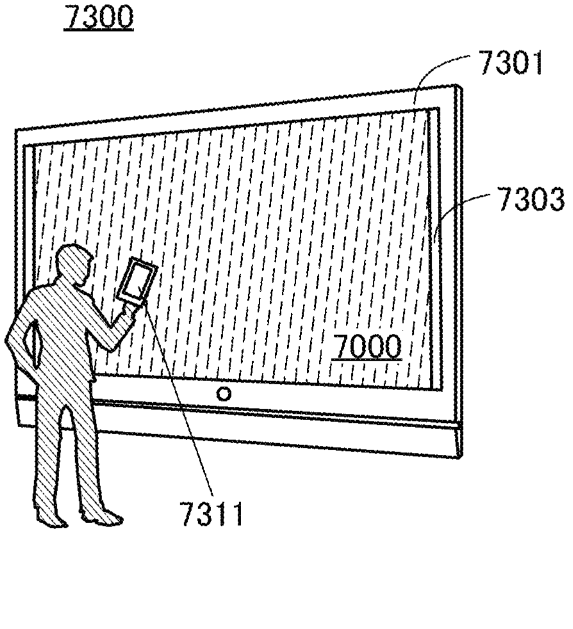
Figure 16D:
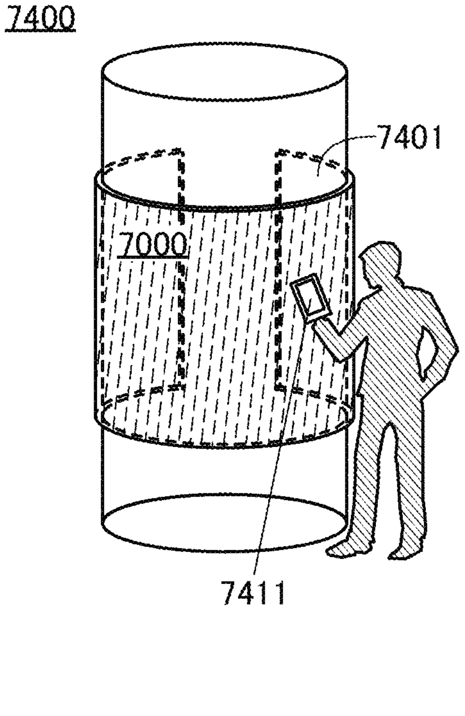

FIG. 16C and FIG. 16D show examples of digital signage.

Digital signage 7300 illustrated in FIG. 16C includes a housing 7301, the display portion 7000, a speaker 7303, and the like. Furthermore, the digital signage can include an LED lamp, operation keys (including a power switch or an operation switch), a connection terminal, a variety of sensors, a microphone, and the like.

FIG. 16D illustrates digital signage 7400 mounted on a cylindrical pillar 7401. The digital signage 7400 includes the display portion 7000 provided along a curved surface of the pillar 7401.

The display device of one embodiment of the present invention can be used for the display portion 7000 in FIG. 16C and FIG. 16D.

A larger area of the display portion 7000 can increase the amount of data that can be provided at a time. The larger display portion 7000 attracts more attention, so that the advertising effectiveness can be enhanced, for example.

The use of a touch panel in the display portion 7000 is preferable because in addition to display of a still image or a moving image on the display portion 7000, intuitive operation by a user is possible. Moreover, for an application for providing information such as route information or traffic information, usability can be enhanced by intuitive operation.

As illustrated in FIG. 16C and FIG. 16D, it is preferable that the digital signage 7300 or the digital signage 7400 can work with an information terminal 7311 or an information terminal 7411 such as a smartphone a user has through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with use of the screen of the information terminal 7311 or the information terminal 7411 as an operation means (controller). Thus, an unspecified number of users can join in and enjoy the game concurrently.

Electronic devices illustrated in FIG. 17A to FIG. 17F include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The electronic devices illustrated in FIG. 17A to FIG. 17F have a variety of functions. For example, the electronic devices can have a function of displaying a variety of information (a still image, a moving image, a text image, and the like) on the display portion, a touch panel function, a function of displaying a calendar, date, time, and the like, a function of controlling processing with use of a variety of software (programs), a wireless communication function, and a function of reading out and processing a program or data stored in a recording medium. Note that the functions of the electronic devices are not limited thereto, and the electronic devices can have a variety of functions. The electronic devices may include a plurality of display portions. The electronic devices may each include a camera or the like and have a function of taking a still image or a moving image and storing the taken image in a recording medium (an external recording medium or a recording medium incorporated in the camera), a function of displaying the taken image on the display portion, or the like.

The details of the electronic devices illustrated in FIG. 17A to FIG. 17F are described below.

Figure 17A:
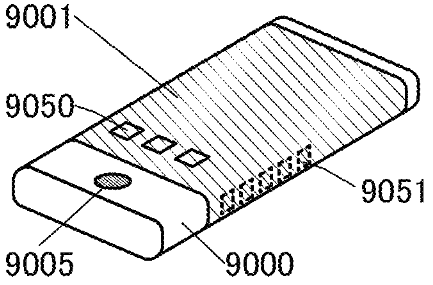
FIG. 17A to FIG. 17F are diagrams illustrating examples of electronic devices.

FIG. 17A is a perspective view illustrating a portable information terminal 9101. For example, the portable information terminal 9101 can be used as a smartphone. Note that the portable information terminal 9101 may be provided with the speaker 9003, the connection terminal 9006, the sensor 9007, or the like. The portable information terminal 9101 can display characters and image information on its plurality of surfaces. FIG. 17A illustrates an example where three icons 9050 are displayed. Information 9051 indicated by dashed rectangles can be displayed on another surface of the display portion 9001. Examples of the information 9051 include notification of reception of an e-mail, SNS, or an incoming call, the title and sender of an e-mail, SNS, or the like, the date, the time, remaining battery, and the reception strength of an antenna. Alternatively, the icon 9050 or the like may be displayed in the position where the information 9051 is displayed.

Figure 17B:
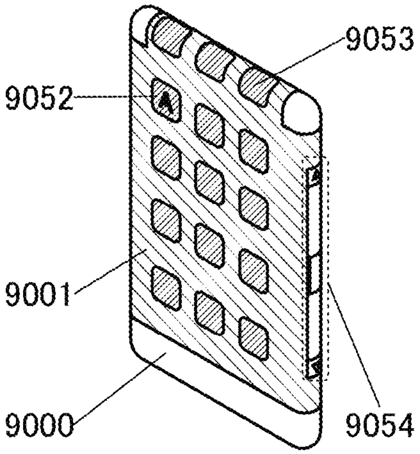

FIG. 17B is a perspective view illustrating a portable information terminal 9102. The portable information terminal 9102 has a function of displaying information on three or more surfaces of the display portion 9001. Here, an example in which information 9052, information 9053, and information 9054 are displayed on different surfaces is shown. For example, a user can check the information 9053 displayed in a position that can be observed from above the portable information terminal 9102, with the portable information terminal 9102 put in a breast pocket of his/her clothes. The user can see the display without taking out the portable information terminal 9102 from the pocket and decide whether to answer the call, for example.

Figure 17C:
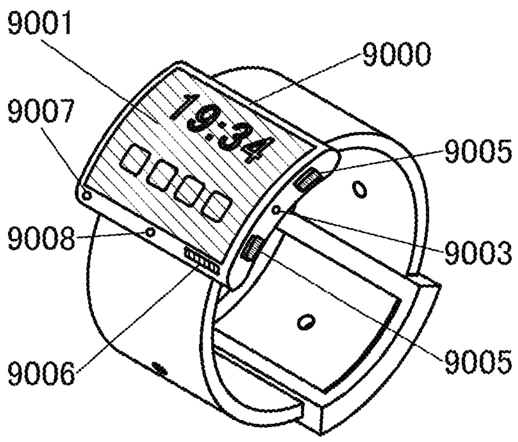

FIG. 17C is a perspective view illustrating a watch-type portable information terminal 9200. For example, the portable information terminal 9200 can be used as a smart watch. The display portion 9001 is provided with its display surface curved, and display can be performed along the curved display surface. Mutual communication between the portable information terminal 9200 and, for example, a headset capable of wireless communication enables hands-free calling. With the connection terminal 9006, the portable information terminal 9200 can perform mutual data transmission with another information terminal and charging. Note that the charging operation may be performed by wireless power feeding.

Figure 17D:
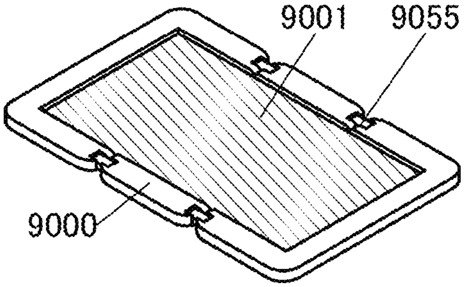
Figure 17E:
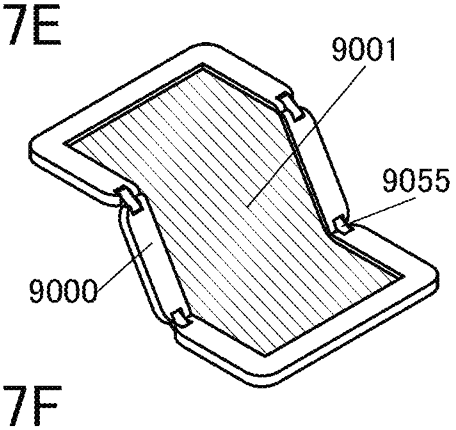
Figure 17F:
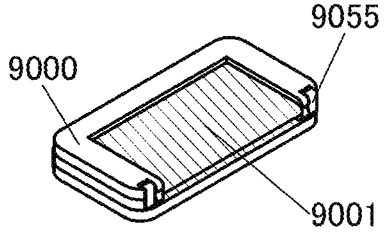

FIG. 17D to FIG. 17F are perspective views illustrating a foldable portable information terminal 9201. FIG. 17D is a perspective view of an opened state of the portable information terminal 9201, FIG. 17F is a perspective view of a folded state thereof, and FIG. 17E is a perspective view of a state in the middle of change from one of FIG. 17D and FIG. 17F to the other. The portable information terminal 9201 is highly portable in the folded state and is highly browsable in the opened state because of a seamless large display region. The display portion 9001 of the portable information terminal 9201 is supported by three housings 9000 joined by hinges 9055. For example, the display portion 9001 can be curved with a curvature radius greater than or equal to 0.1 mm and less than or equal to 150 mm.

This embodiment can be combined with the other embodiments as appropriate.

Reference Example

In this reference example, methods for calculating the HOMO level, the LUMO level, and the electron mobility of an organic compound in the display device of one embodiment of the present invention are described.

The HOMO level and the LUMO level can be calculated through a cyclic voltammetry (CV) measurement.

In this reference example, an electrochemical analyzer (model number: ALS model 600A or 600C, manufactured by BAS Inc.) was used as a measurement apparatus. To prepare a solution for the CV measurement, dehydrated dimethylformamide (DMF) (manufactured by Sigma-Aldrich Inc., 99.8%, catalog No. 22705-6) was used as a solvent, tetra-n-butylammonium perchlorate ($n\text{-}Bu_4NClO_4$) (manufactured by Tokyo Chemical Industry Co., Ltd., catalog No. T0836) as a supporting electrolyte was dissolved at a concentration of 100 mmol/L, and the object to be measured was dissolved at a concentration of 2 mmol/L. A platinum electrode (PTE platinum electrode, manufactured by BAS Inc.) was used as a working electrode, another platinum electrode (Pt counter electrode for VC-3 (5 cm), manufactured by BAS Inc.) was used as an auxiliary electrode, and an $Ag/Ag^+$ electrode (RE7 reference electrode for non-aqueous solvent, manufactured by BAS Inc.) was used as a reference electrode. The measurement was conducted at room temperature (20 to 25° C.). The scan speed in the CV measurement was fixed to 0.1 V/sec, and an oxidation potential Ea [V] and a reduction potential Ec [V] with respect to the reference electrode were measured. Ea is an intermediate potential of an oxidation-reduction wave, and Ec is an intermediate potential of a reduction-oxidation wave. Here, since the potential energy of the reference electrode used in this reference example with respect to the vacuum level is known to be −4.94 [eV], the HOMO level and the LUMO level can be calculated by the following formulae: HOMO level [eV]=−4.94−Ea and LUMO level [eV]−4.94−Ec.

The electron mobility can be measured by an impedance spectroscopy method (IS method).

As a method for measuring the carrier mobility of an EL material, a time-of-flight method (TOF method), a method (SCLC method) using I-V characteristics of a space-charge-limited current (SCLC), or the like has been known for a long time. The TOF method needs a sample with a much larger thickness than that of an actual organic EL device. The SCLC method has a disadvantage in that electric field strength dependence of carrier mobility cannot be obtained, for example. Since an organic film required for the measurement employing the IS method is as thin as approximately several hundreds of nanometers, the film can be formed using a relatively small amount of EL materials; accordingly, the IS method is characterized by the capability of measuring the mobility with a thickness close to the thickness of a film in an actual organic EL device, and can also measure the electric field strength dependence of the carrier mobility.

In the IS method, a micro sinusoidal voltage signal ($V=V_0[\exp(j\omega t)]$) is applied to an EL device, and the impedance ($Z=V/I$) of the EL device is obtained from a phase difference between the current amplitude of a response current signal ($I=I_0 \exp[j(\omega t+\phi)]$) and the input signal. By applying the voltage to the EL device while the frequency of the voltage is changed from a high level to a low level, components having various relaxation times that contribute to the impedance can be separated and measured.

Here, admittance Y (=1/Z), which is the reciprocal number of the impedance, can be represented by conductance G and susceptance B as shown in the following formula (1).

[Formula 1]

$$Y = \frac{1}{Z} = G + jB \tag{1}$$

In addition, by a single injection model, calculation of the following formulae (2) and (3) can be performed. Here, g (the formula (4)) is differential conductance. In the formulae, C represents capacitance, θ is ωT and represents a transit angle, and ω represents angular frequency. T represents transit time. For the analysis, the current equation, the Poisson's equation, and the current continuity equation are used, and a diffusion current and a trap state are ignored.

[Formula 2]

$$G = \frac{g\theta^3}{6}\frac{\theta - \sin\theta}{(\theta - \sin\theta)^2 + \left(\frac{\theta^2}{2} + \cos\theta - 1\right)^2} \tag{2}$$

$$B = \omega C = \frac{g\theta^3}{6}\frac{\frac{\theta^2}{2} + \cos\theta - t}{(\theta - \sin\theta)^2 + \left(\frac{\theta^2}{2} + \cos\theta - 1\right)^2} \tag{3}$$

$$g = \frac{9}{4}\varepsilon\mu\frac{V_0}{d^3} \tag{4}$$

A method for calculating mobility from the frequency characteristics of capacitance is a −ΔB method. A method for calculating mobility from the frequency characteristics of conductance is a ωΔG method.

In practice, first, an electron-only device is fabricated using a material whose electron mobility is intended to be calculated. The electron-only device is a device designed such that only electrons flow therein as carriers. In this specification, the method for calculating mobility from the frequency characteristics of capacitance (the −ΔB method) is described.

Figure 18A:
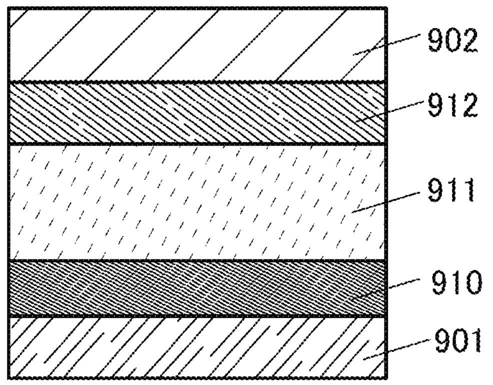
FIG. 18A is a diagram illustrating a structure of an electron-only device.

FIG. 18A illustrates a structure of an electron-only device fabricated for the measurement, and Table 1 shows its specific components. The electron-only device fabricated in this reference example includes a first layer 910, a second layer 911, and a third layer 912 between a first electrode 901 (anode) and a second electrode 902 (cathode). The material whose electron mobility is intended to be calculated is used as a material for the second layer 911. In this reference example, the electron mobility of a film formed by co-evaporation of 2-{4-[9,10-di(naphthalen-2-yl)-2-anthryl]phenyl}-1-phenyl-1H-benzimidazole (abbreviation: ZADN) and 8-(quinolinolato)lithium (abbreviation: Liq) in a weight ratio of 1:1 was measured. In this reference example, the electron mobilities of 7-[4-(10-phenyl-9-anthryl)phenyl]-7H-dibenzo[c,g]carbazole (abbreviation: cgDBCzPA) and 2-[3'-(dibenzothiophen-4-yl)biphenyl-3-yl]dibenzo[f,h]quinoxaline (abbreviation: 2mDBTBPDBq-II) were also measured.

TABLE 1

| First electrode (anode) | | | First layer | Second layer | Third layer | Second electrode (cathode) |
|---|---|---|---|---|---|---|
| 100 nm | 50 nm | 100 nm | 1 nm | 200 nm | 1 nm | 100 nm |
| APC | ITSO | Al | Liq | ZADN:Liq (1:1) | Liq | Al |

Figure 19:
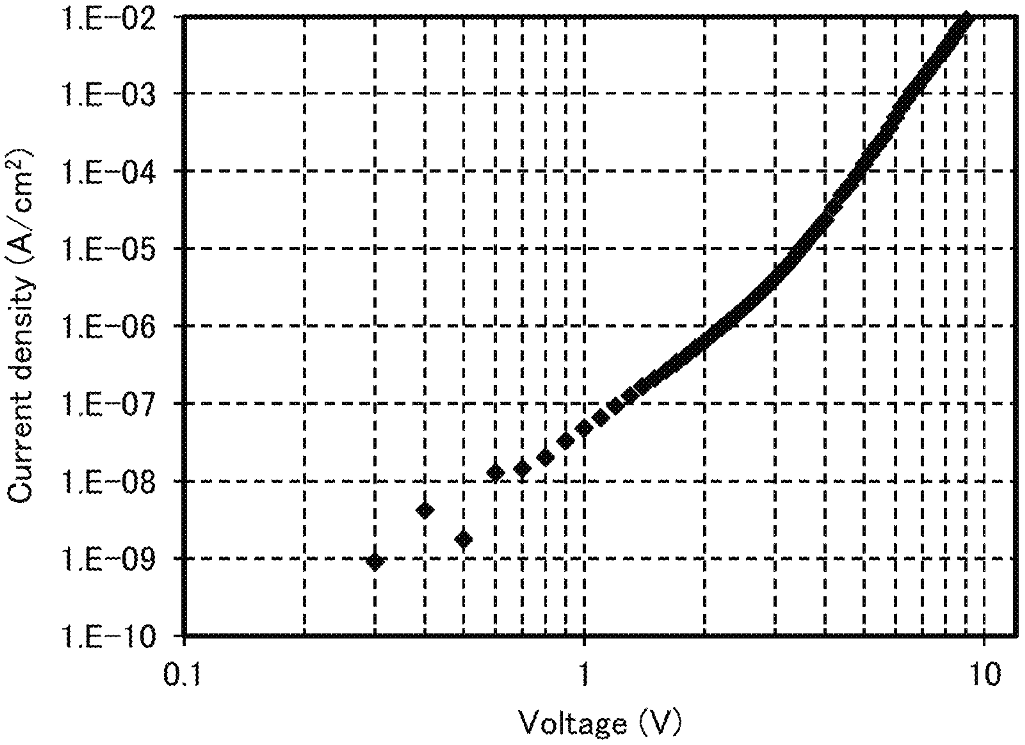
FIG. 19 is a diagram showing current density-voltage characteristics of an electron-only device.

FIG. 19 shows the current density-voltage characteristics of the electron-only device using the film formed by co-evaporation of ZADN and Liq as the second layer 911.

Figure 20:
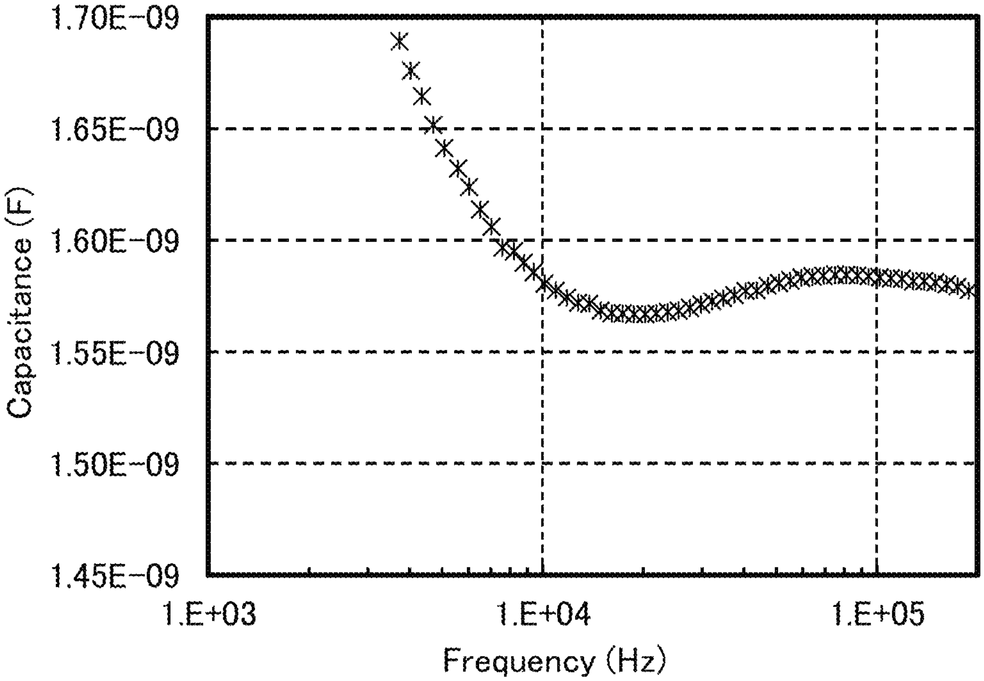
FIG. 20 is a diagram showing frequency characteristics of calculated capacitance C in the case of ZADN:Liq (1:1) at a DC power of 7.0 V.

The impedance was measured under the conditions where the DC voltage was applied in the range of 5.0 V to 9.0 V, the AC voltage was 70 mV, and the frequency was 1 Hz to 3 MHz. Here, capacitance is calculated from admittance, which is the reciprocal number of the obtained impedance (the above formula (1)). FIG. 20 shows the frequency characteristics of the calculated capacitance C at an applied voltage of 7.0 V.

The frequency characteristics of the capacitance C are obtained from a phase difference in current, which is caused because a space charge generated by carriers injected by the micro voltage signal cannot completely follow the micro AC voltage. The transit time of the carriers in the film is defined by time T taken for the injected carriers to reach the counter electrode, and is represented by the following formula (5).

[Formula 3]

$$T = \frac{4}{3}\frac{L^2}{\mu V_0} \tag{5}$$

A negative susceptance change (−ΔB) corresponds to a value (−ωΔC) obtained by multiplying a capacitance change −ΔC by angular frequency ω. According to the formula (3), there is a relation between peak frequency on the lowest frequency side $f_{max}$ (=$\omega_{max}$/2π) and the transit time T as shown in the following formula (6).

[Formula 4]

$$T = \frac{4.5}{2\pi f'_{max}} \tag{6}$$

Figure 21:
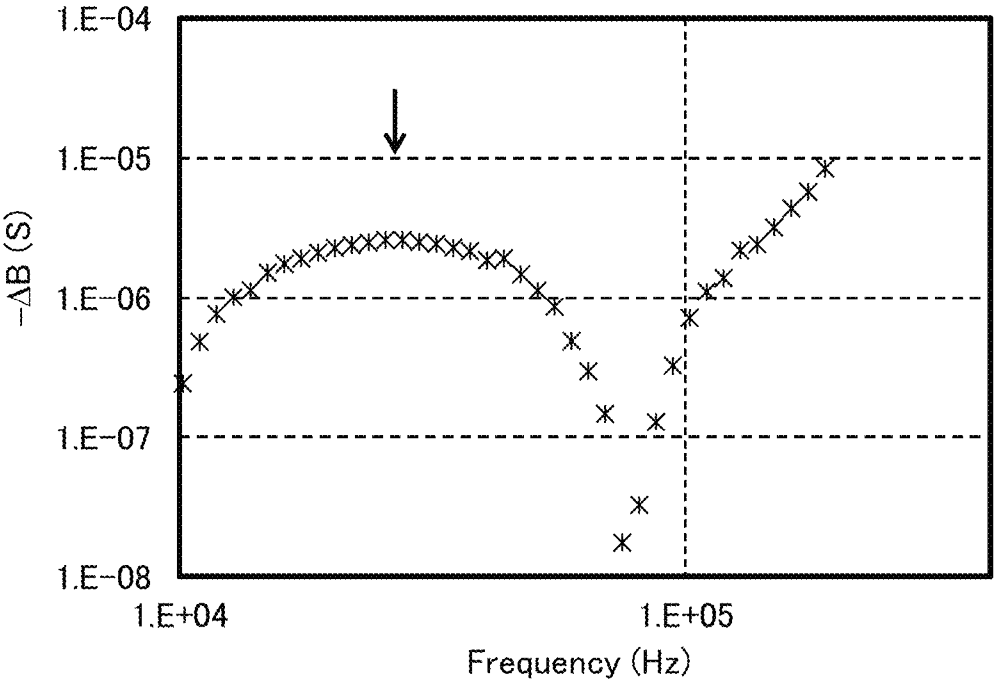
FIG. 21 is a diagram showing frequency characteristics of $-\Delta B$ in the case of ZADN:Liq (1:1) at a DC voltage of 7.0 V.

FIG. 21 shows the frequency characteristics of −ΔB calculated from the above measurement (i.e., −ΔB at a DC voltage of 7.0 V). The peak frequency on the lowest frequency side $f_{max}$ that is obtained from FIG. 21 is indicated by an arrow in the diagram.

The transit time T is obtained from $f_{max}$ obtained from the above measurement and analysis (the formula (6)); thus, in this example, the electron mobility at a voltage of 7.0 V can be obtained from the above formula (5). Through the same measurement with the DC voltage in the range of 5.0 V to 9.0 V, the electron mobility at each voltage (electric field strength) can be calculated, so that the electric field strength dependence of the mobility can also be measured.

Figure 22:
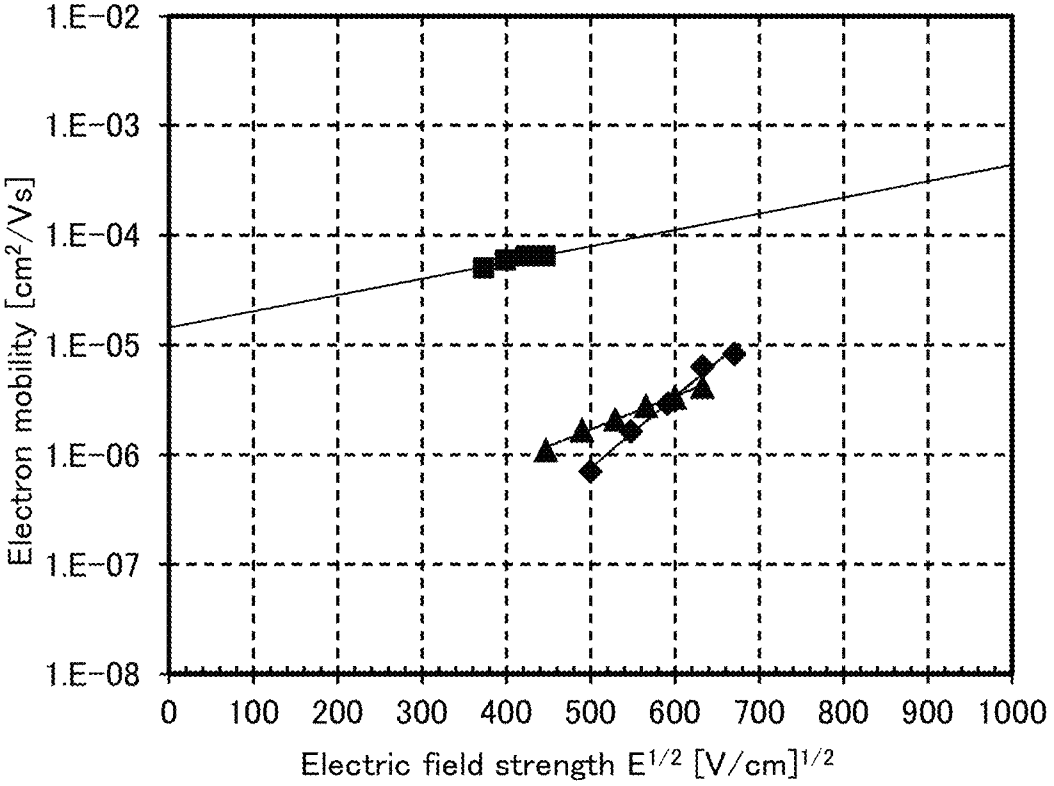
FIG. 22 is a diagram showing electric field strength dependence of electron mobility of organic compounds.

FIG. 22 shows the electric field strength dependence of the electron mobility of the organic compounds, which was eventually obtained by the above calculation method, and Table 2 shows the values of the electron mobility in the case where the square root of the electric field strength [V/cm] read from the diagram was 600 $[V/cm]^{1/2}$. In FIG. 22, a square represents the result of cgDBCzPA, a triangle represents the result of 2mDBTBPDBq-II, and a rhombus represents the result of the film formed by co-evaporation of ZADN and Liq.

TABLE 2

| | Electron mobility ($cm^2/Vs$) |
|---|---|
| cgDBCzPA | $7.7 \times 10^{-5}$ |
| 2mDBTBPDBq-II | $2.2 \times 10^{-5}$ |
| ZADN:Liq (1:1) | $3.5 \times 10^{-6}$ |

The electron mobility can be calculated as described above. For the details about the measurement method, the following reference can be referred to: T. Okachi et al., *Japanese Journal of Applied Physics*, vol. 47, No. 12, 2008, pp. 8965-8972.

Example 1

In this example, light-emitting devices that can be used for the display device of one embodiment of the present invention were fabricated and evaluation results thereof are described.

Figure 18B:
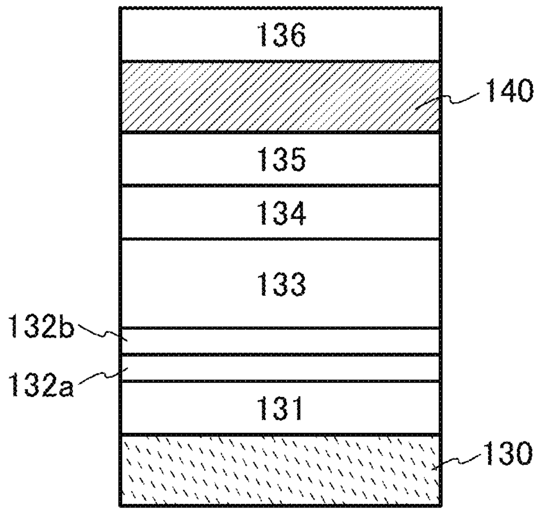
FIG. 18B is a diagram illustrating a structure of a light-emitting device in an example.

In this example, a device R1 emitting red light, a device G1 emitting green light, and a device B1 emitting blue light were fabricated as the light-emitting devices and the evaluation results thereof are described. FIG. 18B illustrates the device structure used in this example, and Table 3 shows specific structures. The chemical formulae of the materials used in this example are shown below.

TABLE 3

| | First electrode | | Hole-injection layer | Hole-transport layer | Hole-transport layer | Light-emitting layer | Electron-transport layer | | Electron-injection layer | Second electrode | Buffer layer |
|---|---|---|---|---|---|---|---|---|---|---|---|
| | 130 | | 131 | 132a | 132 b | 133 | 134 | | 135 | 140 | 136 |
| Device R1 | APC (100 nm) | ITSO (110 nm) | BBABnf:ALD-MP001Q (1:0.05 10 nm) | BBABnf (30 nm) | PCBBiF (50 nm) | * | ZADN:Liq (0.7:1 10 nm) | ZADN:Liq (1:1 25 nm) | Liq (1 nm) | Ag:Mg (1:0.1 15 nm) | DBT3P-II 80 nm |
| Device G1 | APC (100 nm) | 1TSO (85 nm) | BBABnf:ALD-MP001Q (1:0.05 10 nm) | BBABnf (10 nm) | PCBBi1BP (50 nm) | ** | ZADN:Liq (0.7:1 10 nm) | ZADN:Liq (1:1 25 nm) | Liq (1 nm) | Ag:Mg (1:0.1 15 nm) | DBT3P-II 80 nm |
| Device B1 | APC (100 nm) | ITSO (85 nm) | BBABnf:ALD-MP001Q (1:0.05 10 nm) | BBABnf (25 nm) | PCzN2 (10 nm) | *** | ZADN:Liq (0.3:1 15 nm) | ZADN:Liq (1:0.3 15 nm) | Liq (1 nm) | Ag:Mg (1:0.3 15 nm) | DBT3P-II 80 nm |

* 9mDBtBPNfpr:PCBFF:ALD-MG018Q (0.7:03:0.05 60 nm)

** 8BP-4mDBtPBfpm:βNCCP:(Ir(ppy)$_2$(mbfpypy-d$_3$)] (0.6:0.4:0.1 50 nm)

*** αN-βNPAnth:3,10PCA2Nbf(IV)-02 (1:0.015 25nm)

[Chemical Formula 1]

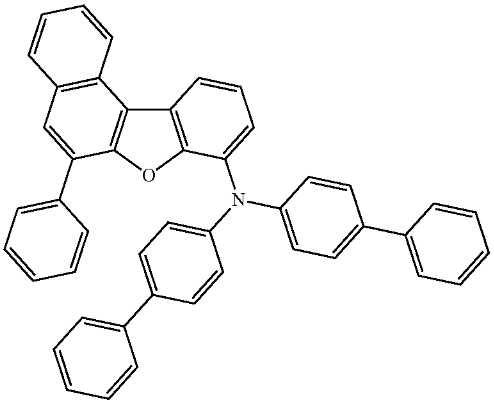

BBABnf

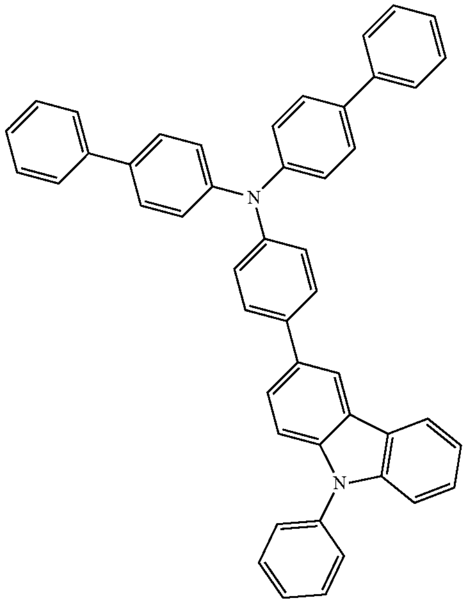

PCBBi1BP

-continued
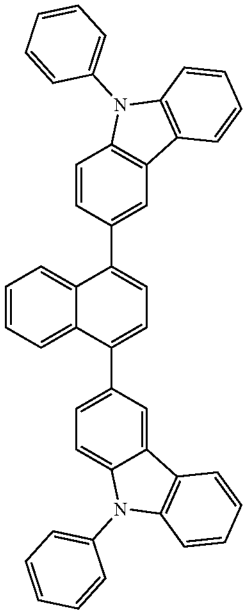
PCzN2
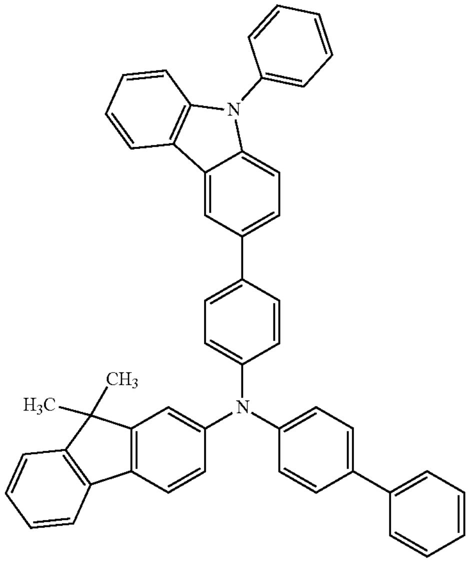
PCBBiF
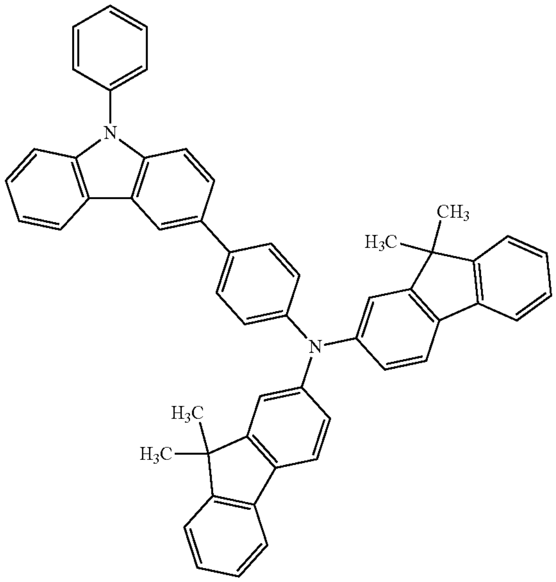
PCBFF
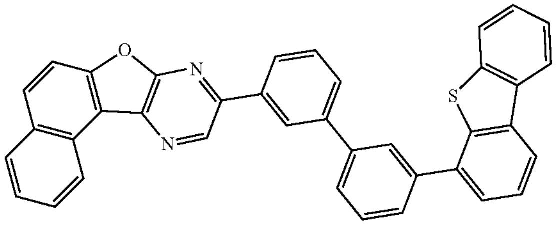
9mDBtBPNfpr
[Chemical Formula 2]
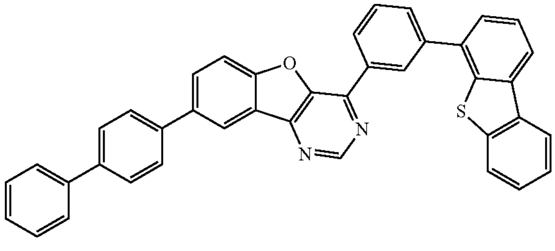
8BP-4mDBtPBfpm
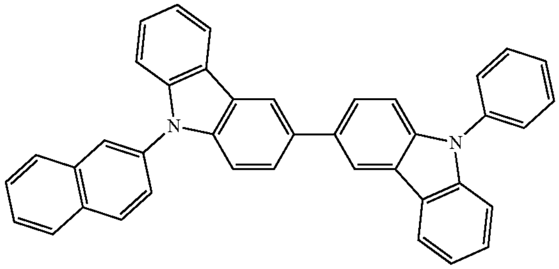
β NCCP -continued
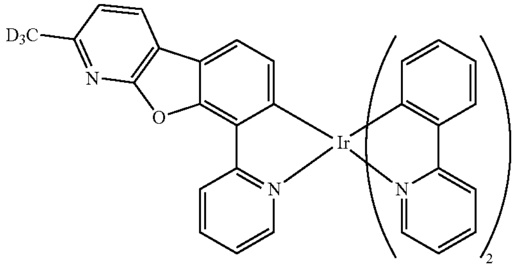
[Ir(ppy)$_2$(mbfpypy-d$_3$)]
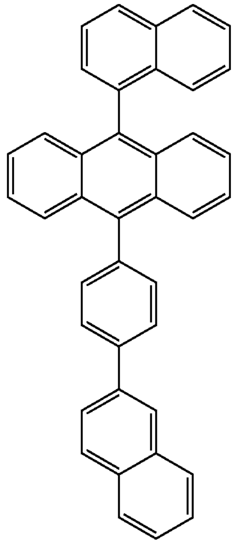
α N-β NPAnth
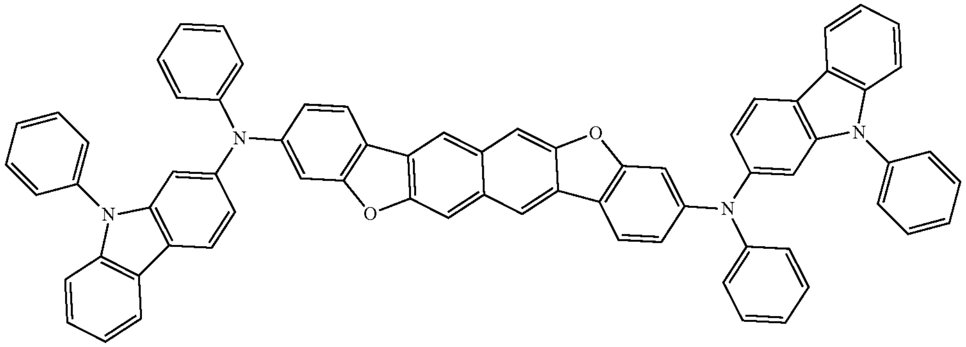
3,10PCA2Nbf(IV)-02
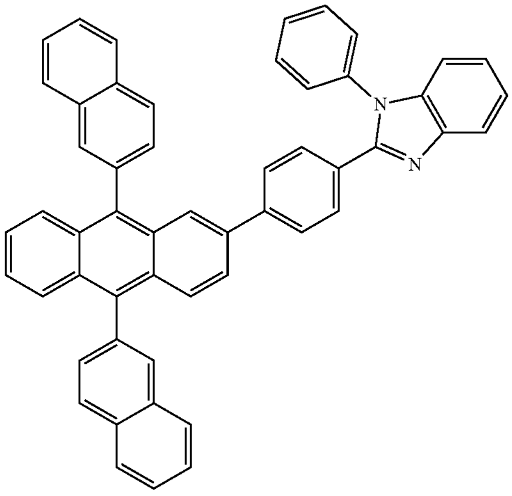
ZADN
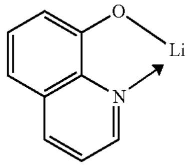
Liq -continued

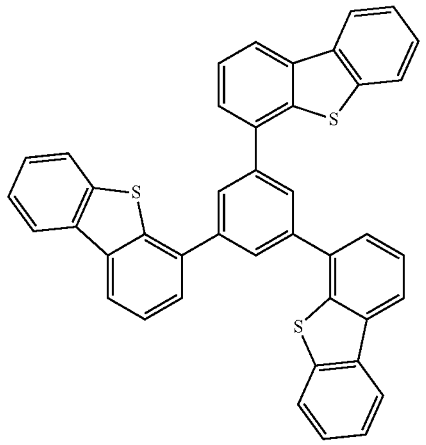

DBT3P-II

<<Fabrication of Light-Emitting Devices>>

As illustrated in FIG. 18B, the device R1, the device G1, and the device B1 fabricated in this example each have a structure in which a first electrode 130 is formed over a substrate (not illustrated), a hole-injection layer 131, a hole-transport layer 132*a*, a hole-transport layer 132*b*, a light-emitting layer 133, an electron-transport layer 134, and an electron-injection layer 135 are sequentially stacked over the first electrode 130, and a second electrode 140 is formed over the electron-injection layer 135. Each device further includes a buffer layer 136 over the second electrode 140. The buffer layer 136 has a function of reducing loss of optical energy due to a surface plasmon in the second electrode 140 (transflective electrode). Any of a variety of organic films that can be used for the light-emitting device can be employed as the buffer layer 136.

First, the first electrode 130 was formed over the substrate. The electrode area was set to 4 $mm^2$ (2 mm×2 mm). A glass substrate was used as the substrate. The first electrode 130 was formed in such a manner that an alloy of silver (Ag), palladium (Pd), and copper (Cu) (Ag—Pd—Cu (APC)) was deposited by a sputtering method and indium tin oxide containing silicon oxide (ITSO) was deposited by a sputtering method. In the device R1, APC was deposited to have a thickness of 100 nm, and ITSO was deposited to have a thickness of 110 nm. In each of the device G1 and the device B1, APC was deposited to have a thickness of 100 nm, and ITSO was deposited to have a thickness of 85 nm. In this example, the first electrode 130 functioned as an anode.

As pretreatment, a surface of the substrate was washed with water, baking was performed at 200° C. for one hour, and then UV ozone treatment was performed for 370 seconds. After that, the substrate was transferred into a vacuum evaporation apparatus in which the pressure was reduced to approximately $10^{-4}$ Pa, vacuum baking at 170° C. for 30 minutes was performed in a heating chamber in the vacuum evaporation apparatus, and then the substrate was cooled down for approximately 30 minutes.

Next, the hole-injection layer 131 was formed over the first electrode 130. The hole-injection layer 131 was formed in such a manner that after the pressure in a vacuum evaporation apparatus was reduced to $10^{-4}$ Pa, N,N-bis(4-biphenyl)-6-phenylbenzo[b]naphtho[1,2-d]furan-8-amine (abbreviation: BBABnf) and ALD-MP001Q (produced by Analysis Atelier Corporation, material serial No. 1S20180314) were co-evaporated in a weight ratio of 1:0.05 (=BBABnf:ALD-MP001Q) to have a thickness of 10 nm. ALD-MP001Q has a property of accepting electrons from BBABnf.

Then, the hole-transport layer 132*a* was formed over the hole-injection layer 131. The hole-transport layer 132*a* was formed by evaporation of BBABnf. The hole-transport layer 132*a* was formed to have a thickness of 30 nm in the device R1, formed to have a thickness of 10 nm in the device G1, and formed to have a thickness of 25 nm in the device B1.

Then, the hole-transport layer 132*b* was formed over the hole-transport layer 132*a*.

The hole-transport layer 132*b* of the device R1 was formed to have a thickness of 50 nm by evaporation of N-(1,1'-biphenyl-4-yl)-N-[4-(9-phenyl-9H-carbazol-3-yl)phenyl]-9,9-dimethyl-9H-fluoren-2-amine (abbreviation: PCBBiF).

The hole-transport layer 132*b* of the device G1 was formed to have a thickness of 50 nm by evaporation of 4,4'-diphenyl-4"-(9-phenyl-9H-carbazol-3-yl)triphenylamine (abbreviation: PCBBi1BP).

The hole-transport layer 132*b* of the device B1 was formed to have a thickness of 10 nm by evaporation of 3,3'-(naphthalen-1,4-diyl)bis(9-phenyl-9H-carbazole) (abbreviation: PCzN2).

Next, the light-emitting layer 133 was formed over the hole-transport layer 132*b*.

The light-emitting layer 133 of the device R1 was formed to have a thickness of 60 nm by co-evaporation of 9-[(3'-dibenzothiophen-4-yl)biphenyl-3-yl]naphtho[1',2':4,5]furo[2,3-b]pyrazine (abbreviation: 9mDBtBPNfpr), N-[4-(9-phenyl-9H-carbazol-3-yl)phenyl]-bis(9,9-dimethyl-9H-fluoren-2-yl)amine (abbreviation: PCBFF), and ALD-MG018Q (produced by Analysis Atelier Corporation, material serial No. 1S20161025) in a weight ratio of 0.7:0.3:0.05 (=9mDBtBPNfpr:PCBFF:ALD-MG018Q). ALD-MG018Q is a red-light-emitting substance.

The light-emitting layer 133 of the device G1 was formed to have a thickness of 50 nm by co-evaporation of 8-(1,1'-biphenyl-4-yl)-4-[3-(dibenzothiophen-4-yl)phenyl]-[1]benzofuro[3,2-d]pyrimidine (abbreviation: 8BP-4mDBtPBfpm), 9-(2-naphthyl)-9'-phenyl-9H,9'H-3,3'-bicarbazole (abbreviation: βNCCP), and [2-d3-methyl-(2-pyridinyl-κN)benzofuro[2,3-b]pyridine-κC]bis[2-(2-pyridinyl-κN)phenyl-KC]iridium(III) (abbreviation: [Ir$(ppy)_2(mbfpypy\text{-}d_3)$]) in a weight ratio of 0.6:0.4:0.1 (=8BP- 4mDBtPBfpm: βNCCP: [$Ir(ppy)_2(mbfpypy-d_3)$]). [$Ir(ppy)_2(mbfpypy-d_3)$] is a green-light-emitting substance.

The light-emitting layer 133 of the device B1 was formed to have a thickness of 25 nm by co-evaporation of 9-(1-naphthyl)-10-[4-(2-naphthyl)phenyl]anthracene (abbreviation: α,N-βNPAnth) and 3,10-bis[N-(9-phenyl-9H-carbazol-2-yl)-N-phenylamino]naphtho[2,3-b;6,7-b']bisbenzofuran (abbreviation: 3,10PCA2Nbf(IV)-02) in a weight ratio of 1:0.015 (=α,N-βNPAnth:3,10PCA2Nbf(IV)-02). Note that 3,10PCA2Nbf(IV)-02 is a blue-light-emitting substance.

Next, the electron-transport layer 134 was formed over the light-emitting layer 133. The electron-transport layer 134 of the light-emitting device of this example has a stacked-layer structure of two layers that differ in the mixture ratio of 2-{4-[9,10-di(naphthalen-2-yl)-2-anthryl]phenyl}-1-phenyl-1H-benzimidazole (abbreviation: ZADN) and 8-quinolinolato-lithium (abbreviation: Liq). Specifically, in the electron-transport layer 134, the cathode (the second electrode 140) side has a smaller Liq content than the anode (the first electrode 130) side.

Specifically, the electron-transport layer 134 of the device R1 and the device G1 was formed in such a manner that ZADN and Liq were co-evaporated in a weight ratio of 0.7:1 (=ZADN:Liq) to have a thickness of 10 nm, and then ZADN and Liq were co-evaporated in a weight ratio of 1:1 (=ZADN:Liq) to have a thickness of 25 nm. The electron-transport layer 134 of the device B1 was formed in such a manner that ZADN and Liq were co-evaporated in a weight ratio of 0.3:1 (=ZADN:Liq) to have a thickness of 15 nm, and then ZADN and Liq were co-evaporated in a weight ratio of 1:0.3 (=ZADN:Liq) to have a thickness of 15 nm.

Then, the electron-injection layer 135 was formed over the electron-transport layer 134. The electron-injection layer 135 was formed to have a thickness of 1 nm by evaporation of Liq.

Then, the second electrode 140 was formed over the electron-injection layer 135. The second electrode 140 was formed to have a thickness of 15 nm by co-evaporation of sliver (Ag) and magnesium (Mg) in a volume ratio of 1:0.1 (=Ag:Mg). Note that in this example, the second electrode 140 functioned as a cathode.

Then, the buffer layer 136 was formed over the second electrode 140. The buffer layer 136 was formed to have a thickness of 80 nm by evaporation of 4,4',4"-(benzene-1,3,5-triyl)tri(dibenzothiophene) (abbreviation: DBT3P-II).

Through the above steps, the light-emitting devices in each of which an EL layer was provided between the pair of electrodes over the substrate were formed. Note that in all the evaporation steps in the above fabrication method, an evaporation method by a resistance-heating method was used.

The light-emitting device fabricated as described above was sealed using a different substrate (not illustrated). At the time of the sealing using the different substrate (not illustrated), the different substrate (not illustrated) on which an adhesive that is solidified by ultraviolet light was applied was fixed onto the substrate in a glove box containing a nitrogen atmosphere, and the substrates were bonded to each other such that the adhesive was attached to the periphery of the light-emitting device formed over the substrate. At the time of the sealing, the adhesive was irradiated with 365-nm ultraviolet light at 6 $J/cm^2$ to be solidified, and the adhesive was subjected to heat treatment at 80° C. for one hour to be stabilized.

<<Operation Characteristics of Light-Emitting Devices>>

The operation characteristics of the device R1, the device G1, and the device B1 were measured. Note that the measurement was carried out at room temperature (in an atmosphere maintained at 25° C.).

Figure 23:
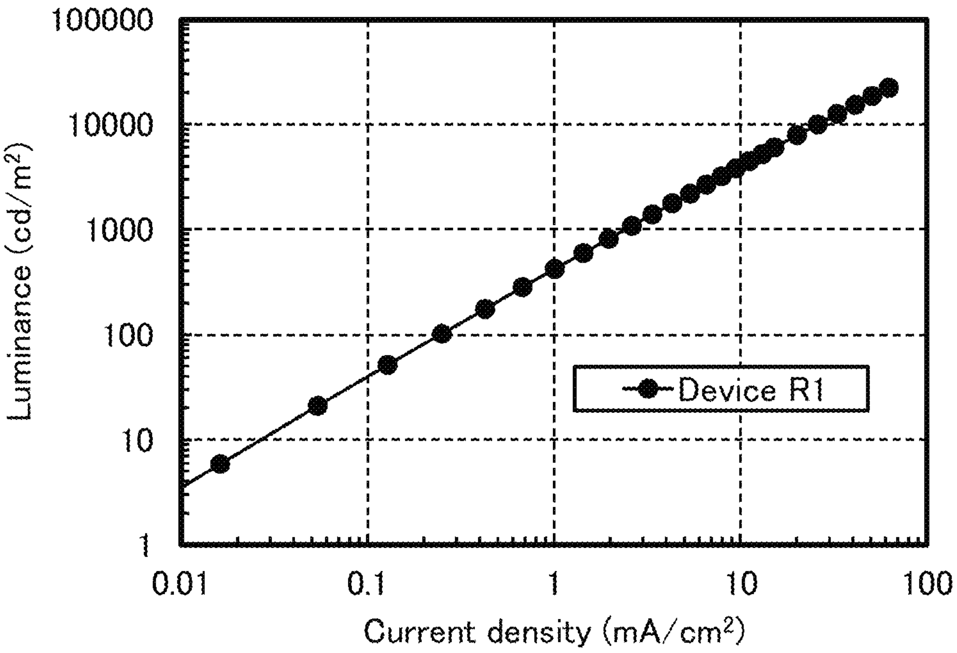
FIG. 23 is a diagram showing luminance-current density characteristics.
Figure 24:
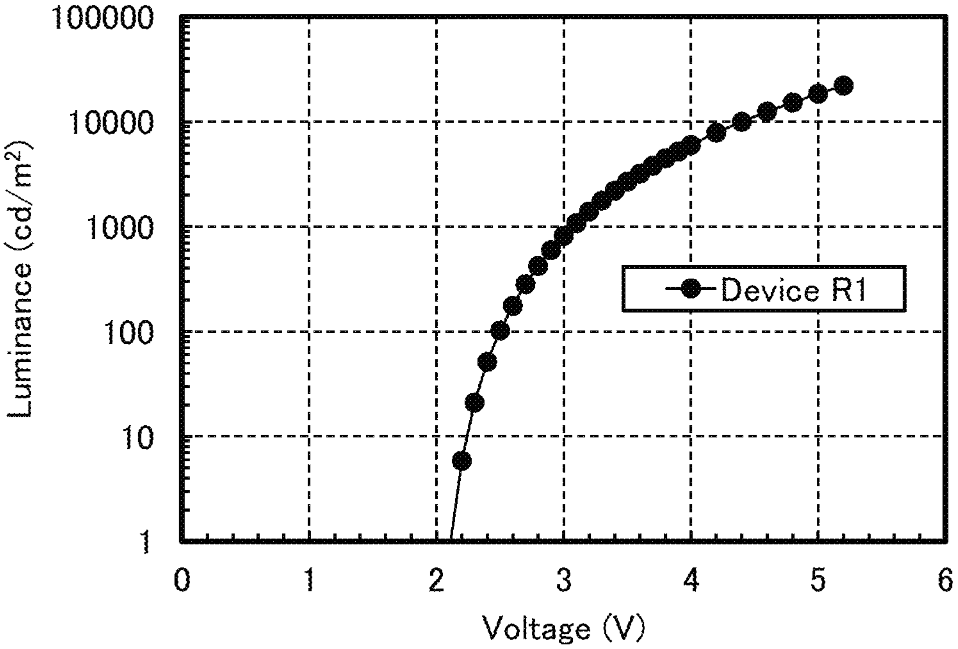
FIG. 24 is a diagram showing luminance-voltage characteristics.
Figure 25:
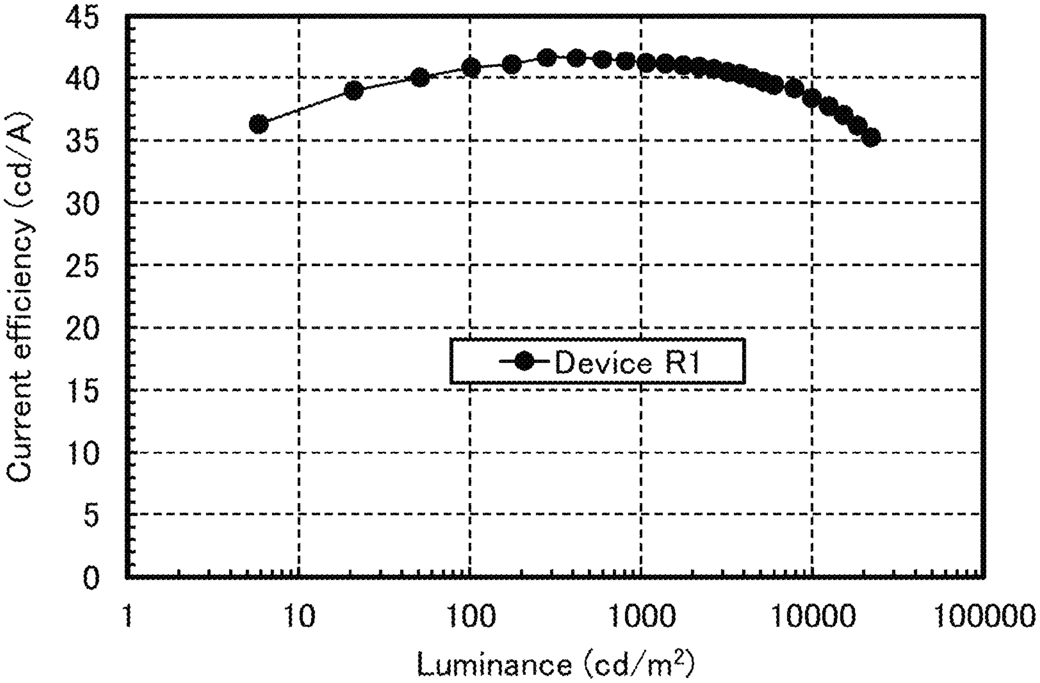
FIG. 25 is a diagram showing current efficiency-luminance characteristics.
Figure 26:
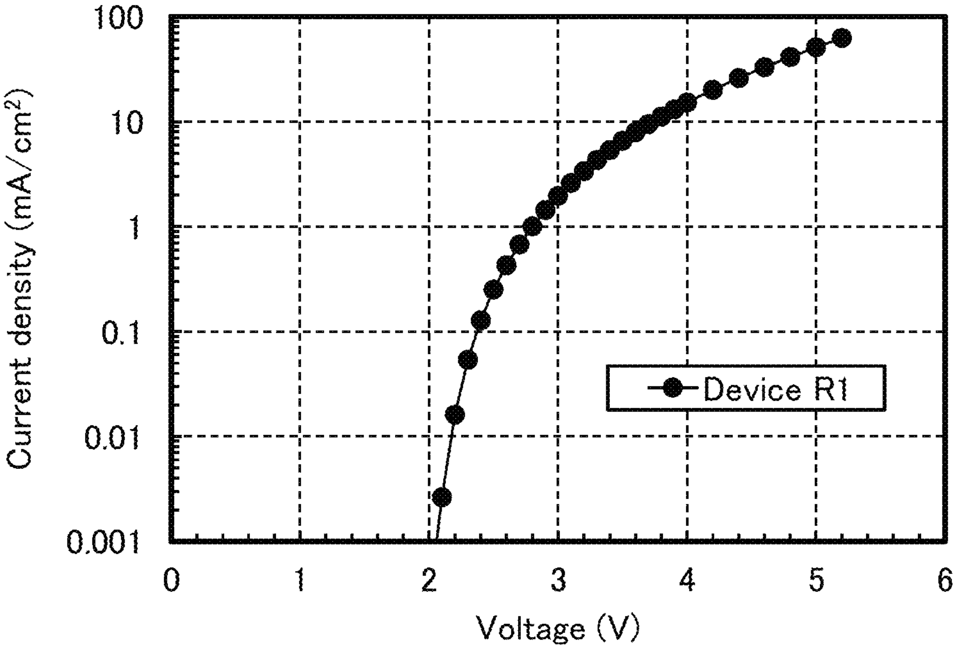
FIG. 26 is a diagram showing current density-voltage characteristics.
Figure 27:
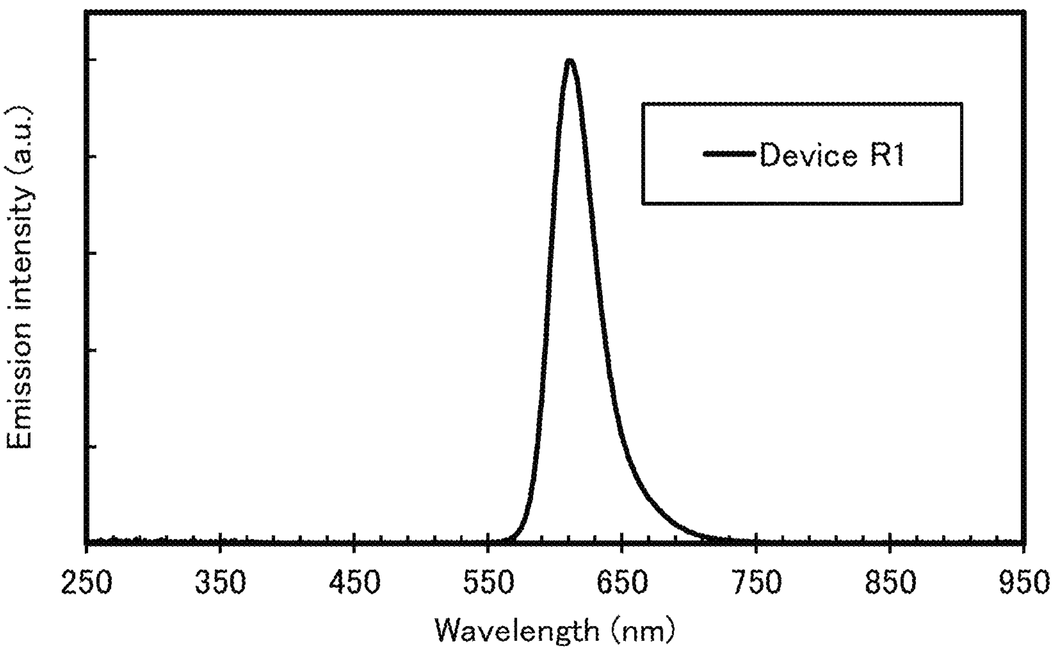
FIG. 27 is a diagram showing an emission spectrum.

FIG. 23 to FIG. 27 show the characteristics of the device R1. FIG. 23 is a diagram showing the luminance-current density characteristics of the device R1. FIG. 24 is a diagram showing the luminance-voltage characteristics of the device R1. FIG. 25 is a diagram showing the current efficiency-luminance characteristics of the device R1. FIG. 26 is a diagram showing the current density-voltage characteristics of the device R1. FIG. 27 is a diagram showing an emission spectrum when current at a current density of 5 $mA/cm^2$ was supplied to the device R1.

Figure 28:
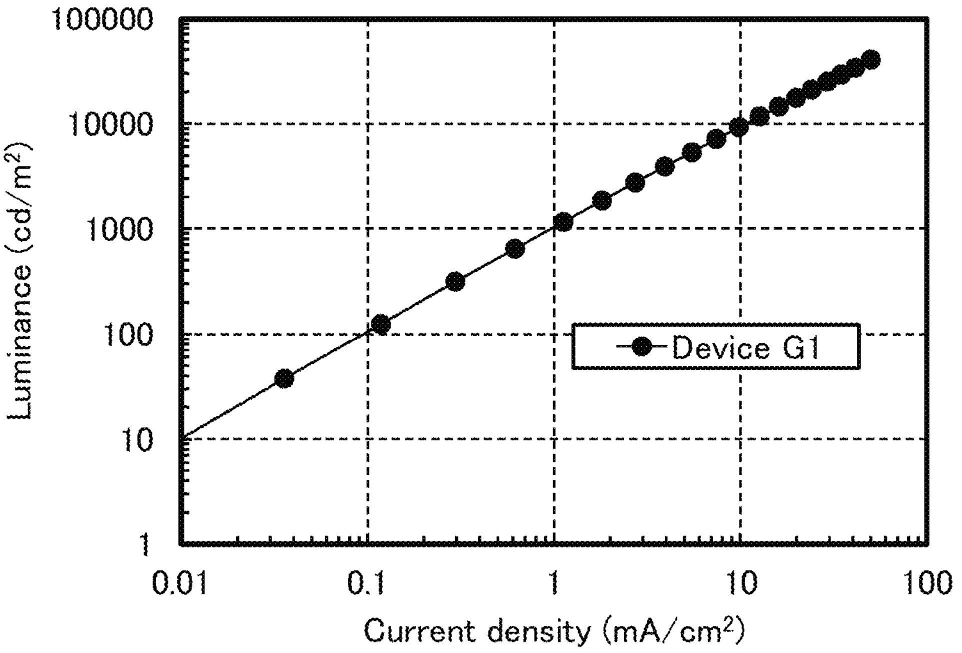
FIG. 28 is a diagram showing luminance-current density characteristics.
Figure 29:
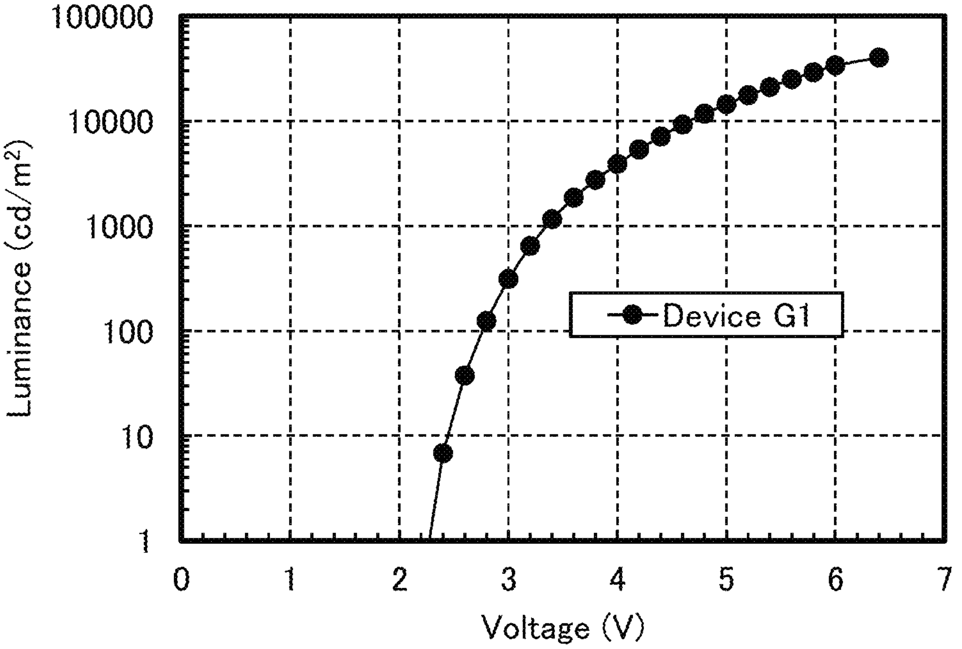
FIG. 29 is a diagram showing luminance-voltage characteristics.
Figure 30:
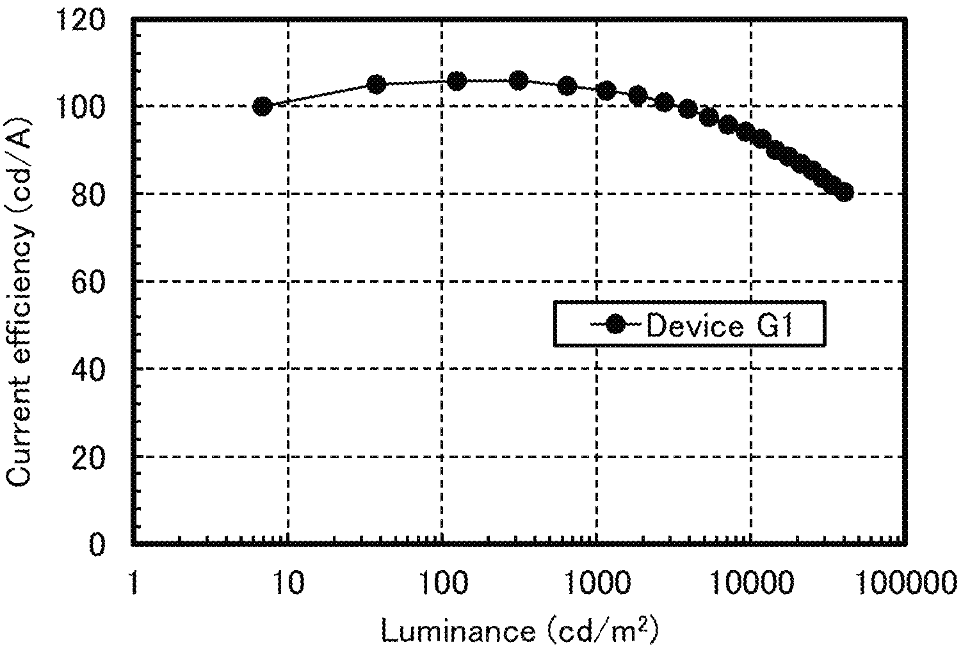
FIG. 30 is a diagram showing current efficiency-luminance characteristics.
Figure 31:
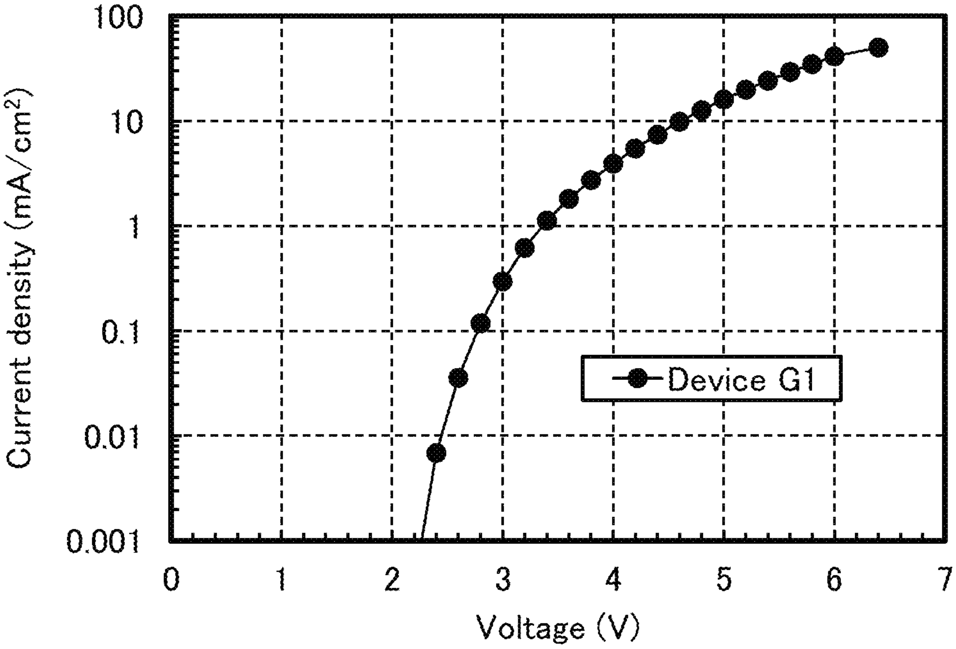
FIG. 31 is a diagram showing current density-voltage characteristics.
Figure 32:
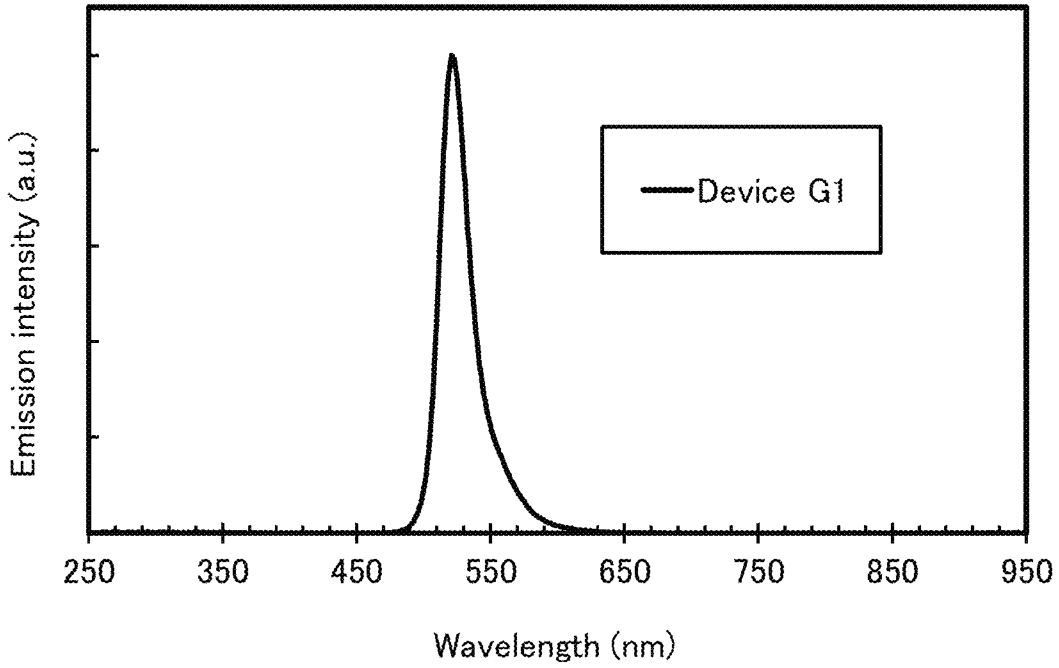
FIG. 32 is a diagram showing an emission spectrum.

FIG. 28 to FIG. 32 show the characteristics of the device G1. FIG. 28 is a diagram showing the luminance-current density characteristics of the device G1. FIG. 29 is a diagram showing the luminance-voltage characteristics of the device G1. FIG. 30 is a diagram showing the current efficiency-luminance characteristics of the device G1. FIG. 31 is a diagram showing the current density-voltage characteristics of the device G1. FIG. 32 is a diagram showing an emission spectrum when current at a current density of 5 $mA/cm^2$ was supplied to the device G1.

Figure 33:
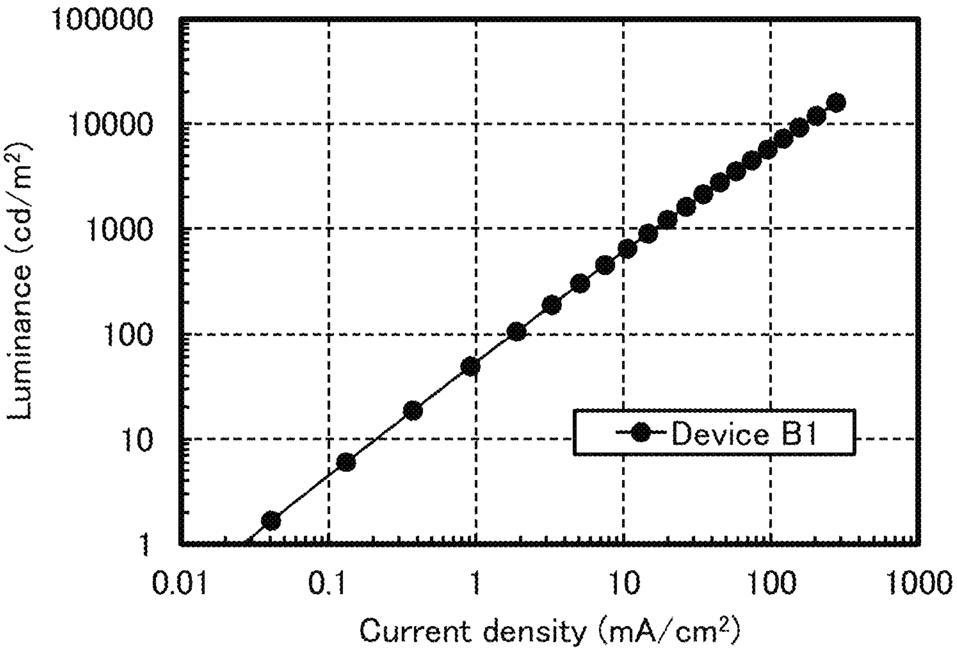
FIG. 33 is a diagram showing luminance-current density characteristics.
Figure 34:
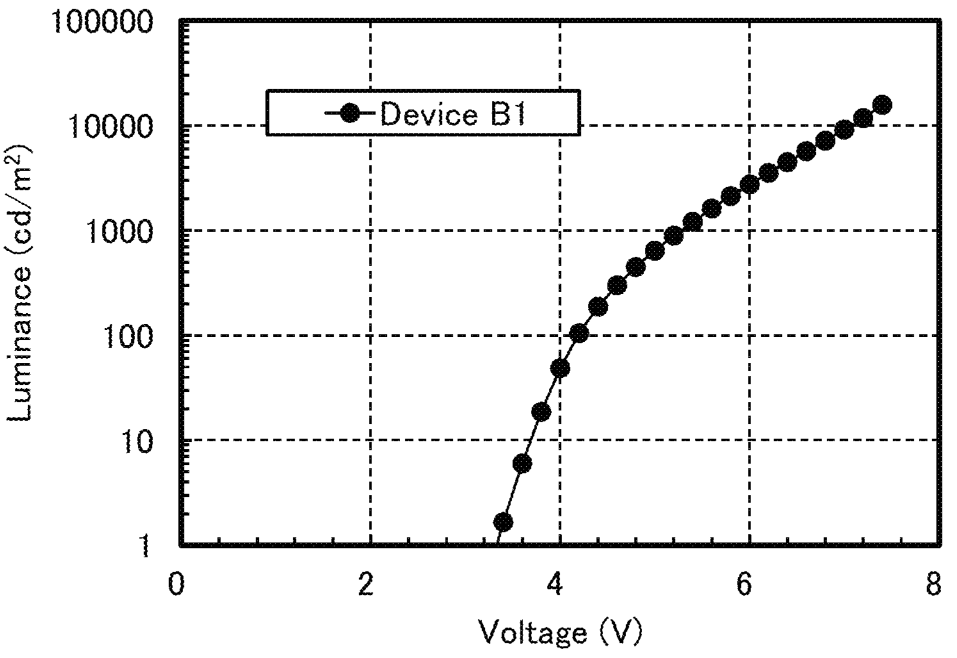
FIG. 34 is a diagram showing luminance-voltage characteristics.
Figure 35:
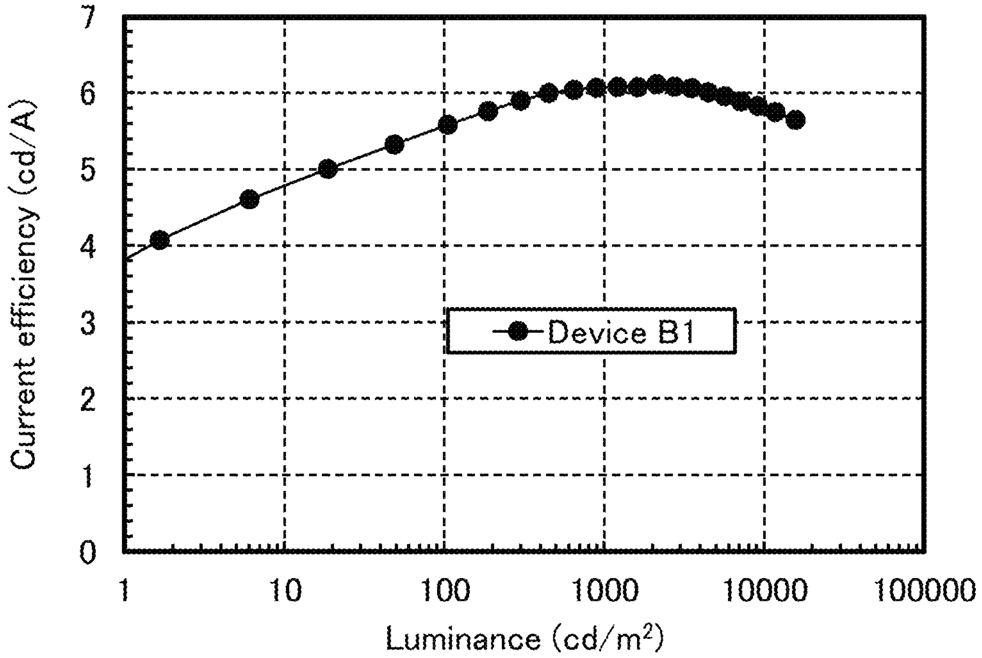
FIG. 35 is a diagram showing current efficiency-luminance characteristics.
Figure 36:
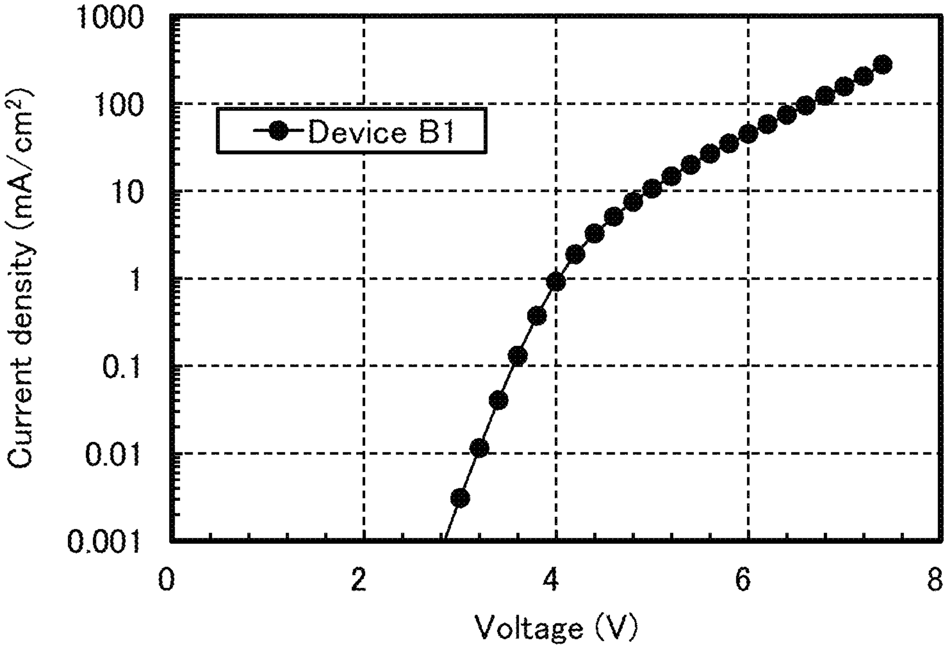
FIG. 36 is a diagram showing current density-voltage characteristics.
Figure 37:
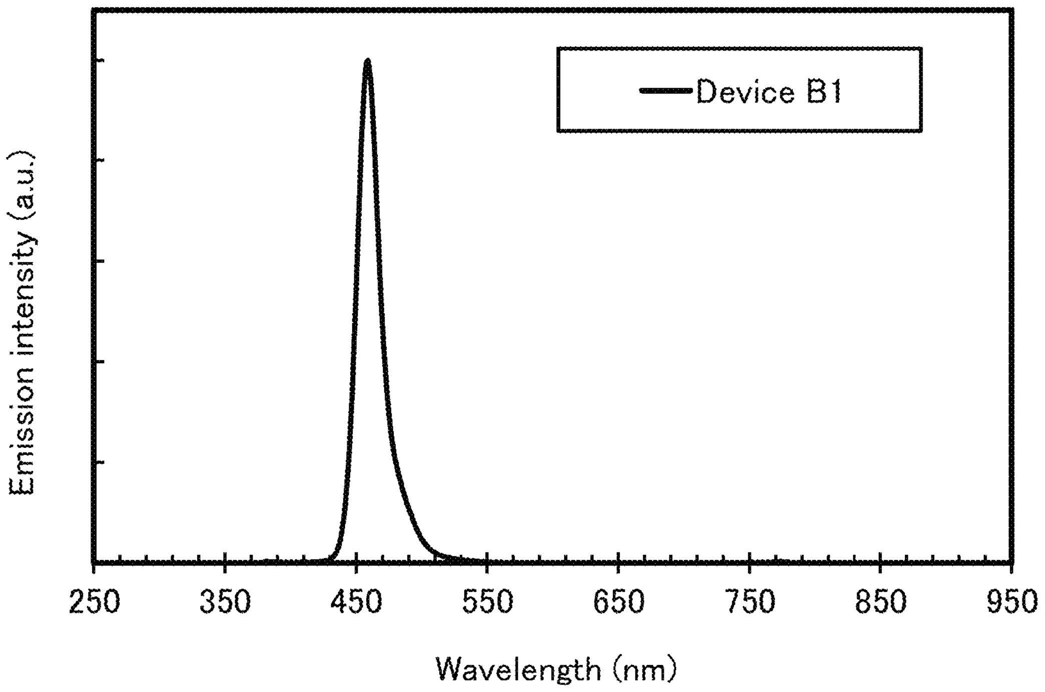
FIG. 37 is a diagram showing an emission spectrum.

FIG. 33 to FIG. 37 show the characteristics of the device B1. FIG. 33 is a diagram showing the luminance-current density characteristics of the device B1. FIG. 34 is a diagram showing the luminance-voltage characteristics of the device B1. FIG. 35 is a diagram showing the current efficiency-luminance characteristics of the device B1. FIG. 36 is a diagram showing the current density-voltage characteristics of the device B1. FIG. 37 is a diagram showing an emission spectrum when current at a current density of 14.7 $mA/cm^2$ was supplied to the device B1.

Table 4 shows the initial values of main characteristics of the respective light-emitting devices at around 1000 $cd/m^2$.

TABLE 4

| | Voltage (V) | Current (mA) | Current density ($mA/cm^2$) | Chromaticity x | Chromaticity y | Luminance ($cd/m^2$) | Current efficiency (cd/A) |
|---|---|---|---|---|---|---|---|
| Device R1 | 3.1 | 0.1 | 2.6 | 0.66 | 0.34 | 1075 | 41 |
| Device G1 | 3.1 | 0.04 | 1.1 | 0.19 | 0.77 | 1162 | 104 |
| Device B1 | 5.2 | 0.6 | 15 | 0.14 | 0.05 | 894 | 6.1 |

As shown in Table 4, it was found that each of the devices R1, G1, and B1 exhibited light emission with high color purity and had high efficiency.

As shown in FIG. 27, the device R1 exhibited an emission spectrum having a maximum peak at around 610 nm. Furthermore, as shown in FIG. 32, the device G1 exhibited an emission spectrum having a maximum peak at around 521 nm. Moreover, as shown in FIG. 37, the device B1 exhibited an emission spectrum having a maximum peak at around 459 nm.

<<Reliability Characteristics of Light-Emitting Devices>>

Figure 38:
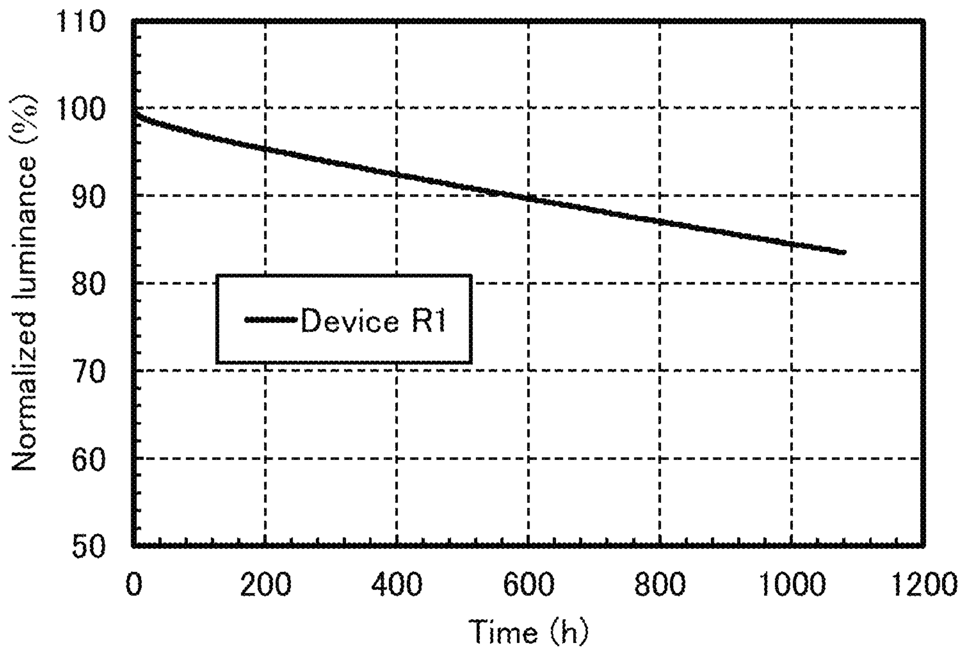
FIG. 38 is a diagram showing a result of a reliability test.
Figure 39:
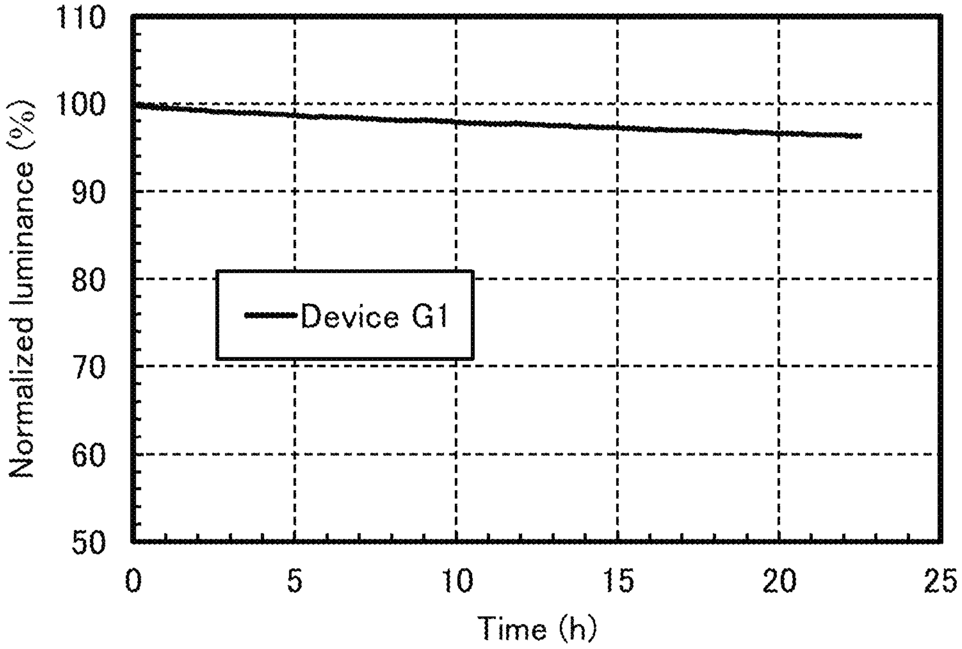
FIG. 39 is a diagram showing a result of a reliability test.
Figure 40:
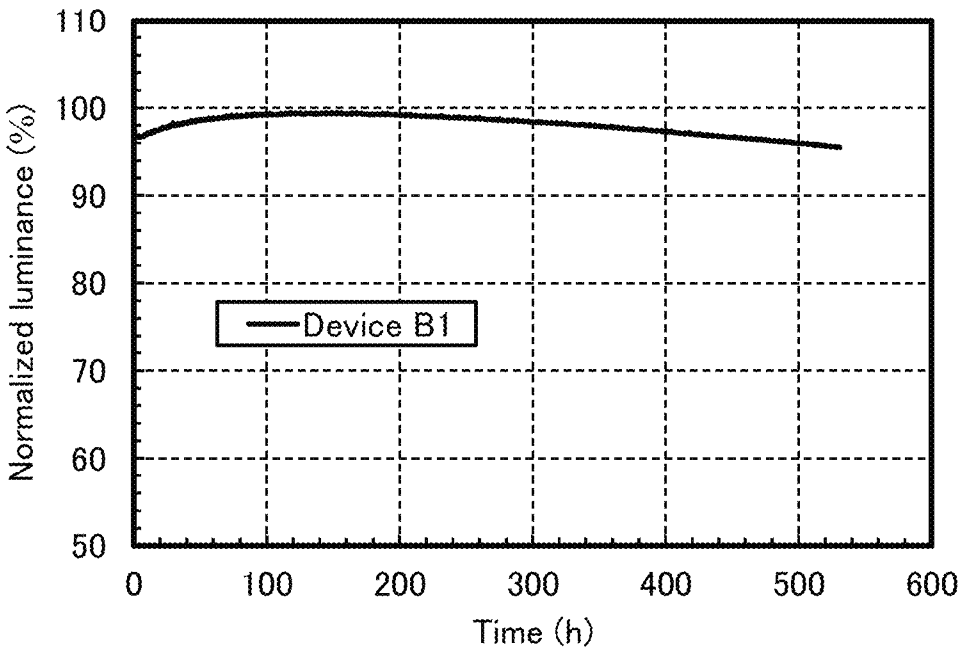
FIG. 40 is a diagram showing a result of a reliability test.

Next, a reliability test was performed on each light-emitting device. FIG. 38 to FIG. 40 show the results of the reliability test. In each of FIG. 38 to FIG. 40, the vertical axis represents normalized luminance (%) with an initial luminance of 100%, and the horizontal axis represents driving time (h). Note that in the reliability test of the light-emitting devices, the device R1 was driven at a current density set to 75 mA/cm$^2$ and the devices G1 and B1 were driven at a current density set to 50 mA/cm$^2$.

It was found from FIG. 38 that the normalized luminance of the device R1 after 1080 hours was 84%. It was found from FIG. 39 that the normalized luminance of the device G1 after 23 hours was 96%. It was found from FIG. 40 that the normalized luminance of the device B1 after 530 hours was 95%.

It was found that the devices R1, G1, and B1 each showed behavior with a small initial decay.

As described above, any of the fabricated light-emitting devices emitting red light, green light, and blue light had a long driving lifetime by employing the ReSTI structure in this example. In addition, either of the fabricated light-emitting devices exhibiting fluorescence and phosphorescence had a long driving lifetime by employing the ReSTI structure in this example.

The three light-emitting devices fabricated in this example included the light-emitting layers containing different materials from each other. Meanwhile, the three light-emitting devices included the layers containing the same material, and further the layers containing the same material and having the same thickness. Therefore, it was suggested that, in fabrication of the display device of one embodiment of the present invention, light-emitting devices having a long driving lifetime were able to be fabricated through fewer fabrication steps by provision of a common layer for the light-emitting devices of three colors.

Example 2

In this example, light-emitting devices that can be used for the display device of one embodiment of the present invention were fabricated and evaluation results thereof are described.

In this example, a device R2 emitting red light, a device G2 emitting green light, and a device B2 emitting blue light were fabricated as the light-emitting devices and the evaluation results thereof are described. FIG. 18B illustrates the device structure used in this example, and Table 5 shows specific structures.

Note that Example 1 can be referred to for the fabrication method of the light-emitting devices in this example. The chemical formulae of the materials used in this example are shown below. Note that the chemical formulae of the materials shown above are not shown here.

TABLE 5

| | First electrode | | Hole-injection layer | Hole-transport layer | Hole-transport layer | Light-emitting layer | Electron-transport layer | | Electron-injection layer | Second electrode | Buffer layer |
|---|---|---|---|---|---|---|---|---|---|---|---|
| | 130 | | 131 | 132a | 132b | 133 | 134 | | 135 | 140 | 136 |
| Device R2 | APC (100 nm) | ITSO (110 nm) | BBABnf:ALD-MP001Q (1:0.05 10 nm) | BBABnf (30 nm) | PCBBiF (70 nm) | * | ZADN:Liq (0.3:1 17.5 nm) | ZADN:Liq (1:0.3 17.5 nm) | Liq (1 nm) | Ag:Mg (1:0.3 15 nm) | DBT3P-II 80 nm |
| Device G2 | APC (100 nm) | 1TSO (85 nm) | BBABnf:ALD-MP001Q (1:0.05 10 nm) | BBABnf (10 nm) | PCBBi1BP (50 nm) | ** | ZADN:Liq (0.3:1 17.5 nm) | ZADN:Liq (1:0.3 17.5 nm) | Liq (1 nm) | Ag:Mg (1:0.3 15 nm) | DBT3P-II 80 nm |
| Device B2 | APC (100 nm) | ITSO (85 nm) | BBABnf:ALD-MP001Q (1:0.05 10 nm) | BBABnf (25 nm) | PCzN2 (10 nm) | *** | ZADN:Liq (0.7:1 12.5 nm) | ZADN:Liq (1:0.7 12.5 nm) | Liq (1 nm) | Ag:Mg (1:0.1 15 nm) | DBT3P-II 80 nm |

* 9mDBtBPNfpr:PCBBiF:ALD-MG018Q (0.7:0.3:0.05 60 nm)

** 8BP-4mDBtPBfpm:βNCCP:[Ir(ppy)$_2$(mbfpypy)] (0.6:0.4:0.1 50 nm)

*** αN-βNPAnth:3,10PCA2Nbf(IV)-02 (1:0.015 25 nm)

[Chemical Formula 3]

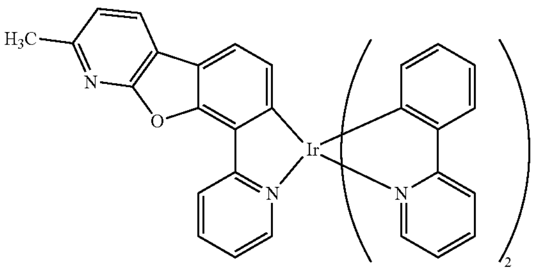

[Ir(ppy)$_2$(mbfpypy)]

As shown in Table 5, the electron-transport layer 134 of the light-emitting devices in this example has a stacked-layer structure of two layers that differ in the mixture ratio of ZADN and Liq. Specifically, in the electron-transport layer 134 of each of the light-emitting devices of this example, the cathode (the second electrode 140) side has a smaller Liq content than the anode (the first electrode 130) side.

The light-emitting layer 133 of the device G3 was formed to have a thickness of 50 nm by co-evaporation of 8BP-4mDBtPBfpm, βNCCP, and [2-methyl-(2-pyridinyl-κN)benzofuro[2,3-b]pyridine-κC]bis[2-(2-pyridinyl-κN)phenyl-κC]iridium(III) (abbreviation: [Ir(ppy)$_2$(mbfpypy)]) in a weight ratio of 0.6:0.4:0.1 (=8BP-4mDBtPBfpm:βNCCP:[Ir(ppy)$_2$(mbfpypy)]).

The device R2 emitting red light, the device G2 emitting green light, and the device B2 emitting blue light in this example were fabricated to have chromaticity of emission color substantially the same as that of a subpixel of a commercial display device (smartphone) using organic EL devices.

<<Reliability Characteristics of Light-Emitting Devices>>

Figure 41:
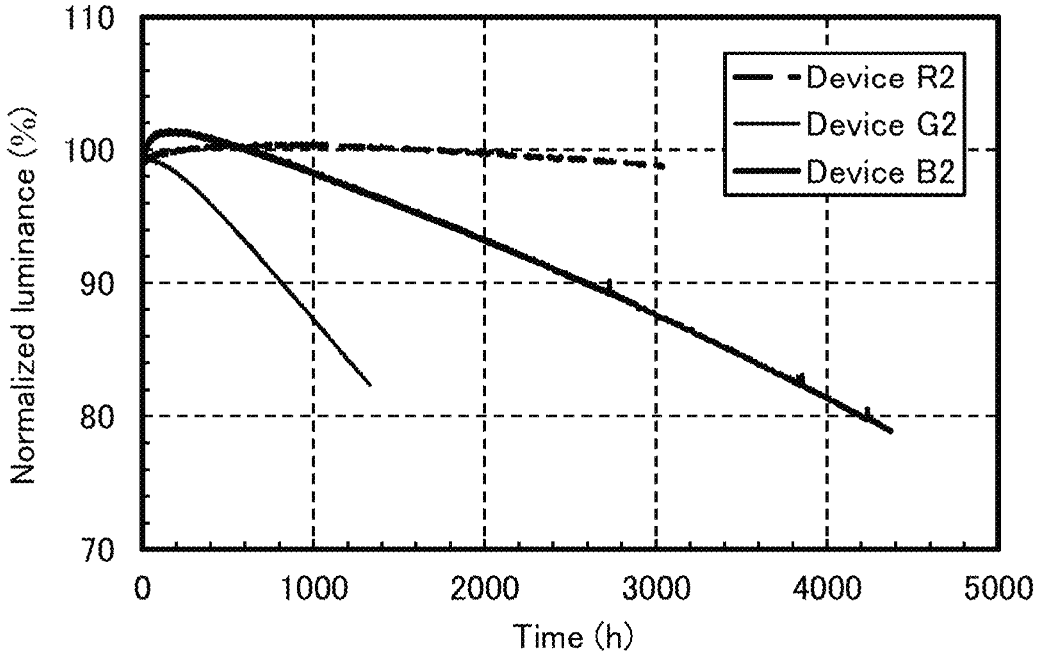
FIG. 41 is a diagram showing a result of a reliability test.

A reliability test was performed on each light-emitting device. FIG. 41 shows the results of the reliability test. In FIG. 41, the vertical axis represents normalized luminance (%) with an initial luminance of 100%, and the horizontal axis represents driving time (h).

Note that in this example, the reliability test was performed in such a manner that the device R2 emitting red light, the device G2 emitting green light, and the device B2 emitting blue light were made to emit light with luminance and chromaticity substantially the same as those of the light-emitting devices (organic EL devices) in the subpixels of the commercial display device (smartphone). As for the luminance of the light-emitting devices of the respective colors in the commercial display device, which were made to independently emit light with brightness set to the gray scale level of 255/255 (brightness 100%), red (R) was 108 cd/$m^2$, green (G) was 354 cd/$m^2$, and blue (B) was 32.9 cd/$m^2$. As for the aperture ratio of the subpixel in the commercial display device, red was 4.5%, green was 4.3%, and blue was 6.8%. The luminance in each of the subpixels (RGB) is calculated from the aperture ratio and the luminance of each of RGB in the display device. Finally, on the assumption that the transmittance including a circular polarizing plate is 40% (the luminance in each of the subpixels (RGB) is divided by 0.4), the luminance when each of the devices R2, G2, and B2 is driven can be determined. Note that a color filter and a circular polarizing plate are provided for each subpixel in the commercial display device, and the chromaticity and the luminance of each organic EL device were measured using light extracted through them. Also in the light-emitting devices of this example, color filters that transmit light of corresponding colors were provided over the light-emitting devices, and the chromaticity and the luminance of the light-emitting devices were measured using light extracted through the color filters.

Table 6 shows driving conditions in the reliability test of the light-emitting devices. That is, the devices R2, G2, and B2 were driven at a constant current with an initial luminance of 6580 cd/$m^2$, 200000 cd/$m^2$, and 1450 cd/$m^2$, respectively.

TABLE 6

| | Initial voltage (V) | Constant current value (mA) | Chromaticity x | Chromaticity y | Luminance (cd/$m^2$) | Current efficiency (cd/A) |
|---|---|---|---|---|---|---|
| Device R2 | 6.2 | 0.670 | 0.68 | 0.32 | 6580 | 42 |
| Device G2 | 6.6 | 0.680 | 0.27 | 0.71 | 20000 | 118 |
| Device B2 | 5.3 | 0.879 | 0.14 | 0.06 | 1450 | 6.0 |

As shown in FIG. 41, LT95 (a time taken for the luminance to decrease to 95% of the initial luminance) of the device R2 was 3000 hours or longer, LT95 of the device G2 was 480 hours, and LT95 of the device B2 was 1640 hours.

In general, of red-, green-, and blue-light-emitting devices, the driving lifetime of the blue-light-emitting device tends to be the shortest; however, of the light-emitting devices of this example, the driving lifetime of the blue-light-emitting device was the second longest after that of the red-light-emitting device. In this example, the light-emitting device that emits blue light employs the light-emitting layer that exhibits fluorescence and the ReSTI structure. This probably inhibits the initial decay of the light-emitting device that emits blue light and extremely extends the driving lifetime.

In the case where the light-emitting devices of RGB should have an equivalent emission lifetime, the necessary luminance can be changed by changing the aperture ratio of the subpixel of each color; thus, the emission lifetime can be adjusted. The effect of inhibiting initial decay can be expected also in this case; thus, it can be said that manufacture of a long-life light-emitting device of each color is possible. The lifetime of the blue fluorescent device employing the ReSTI structure is extremely long; thus, in the case of an OLED display, the aperture ratio of the blue subpixel can be lower than that in a conventional OLED display. Furthermore, since a red phosphorescent device employing the ReSTI structure and ExTET also has an extremely long lifetime, the aperture ratio of the red subpixel can be the lowest of the RGB subpixels. The aperture ratio of the green subpixel is made the highest of the RGB subpixels, whereby the total lifetime can be extended while white display balance is kept. Low aperture ratios of the blue and red subpixels are advantageous also in increasing definition of a display device with pentile arrangement.

As described above, any of the fabricated light-emitting devices emitting red light, green light, and blue light had a long driving lifetime by employing the ReSTI structure in this example. In addition, either of the fabricated light-emitting devices exhibiting fluorescence and phosphorescence had a long driving lifetime by employing the ReSTI structure in this example.

The three light-emitting devices fabricated in this example included the light-emitting layers containing different materials from each other. Meanwhile, the three light-emitting devices included the layers containing the same material, and further the layers containing the same material and having the same thickness. Therefore, it was suggested that, in fabrication of the display device of one embodiment of the present invention, light-emitting devices having a long driving lifetime were able to be fabricated through fewer fabrication steps by provision of a common layer for the light-emitting devices of three colors.

Reference Example 2

In this reference example, a synthesis method of 8-(1,1'-biphenyl-4-yl)-4-[3-(dibenzothiophen-4-yl)phenyl]-[1]benzofuro[3,2-d]pyrimidine (abbreviation: 8BP-4mDBtPBfpm) used in Example 1 and Example 2 is described.

[Chemical Formula 4]

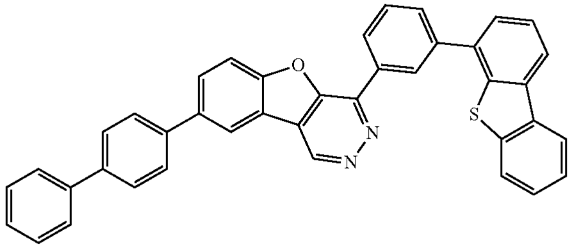

8BP-4mDBtPBfpm

Into a three-neck flask, 1.37 g of 8-chloro-4-[3-(dibenzothiophen-4-yl)phenyl]-[1]benzofuro[3,2-d]pyrimidine, 0.657 g of 4-biphenylboronic acid, 1.91 g of tripotassium phosphate, 30 mL of diethylene glycol dimethyl ether (diglyme), and 0.662 g of t-butanol were put, they were degassed by being stirred under reduced pressure, and the air in the flask was replaced with nitrogen.

This mixture was heated to 60° C. and 23.3 mg of palladium(II) acetate and 66.4 mg of di(1-adamantyl)-n-butylphosphine were added, followed by stirring at 120° C. for 27 hours. Water was added to this reaction liquid, suction filtration was performed, and the obtained residue was washed with water, ethanol, and toluene. This residue was dissolved in heated toluene, followed by filtration through a filter aid filled with Celite, alumina, and Celite in this order. The obtained solution was concentrated and dried, and then recrystallized with toluene to give 1.28 g of a target white solid in a yield of 74%.

By a train sublimation method, 1.26 g of the white solid was purified by sublimation. In the purification by sublimation, the solid was heated at 310° C. under a pressure of 2.56 Pa while the argon gas flowed at a flow rate of 10 mL/min. After the purification by sublimation, 1.01 g of a target pale yellow solid was obtained at a collection rate of 80%. The synthesis scheme is shown in Formula (a-1).

[Chemical Formula 5]

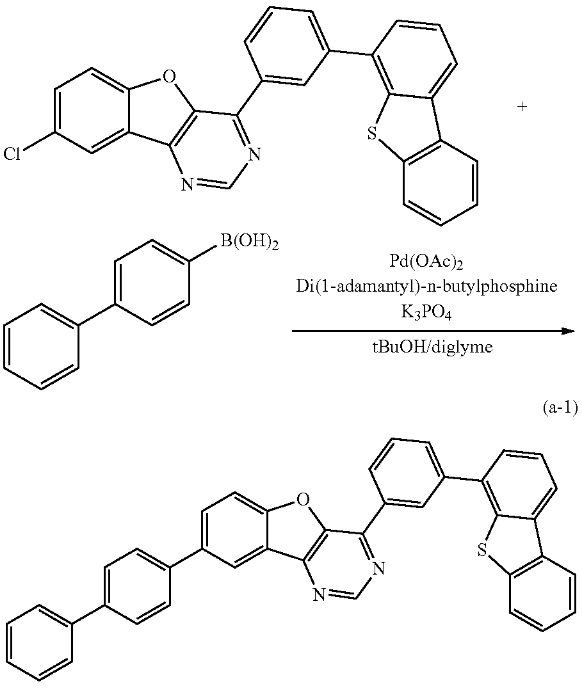

(a-1)

8BP-4mDBtPBfpm

Results of analysis by nuclear magnetic resonance ($^1$H-NMR) spectroscopy of the pale yellow solid obtained in the above reaction are shown below. The results reveal that 8BP-4mDBtPBfpm was obtained.

$^1$H-NMR. δ ($CDCl_3$): 7.39 (t, 1H), 7.47-7.53 (m, 4H), 7.63-7.67 (m, 2H), 7.68 (d, 2H), 7.75 (d, 2H), 7.79-7.83 (m, 4H), 7.87 (d, 1H), 7.98 (d, 1H), 8.02 (d, 1H), 8.23-8.26 (m, 2H), 8.57 (s, 1H), 8.73 (d, 1H), 9.05 (s, 1H), 9.34 (s, 1H).

REFERENCE NUMERALS

Data: display data, Data_W: data, DATA: wiring, DATA_W: wiring, G1: wiring, G2: wiring, M1: transistor, M2: transistor, M3: transistor, M4: transistor, 10A: display device, 10B: display device, 10C: display device, 10D: display device, 10E: display device, 21B: light, 21G: light, 21R: light, 42: transistor, 100A: display device, 100B: display device, 101: anode, 102: cathode, 103: EL layer, 112: common layer, 114: common layer, 115: common electrode, 121: hole-injection layer, 122: hole-transport layer, 122*a*: hole-transport layer, 122*b*: hole-transport layer, 123: light-emitting layer, 123-1: light-emitting region, 124: electron-transport layer, 124-1: region, 124*a*: electron-transport layer, 124*b*: electron-transport layer, 125: electron-injection layer, 130: first electrode, 131: hole-injection layer, 132*a*: hole-transport layer, 132*b*: hole-transport layer, 133: light-emitting layer, 134: electron-transport layer, 135: electron-injection layer, 136: buffer layer, 140: second electrode, 142: adhesive layer, 143: space, 151: substrate, 152: substrate, 153: substrate, 154: substrate, 155: adhesive layer, 162: display portion, 164: circuit, 165: wiring, 166: conductive layer, 172: FPC, 173: IC, 182: common layer, 184: common layer, 190: light-emitting device, 190B: light-emitting device, 190G: light-emitting device, 190R: light-emitting device, 191: pixel electrode, 192: buffer layer, 192B: buffer layer, 192G: buffer layer, 192R: buffer layer, 193: light-emitting layer, 193B: light-emitting layer, 193G: light-emitting layer, 193R: light-emitting layer, 194: buffer layer, 194B: buffer layer, 194G: buffer layer, 194R: buffer layer, 195: protective layer, 195*a*: inorganic insulating layer, 195*b*: organic insulating layer, 195*c*: inorganic insulating layer, 199: optical adjustment layer, 199B: optical adjustment layer, 199G: optical adjustment layer, 199R: optical adjustment layer, 201: transistor, 202: transistor, 204: connection portion, 205: transistor, 210: transistor, 211: insulating layer, 212: insulating layer, 213: insulating layer, 214: insulating layer, 215: insulating layer, 216: bank, 218: insulating layer, 221: conductive layer, 222*a*: conductive layer, 222*b*: conductive layer, 223: conductive layer, 225: insulating layer, 228: region, 231: semiconductor layer, 231*i*: channel formation region, 231*n*: low-resistance region, 242: connection layer, 800A: electronic device, 800B: electronic device, 800C: electronic device, 800D: electronic device, 800E: electronic device, 801: display panel, 801*a*: display panel, 801*b*: display panel, 802*a*: housing, 802*b*: housing, 802*c*: housing, 803: hinge, 803*a*: hinge, 803*b*: hinge, 806: grip portion, 811*a*: first region, 811*b*: second region, 811*c*: third region, 811*d*: fourth region, 811*e*: fifth region, 825: antenna, 826: antenna, 827: battery, 828: protection circuit, 901: first electrode, 902: second electrode, 910: first layer, 911: second layer, 912: third layer, 6500: electronic device, 6501: housing, 6502: display portion, 6503: power button, 6504: button, 6505: speaker, 6506: microphone, 6507: camera, 6508: light source, 6510: protection member, 6511: display panel, 6512: optical component, 6513: touch sensor panel, 6515: FPC, 6516: IC, 6517: printed circuit board, 6518: battery, 7000: display portion, 7100: television device, 7101: housing, 7103: stand, 7111: remote controller, 7200: laptop personal computer, 7211: housing, 7212: keyboard, 7213: pointing device, 7214: external connection port, 7300: digital signage, 7301: housing, 7303: a speaker, 7311: information terminal, 7400: digital signage, 7401: pillar, 7411: information terminal, 9000: housing, 9001: display portion, 9003: speaker, 9005: operation key, 9006:

connection terminal, 9007: sensor, 9008: microphone, 9050: icon, 9051: information, 9052: information, 9053: information, 9054: information, 9055: hinge, 9101: portable information terminal, 9102: portable information terminal, 9200: portable information terminal, 9201: portable information terminal

The invention claimed is:

1. A display device comprising:
a first light-emitting device and a second light-emitting device,
wherein the first light-emitting device comprises a first electrode and a common electrode,
wherein the second light-emitting device comprises a second electrode and the common electrode,
wherein the first light-emitting device comprises a first hole-injection layer, a first hole-transport layer, a second hole-transport layer, a first light-emitting layer, and an electron-transport layer between the first electrode and the common electrode,
wherein the second light-emitting device comprises a second hole-injection layer, a third hole-transport layer, a fourth hole-transport layer, and a second light-emitting layer between the second electrode and the common electrode,
wherein the second hole-transport layer is in contact with the first light-emitting layer,
wherein the fourth hole-transport layer is in contact with the second light-emitting layer,
wherein the first light-emitting layer comprises a first organic compound emitting light of a first color,
wherein the second light-emitting layer comprises a second organic compound emitting light of a second color,
wherein the electron-transport layer comprises a third organic compound and a first substance,
wherein the third organic compound is an electron-transport material,
wherein the first substance is a metal, a metallic salt, a metal oxide, or an organometallic salt,
wherein the electron-transport layer comprises a first region and a second region,
wherein the first region and the second region differ in a concentration of the first substance,
wherein the first hole-transport layer and the third hole-transport layer comprise the same compound,
wherein the second hole-transport layer and the fourth hole-transport layer comprise different compounds,
wherein each of the first hole-injection layer and the second hole-injection layer comprises a first compound and a second compound,
wherein the first compound has a property of accepting electrons from the second compound, and
wherein the second compound has a HOMO level higher than or equal to −5.7 eV and lower than or equal to −5.4 eV.

2. The display device according to claim 1,
wherein the first region is positioned closer to the first light-emitting layer than the second region is, and
wherein the first region has a higher concentration of the first substance than the second region.

3. The display device according to claim 1,
wherein the second light-emitting device comprises a layer common to the first light-emitting device between the second electrode and the common electrode.

4. The display device according to claim 1,
wherein the third organic compound has a HOMO level higher than or equal to −6.0 eV, and has an electron mobility higher than or equal to $1\times10^{-7}$ $cm^2/Vs$ and lower than or equal to $5\times10^{-5}$ $cm^2/Vs$ when a square root of electric field strength [V/cm] is 600.

5. The display device according to claim 1,
wherein the first hole-injection layer is in contact with one of the first electrode and the common electrode which is configured to be an anode.

6. The display device according to claim 5,
wherein the first hole-transport layer is positioned between the first hole-injection layer and the first light-emitting layer,
wherein the first hole-transport layer comprises a third compound,
wherein a HOMO level of the third compound is a value lower than or equal to a HOMO level of the second compound, and
wherein a difference between the HOMO level of the third compound and the HOMO level of the second compound is 0.2 eV or less.

7. The display device according to claim 6,
wherein the second compound and the third compound each comprise at least one of a carbazole skeleton, a dibenzofuran skeleton, a dibenzothiophene skeleton, and an anthracene skeleton.

8. The display device according to claim 6,
wherein the second hole-transport layer is positioned between the first hole-transport layer and the first light-emitting layer,
wherein the second hole-transport layer comprises a fourth compound, and
wherein a HOMO level of the fourth compound is lower than the HOMO level of the third compound.

9. The display device according to claim 8,
wherein the second compound, the third compound, and the fourth compound each comprise at least one of a carbazole skeleton, a dibenzofuran skeleton, a dibenzothiophene skeleton, and an anthracene skeleton.

10. The display device according to claim 1,
wherein the first organic compound is a fluorescent substance.

11. The display device according to claim 1,
wherein the first color is blue, and
wherein the second color is red or green.

12. The display device according to claim 1,
wherein the first substance is an organometallic complex comprising an alkali metal or an alkaline earth metal.

13. The display device according to claim 1,
wherein the first substance is an organometallic complex comprising a ligand comprising nitrogen and oxygen, and an alkali metal or an alkaline earth metal.

14. The display device according to claim 1,
wherein the first substance is an organometallic complex comprising a quinolinol ligand, and an alkali metal or an alkaline earth metal.

15. A display module comprising the display device according to claim 1, and a connector or an integrated circuit.

16. An electronic device comprising:
the display module according to claim 15; and
at least one of an antenna, a battery, a housing, a camera, a speaker, a microphone, and an operation button.

17. The display device according to claim 1,
wherein the second light-emitting layer further comprises a fourth organic compound and a fifth organic compound, and
wherein a combination of the fourth organic compound and the fifth organic compound forms an exciplex.

* * * * *